US012671440B2

(12) United States Patent
Kirchhoffer et al.

(10) Patent No.: US 12,671,440 B2
(45) Date of Patent: Jun. 30, 2026

(54) ARITHMETIC ENCODERS, ARITHMETIC DECODERS, VIDEO ENCODER, VIDEO DECODER, METHODS FOR ENCODING, METHODS FOR DECODING AND COMPUTER PROGRAM

(71) Applicant: Fraunhofer-Gesellschaft zur Foerderung der angewandten Forschung e.V., Munich (DE)

(72) Inventors: Heiner Kirchhoffer, Berlin (DE); Jan Stegemann, Staufen (DE); Detlev Marpe, Berlin (DE); Paul Haase, Berlin (DE); Stefan Matlage, Berlin (DE); Christian Bartnik, Berlin (DE); Heiko Schwarz, Berlin (DE); Thomas Wiegand, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 126 days.

(21) Appl. No.: 18/745,812

(22) Filed: Jun. 17, 2024

(65) Prior Publication Data

US 2024/0413837 A1 Dec. 12, 2024

Related U.S. Application Data

(63) Continuation of application No. 17/874,092, filed on Jul. 26, 2022, now Pat. No. 12,095,486, which is a
(Continued)

(30) Foreign Application Priority Data

| Jul. 6, 2018 | (EP) | 18182308 |
| Sep. 24, 2018 | (EP) | 18196400 |
| Dec. 28, 2018 | (EP) | 18248294 |

(51) Int. Cl.
| *H03M 7/40* | (2006.01) |
| *H03M 7/02* | (2006.01) |
(Continued)

(52) U.S. Cl.
CPC ........... *H03M 7/4006* (2013.01); *H03M 7/02* (2013.01); *H03M 7/3082* (2013.01); *H03M 7/40* (2013.01); *H03M 7/42* (2013.01); *H04N 19/13* (2014.11)

(58) Field of Classification Search
CPC .... H03M 7/4006; H03M 7/02; H03M 7/3082; H03M 7/42; H04N 19/13
(Continued)

(56) References Cited

U.S. PATENT DOCUMENTS

| 5,418,863 A | * | 5/1995 | Ando | H04N 1/417 |
| | | | | 382/232 |
| 5,587,710 A | | 12/1996 | Choo et al. | |
(Continued)

FOREIGN PATENT DOCUMENTS

| CN | 1703089 A | 11/2005 |
| CN | 1983334 A | 6/2007 |
(Continued)

OTHER PUBLICATIONS

Belyaev, Evgeny, et al., "An Efficient Adaptive Binary Range Coder and Its VLSI Architecture", IEEE Transactions on Circuits and Systems for Video Technology, 2014, vol. 25, No. 8., 12 pp.
(Continued)

*Primary Examiner* — Khai M Nguyen
(74) *Attorney, Agent, or Firm* — Perkins Coie LLP; Michael A. Glenn

(57) ABSTRACT

An arithmetic encoder for encoding a plurality of symbols having symbol values to derive an interval size information for an arithmetic encoding of one or more symbol values to
(Continued)

be encoded based on a plurality of state variable values representing statistics of a plurality of previously encoded symbol values with different adaptation time constants. The arithmetic encoder maps a first state variable value, or a scaled and/or rounded version thereof, using a lookup-table and maps a second state variable value, or a scaled and/or rounded version thereof using the lookup-table, to obtain the interval size information describing an interval size for the arithmetic encoding of one or more symbols to be encoded. Further arithmetic encoders, arithmetic decoders, video encoders, video decoder, methods for encoding, methods for decoding and computer programs are also disclosed.

16 Claims, 17 Drawing Sheets

Related U.S. Application Data continuation of application No. 17/142,071, filed on Jan. 5, 2021, now Pat. No. 11,431,352, which is a continuation of application No. PCT/EP2019/068188, filed on Jul. 5, 2019.

(51) Int. Cl.
| | |
|---|---|
| *H03M 7/30* | (2006.01) |
| *H03M 7/42* | (2006.01) |
| *H04N 19/13* | (2014.01) |

(58) Field of Classification Search
USPC .................................................... 341/51, 107
See application file for complete search history.

(56) References Cited

U.S. PATENT DOCUMENTS

| | | | |
|---|---|---|---|
| 6,518,896 B1 | | 2/2003 | Luna et al. |
| 6,894,628 B2 | * | 5/2005 | Marpe ................. H03M 7/4006 |
| | | | 341/107 |
| 7,808,406 B2 | * | 10/2010 | He ...................... H03M 7/4006 |
| | | | 341/107 |
| 9,633,664 B2 | * | 4/2017 | Subbaraman ........... G10L 19/02 |
| 9,871,537 B2 | * | 1/2018 | Sole Rojals ........ H03M 7/4018 |
| 2004/0059770 A1 | | 3/2004 | Bossen |
| 2008/0100479 A1 | | 5/2008 | Otsuka |
| 2009/0219183 A1 | | 9/2009 | Sakaguchi |
| 2010/0097470 A1 | | 4/2010 | Yoshida et al. |
| 2010/0295713 A1 | | 11/2010 | Ueno et al. |
| 2011/0095920 A1 | | 4/2011 | Mittal et al. |
| 2012/0330670 A1 | | 12/2012 | Fuchs et al. |
| 2013/0013301 A1 | | 1/2013 | Subbaraman et al. |
| 2013/0013323 A1 | | 1/2013 | Subbaraman et al. |
| 2013/0027230 A1 | | 1/2013 | Marpe et al. |
| 2013/0107951 A1 | | 5/2013 | Sole et al. |
| 2013/0226594 A1 | | 8/2013 | Fuchs et al. |
| 2014/0140400 A1 | | 5/2014 | George et al. |
| 2014/0161195 A1 | | 6/2014 | Karkkainen et al. |
| 2014/0307801 A1 | | 10/2014 | Ikai et al. |
| 2014/0362925 A1 | | 12/2014 | Nguyen et al. |
| 2017/0142416 A1 | | 5/2017 | George et al. |
| 2017/0280139 A1 | | 9/2017 | Thirumalai et al. |
| 2018/0199046 A1 | | 7/2018 | Chuang et al. |
| 2019/0200043 A1 | | 6/2019 | Egilmez et al. |

FOREIGN PATENT DOCUMENTS

| | | |
|---|---|---|
| CN | 102667921 A | 9/2012 |
| CN | 102687403 A | 9/2012 |
| CN | 102792370 A | 11/2012 |
| CN | 102859583 A | 1/2013 |
| CN | 103119646 A | 5/2013 |
| CN | 103119849 A | 5/2013 |
| CN | 103873863 A | 6/2014 |
| CN | 103907349 A | 7/2014 |
| CN | 104205646 A | 12/2014 |
| CN | 107333141 A | 11/2017 |
| CN | 107360434 A | 11/2017 |
| CN | 108989825 A | 12/2018 |
| CN | 110291793 A | 9/2019 |
| EP | 0224753 A2 | 6/1987 |
| EP | 1798860 A2 | 6/2007 |
| EP | 1921752 A1 | 5/2008 |
| JP | 2005217517 A | 8/2005 |
| JP | 2013517519 A | 5/2013 |
| JP | 2014534736 A | 12/2014 |
| JP | 6121172 B2 | 4/2017 |
| TW | 201737708 A | 10/2017 |
| WO | 9631008 A1 | 10/1996 |
| WO | 2008129883 A1 | 10/2008 |
| WO | 2011086065 A1 | 7/2011 |
| WO | 2012016839 A1 | 2/2012 |
| WO | 2013063371 A1 | 5/2013 |
| WO | 2016196307 A1 | 12/2016 |

OTHER PUBLICATIONS

Eeckhaut, Hendrik, et al., "Tuning the M-coder to improve Dirac's Entropy Coding", [Online], WSEAS Transactions on Information Science and Applications, 2005 [Searched Date: Dec. 24, 2023]., 10 pp.

Howard, Paul G., et al., "Practical Implementations of Arithmetic Coding", Jan. 1, 1992 (Jan. 1, 1992), Image and Text Compression, Boston, Kluwer, US, pp. 85-112, XP000560540, 1992, pp. 85-112.

Marpe, Detlev, et al., "Context-Based Adaptive Binary Arithmetic Coding in JVT/H.26L", International Conference on Image Processing (ICIP), IEEE, vol. 2, Sep. 22, 2002 (Sep. 22, 2002), pp. 513-516, XP010608021, pp. 513-516.

Marpe, Detlev, et al., "Context-Based Adaptive Binary Arithmetic Coding in the H.264/AVC Video Compression Standard", IEEE Transactions on Circuits and Systems for Video Technology, vol. 13, No. 7., 17 pp.

Liu, Lizhu, "Probability and Fuzzy Information Theory and Its Applications", National Defense Industry Press, Beijing, Jul. 31, 2004, pp. 71-75.

\* cited by examiner

ARITHMETIC ENCODERS, ARITHMETIC DECODERS, VIDEO ENCODER, VIDEO DECODER, METHODS FOR ENCODING, METHODS FOR DECODING AND COMPUTER PROGRAM

CROSS-REFERENCES TO RELATED APPLICATIONS

This application is a continuation of U.S. patent application Ser. No. 17/874,092, filed Jul. 26, 2022, which in turn is a continuation of U.S. patent application Ser. No. 17/142,071, filed Jan. 5, 2021 (U.S. Pat. No. 11,431,352 issued Aug. 30, 2022), which is incorporated herein by reference in its entirety, which in turn is a continuation of International Application No. PCT/EP2019/068188, filed Jul. 5, 2019, which is incorporated herein by reference in its entirety, and additionally claims priority from European Applications Nos. EP 18 182 308.9, filed Jul. 6, 2018, EP 18 196 400.8, filed Sep. 24, 2018 and EP 18 248 294.3, filed Dec. 28, 2018, all of which are incorporated herein by reference in their entirety.

Embodiments according to the invention create arithmetic encoders.

Further embodiments according to the invention create arithmetic decoders.

Further embodiments according to the invention create video encoders.

Further embodiments according to the invention create video decoders.

Further embodiments according to the invention create methods for encoding a plurality of symbols and methods for decoding a plurality of symbols.

Further embodiments according to the invention create corresponding computer programs.

Generally speaking, embodiments according to the invention create a context model update method using a finite state machine.

BACKGROUND OF THE INVENTION

Arithmetic encoding and decoding is proven to be a valuable tool in the encoding and decoding of audio and video contents and also in the encoding of other types of information, like pictures, neural network coefficients and the like. Embodiments of the invention can be used for all of these applications. For example, it is possible to exploit known occurrence probabilities of binary values (e.g., symbols) in a binary sequence representing a video or audio content (or other types of content) to increase encoding efficiency. In particular, arithmetic encoding can deal with varying probabilities of "0"s and "1"s in an efficient manner, and can adapt to changes of the probabilities in a fine-tuned manner.

However, for arithmetic encoding and decoding to bring an optimal coding efficiency, it is important to have a good information about the probabilities of "0"s and "1"s which well reflects an actual frequency of occurrence.

In order to adapt to the probabilities of "0"s and "1"s (or generally, to adapt to probabilities of the symbols to be encoded), a concept is typically used to adjust boundaries of intervals within a total (current) range of values, to obtain an interval sub-division (for example, such that a full range of values is sub-divided into intervals associated with different binary values or groups of binary values).

In other words, information about the probabilities of different symbols (like "0"s and "1"s) is used to derive an interval size information (or, equivalently, an interval size value) which describes a width of an interval associated with a symbol (wherein a total interval width may, for example, vary over time depending on the encoding or decoding process, for example, due to an interval re-normalization).

Accordingly, there is a need for concepts for the determination of source statistic values (e.g. state variable values) and/or range values (like interval size values) for the interval sub-division (for example, for the sub-division of a total coding interval), which provide a good tradeoff between computational efficiency and liability.

SUMMARY

An embodiment may have an arithmetic encoder for encoding a plurality of symbols having symbol values, wherein the arithmetic encoder is configured to derive an interval size information for an arithmetic encoding of one or more symbol values to be encoded on the basis of a plurality of state variable values, which represent statistics of a plurality of previously encoded symbol values with different adaptation time constants, wherein the arithmetic encoder is configured to map a first state variable value, or a scaled and/or rounded version thereof, using a lookup-table and to map a second state variable value, or a scaled and/or rounded version thereof using the lookup-table, in order to obtain the interval size information describing an interval size for the arithmetic encoding of one or more symbols to be encoded.

Another embodiment may have an arithmetic encoder for encoding a plurality of symbols having symbol values, wherein the arithmetic encoder is configured to derive an interval size information for an arithmetic encoding of one or more symbol values to be encoded on the basis of a plurality of state variable values, which represent statistics of a plurality of previously encoded symbol values with different adaptation time constants, wherein the arithmetic encoder is configured to derive a combined state variable value one the basis of the plurality of state variable values, and wherein the arithmetic encoder is configured to map the combined state variable value, or a scaled and/or rounded version thereof using a look-up table, in order to obtain the interval size information describing an interval size for the arithmetic encoding of one or more symbols to be encoded.

Another embodiment may have an arithmetic encoder for encoding a plurality of symbols having symbol values, wherein the arithmetic encoder is configured to determine one or more state variable values, which represent statistics of a plurality of previously encoded symbol values, and wherein the arithmetic encoder is configured to derive an interval size information for an arithmetic encoding of one or more symbol values to be encoded on the basis of the one or more state variable values, which represent statistics of a plurality of previously encoded symbol values, wherein the arithmetic encoder is configured to update a first state variable value in dependence on a symbol to be encoded and using a look-up table.

Another embodiment may have an arithmetic encoder for encoding a plurality of symbols having symbol values, wherein the arithmetic encoder is configured to derive an interval size value for an arithmetic encoding of one or more symbol values to be encoded on the basis of one or more state variable values, which represent statistics of a plurality of previously encoded symbol values, wherein the arithmetic encoder is configured to determine the interval size value using a base lookup table, wherein the arithmetic encoder is configured to determine the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the arithmetic encoder is configured to perform the arithmetic encoding of one or more symbols using the interval size value.

Another embodiment may have an arithmetic encoder for encoding a plurality of symbols having symbol values, wherein the arithmetic encoder is configured to derive an interval size value for an arithmetic encoding of one or more symbol values to be encoded on the basis of one or more state variable values, which represent statistics of a plurality of previously encoded symbol values, wherein the arithmetic encoder is configured to determine the interval size value using a probability table, on the basis of a probability value derived from the one or more state variable values and on the basis of a coding interval size, wherein the probability table describes interval sizes for a set of a plurality of probability values and for a given coding interval size, and wherein the arithmetic encoder is configured to scale an element of the probability table, to obtain the interval size value if a current probability value is not in the set of a plurality of probability values and/or if a current coding interval size is different from the given coding interval size; and wherein the arithmetic encoder is configured to perform the arithmetic encoding of one or more symbols using the interval size value.

Another embodiment may have an arithmetic decoder for decoding a plurality of symbols having symbol values, wherein the arithmetic decoder is configured to derive an interval size value for an arithmetic decoding of one or more symbol values to be decoded on the basis of one or more state variable values, which represent statistics of a plurality of previously decoded symbol values, wherein the arithmetic decoder is configured to determine the interval size value using a base lookup table, wherein the arithmetic decoder is configured to determine the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the arithmetic decoder is configured to perform the arithmetic decoding of one or more symbols using the interval size value.

Another embodiment may have an arithmetic decoder for decoding a plurality of symbols having symbol values, wherein the arithmetic decoder is configured to derive an interval size value for an arithmetic decoding of one or more symbol values to be decoded on the basis of one or more state variable values, which represent statistics of a plurality of previously decoded symbol values, wherein the arithmetic decoder is configured to determine the interval size value using a probability table, on the basis of a probability value derived from the one or more state variable values and on the basis of a coding interval size, wherein the probability table describes interval sizes for a set of a plurality of probability values and for a given coding interval size, and wherein the arithmetic decoder is configured to scale an element of the probability table, to obtain the interval size value if a current probability value is not in the set of a plurality of probability values and/or if a current coding interval size is different from the given coding interval size; and wherein the arithmetic decoder is configured to perform the arithmetic decoding of one or more symbols using the interval size value.

Another embodiment may have an arithmetic decoder for decoding a plurality of symbols having symbol values, wherein the arithmetic decoder is configured to derive an interval size information for an arithmetic decoding of one or more symbol values to be decoded on the basis of a plurality of state variable values, which represent statistics of a plurality of previously decoded symbol values with different adaptation time constants, wherein the arithmetic decoder is configured to map a first state variable value, or a scaled and/or rounded version thereof, using a lookup-table and to map a second state variable value, or a scaled and/or rounded version thereof using the lookup-table, in order to obtain the interval size information describing an interval size for the arithmetic decoding of one or more symbols to be decoded.

Another embodiment may have an arithmetic decoder for decoding a plurality of symbols having symbol values, wherein the arithmetic decoder is configured to derive an interval size information for an arithmetic decoding of one or more symbol values to be decoded on the basis of a plurality of state variable values, which represent statistics of a plurality of previously decoded symbol values with different adaptation time constants, wherein the arithmetic decoder is configured to derive a combined state variable value one the basis of the plurality of state variable values, and wherein the arithmetic decoder is configured to map the combined state variable value, or a scaled and/or rounded version thereof using a look-up table, in order to obtain the interval size information describing an interval size for the arithmetic decoding of one or more symbols to be decoded.

Another embodiment may have an arithmetic decoder for decoding a plurality of symbols having symbol values, wherein the arithmetic decoder is configured to determine one or more state variable values, which represent statistics of a plurality of previously decoded symbol values, and wherein the arithmetic decoder is configured to derive an interval size information for an arithmetic decoding of one or more symbol values to be decoded on the basis of the one or more state variable values, which represent statistics of a plurality of previously decoded symbol values, wherein the arithmetic decoder is configured to update a first state variable value in dependence on a decoded symbol and using a look-up table.

Another embodiment may have an arithmetic decoder for decoding a plurality of symbols having symbol values, wherein the arithmetic decoder is configured to determine one state variable value, which represent a statistic of a plurality of previously decoded symbol values, and wherein the arithmetic decoder is configured to compute from the combined state variable value, or the scaled and/or rounded version thereof, a subinterval width value for an arithmetic decoding of a symbol value to be decoded by mapping the one state variable value, or a scaled and/or rounded version thereof using a one-dimensional look-up table entries of which comprise probability values for different value intervals of a value domain for the combined state variable value, or the scaled and/or rounded version thereof, onto a combined probability value, and quantizing a coding interval size information describing a size of a coding interval of the arithmetic encoding before the arithmetic decoding of the symbol value to be encoded onto a quantization level; determine a product between the probability value and the quantization level, wherein the arithmetic decoder is configured to perform a state variable value update in dependence on the symbol to be decoded.

Another embodiment may have a video encoder, wherein the video encoder is configured to encode a plurality of video frames, wherein the video encoder comprises an arithmetic encoder for providing an encoded binary sequence on the basis of a sequence of binary values representing a video content, according to the invention.

Another embodiment may have a video decoder, wherein the video decoder is configured to decode a plurality of video frames, wherein the video decoder comprises an arithmetic decoder for providing a decoded binary sequence on the basis of an encoded representation of the binary sequence, according to the invention.

Another embodiment may have a method for encoding a plurality of symbols having symbol values, wherein the method comprises deriving an interval size information for an arithmetic encoding of one or more symbol values to be encoded on the basis of a plurality of state variable values, which represent statistics of a plurality of previously encoded symbol values with different adaptation time constants, wherein the method comprises mapping a first state variable value, or a scaled and/or rounded version thereof, using a lookup-table and mapping a second state variable value, or a scaled and/or rounded version thereof using the lookup-table, in order to obtain the interval size information describing an interval size for the arithmetic encoding of one or more symbols to be encoded.

Another embodiment may have a method for encoding a plurality of symbols having symbol values, wherein the method comprises deriving an interval size information for an arithmetic encoding of one or more symbol values to be encoded on the basis of a plurality of state variable values, which represent statistics of a plurality of previously encoded symbol values with different adaptation time constants, wherein the method comprises deriving a combined state variable value one the basis of the plurality of state variable values, and wherein the method comprises mapping the combined state variable value, or a scaled and/or rounded version thereof using a look-up table, in order to obtain the interval size information describing an interval size for the arithmetic encoding of one or more symbols to be encoded.

Another embodiment may have a method for encoding a plurality of symbols having symbol values, wherein the method comprises determining one or more state variable values, which represent statistics of a plurality of previously encoded symbol values, and wherein the method comprises deriving an interval size information for an arithmetic encoding of one or more symbol values to be encoded on the basis of the one or more state variable values, which represent statistics of a plurality of previously encoded symbol values, wherein the method comprises updating a first state variable value in dependence on a symbol to be encoded and using a look-up table.

Another embodiment may have a method for decoding a plurality of symbols having symbol values, wherein the method comprises deriving an interval size information for an arithmetic decoding of one or more symbol values to be decoded on the basis of a plurality of state variable values, which represent statistics of a plurality of previously decoded symbol values with different adaptation time constants, wherein the method comprises mapping a first state variable value, or a scaled and/or rounded version thereof, using a lookup-table and mapping a second state variable value, or a scaled and/or rounded version thereof using the lookup-table, in order to obtain the interval size information

6 describing an interval size for the arithmetic decoding of one or more symbols to be decoded.

Another embodiment may have a method for decoding a plurality of symbols having symbol values, wherein the method comprises deriving an interval size information for an arithmetic decoding of one or more symbol values to be decoded on the basis of a plurality of state variable values, which represent statistics of a plurality of previously decoded symbol values with different adaptation time constants, wherein the method comprises deriving a combined state variable value one the basis of the plurality of state variable values, and wherein the method comprises mapping the combined state variable value, or a scaled and/or rounded version thereof using a look-up table, in order to obtain the interval size information describing an interval size for the arithmetic decoding of one or more symbols to be decoded.

Another embodiment may have a method for decoding a plurality of symbols having symbol values, wherein the method comprises determining one or more state variable values, which represent statistics of a plurality of previously decoded symbol values, and wherein the method comprises deriving an interval size information for an arithmetic decoding of one or more symbol values to be decoded on the basis of the one or more state variable values, which represent statistics of a plurality of previously decoded symbol values, wherein the method comprises updating a first state variable value in dependence on a decoded symbol and using a look-up table.

Another embodiment may have a method performed by inventive encoders and decoders.

Another embodiment may have a non-transitory digital storage medium having a computer program stored thereon to perform the method for encoding a plurality of symbols having symbol values, wherein the method comprises deriving an interval size information for an arithmetic encoding of one or more symbol values to be encoded on the basis of a plurality of state variable values, which represent statistics of a plurality of previously encoded symbol values with different adaptation time constants, wherein the method comprises mapping a first state variable value, or a scaled and/or rounded version thereof, using a lookup-table and mapping a second state variable value, or a scaled and/or rounded version thereof using the lookup-table, in order to obtain the interval size information describing an interval size for the arithmetic encoding of one or more symbols to be encoded, when said computer program is run by a computer.

Another embodiment may have a method for encoding a plurality of symbols having symbol values, wherein the method comprises deriving an interval size value for an arithmetic encoding of one or more symbol values to be encoded on the basis of one or more state variable values, which represent statistics of a plurality of previously encoded symbol values, wherein the method comprises determining the interval size value using a base lookup table, wherein the method comprises determining the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the method comprises performing the arithmetic encoding of one or more symbols using the interval size value.

Another embodiment may have a method for encoding a plurality of symbols having symbol values, wherein the method comprises deriving an interval size value for an arithmetic encoding of one or more symbol values to be encoded on the basis of one or more state variable values, which represent statistics of a plurality of previously encoded symbol values, wherein the method comprises determining the interval size value using a probability table, on the basis of a probability value derived from the one or more state variable values and on the basis of a coding interval size, wherein the probability table describes interval sizes for a set of a plurality of probability values and for a given coding interval size, and wherein the method comprises scaling an element of the probability table, to obtain the interval size value if a current probability value is not in the set of a plurality of probability values and/or if a current coding interval size is different from the given coding interval size; and wherein the method comprises performing the arithmetic encoding of one or more symbols using the interval size value.

Another embodiment may have a method for decoding a plurality of symbols having symbol values, wherein the method comprises deriving an interval size value for an arithmetic decoding of one or more symbol values to be decoded on the basis of one or more state variable values, which represent statistics of a plurality of previously decoded symbol values, wherein the method comprises determining the interval size value using a base lookup table, wherein the method comprises determining the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the method comprises performing the arithmetic decoding of one or more symbols using the interval size value.

Another embodiment may have a method for decoding a plurality of symbols having symbol values, wherein the method comprises deriving an interval size value for an arithmetic decoding of one or more symbol values to be decoded on the basis of one or more state variable values, which represent statistics of a plurality of previously decoded symbol values, wherein the method comprises determining the interval size value using a probability table, on the basis of a probability value derived from the one or more state variable values and on the basis of a coding interval size, wherein the probability table describes interval sizes for a set of a plurality of probability values and for a given coding interval size, and wherein the method comprises scaling an element of the probability table, to obtain the interval size value if a current probability value is not in the set of a plurality of probability values and/or if a current coding interval size is different from the given coding interval size; and wherein the method comprises performing the arithmetic decoding of one or more symbols using the interval size value.

Another embodiment may have a non-transitory digital storage medium having a computer program stored thereon to perform the method for encoding a plurality of symbols having symbol values, wherein the method comprises deriving an interval size value for an arithmetic encoding of one or more symbol values to be encoded on the basis of one or more state variable values, which represent statistics of a plurality of previously encoded symbol values, wherein the method comprises determining the interval size value using a base lookup table, wherein the method comprises determining the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the method comprises performing the arithmetic encoding of one or more symbols using the interval size value, when said computer program is run by a computer.

An embodiment according to the invention creates an arithmetic encoder for encoding a plurality of symbols having symbol values (e.g. binary values), wherein the arithmetic encoder is configured to derive an interval size information ($p^k$, $R*p^k$) for an arithmetic encoding of one or more symbol values to be encoded on the basis of a plurality of state variable values ($s_i^k$) (which are, for example, associated with a given context mode, indicated by index k), which represent statistics of a plurality of previously encoded symbol values (e.g. a sequence of binary values 0 and 1) with different adaptation time constants, wherein the arithmetic encoder is configured to map a first state variable value ($s_1^k$), or a scaled and/or rounded version ([$s_1^k*a_1^k$]) thereof, using a lookup-table (LUT1) and to map a second state variable value ($s_2^k$), or a scaled and/or rounded version ([$s_2^k*a_2^k$]) thereof using the lookup-table (LUT1), in order to obtain the interval size information (e.g. $p_k$ or $R*p_k$) describing an interval size for the arithmetic encoding of one or more symbols to be encoded.

This embodiment according to the invention is based on the idea that interval size information can be obtained with particularly good reliability if lookup-table-based mappings are applied to state variable values which are associated with different adaptation time constants. In other words, by applying the same lookup table to two state variable values which describe statistics (for example symbol probabilities) on different time scales, an interval size information can be obtained in an efficient manner (because only one lookup table is needed) but with a good reliability (because statistics on different time scales are considered in the determination of the interval size information). The mapping of the state variable values using the lookup table can be considered as an important and immediate step in the derivation of the interval size information on the basis of the state variable values. Optionally, one or more additional mappings and/or a combination of mapping results may follow the lookup-table-based mapping of the first and second state variable values in the derivation of the interval size information. Optionally, probability values may be obtained as an intermediate quantity using the lookup-table-based mapping of the first state variable value and of the second state variable value. Moreover, different concepts are possible for deriving interval size information from the result of the lookup-table-based mapping of the first state variable value and from the result of the lookup-table-based mapping of the second state variable value.

To conclude, this embodiment according to the invention provides for a derivation of the interval size information on the basis of the first state variable value and the second state variable value which uses (at least) two lookup-table-based mappings. Accordingly, the state variable values, which are associated with different adaptation time constants, can be mapped individually, but using a same mapping rule (defined by the lookup table), which keeps a resource demand for the determination of the interval size information reasonably small but still allows for a consideration (for example, weighted consideration) of statistics of (or statistic information about) a plurality of previously handled (e.g., encoded or decoded) symbols obtained with different adaptation time constants or statistics computation time constants.

In an embodiment, the arithmetic encoder is configured to map the first state variable value, or the scaled and/or rounded version ($[s^k_1 * a^k_1]$) thereof, onto a first probability value ($p_k^1$) using the look-up table, and wherein the arithmetic encoder is configured to map the second state variable value, or the scaled and/or rounded version ($[s^k_2 * a^k_2]$) thereof, onto a second probability value ($p_k^2$) using the look-up table, and wherein the arithmetic encoder is configured to obtain a combined probability value ($p_k^1$) using the first probability value and the second probability value (for example, using a weighted summation or using a weighted averaging).

Using such a concept, the combined probability value, which describes a symbol probability (e.g., a probability of a "1" symbol or a probability of a "0" symbol) can be derived easily on the basis of the first state variable value and on the basis of the second state variable value. For example, the first state variable value, which follows previously handled (e.g., encoded or decoded) symbols with a first agility, can be mapped onto the first probability value, and the second state variable value, which follows previously handled (e.g., encoded or decoded) symbols with a second agility, can be mapped efficiently onto the second probability value. Thus, trends of the previously handled symbols occurring on different time scales can be considered, and it is still possible to derive the combined probability value in a very efficient manner. The first and second state variable values allow to track trends of the previously handled symbols with different adaptation time constants, and the mapping of the state variable values onto "partial" probability values (first probability value and second probability value), which contribute to the combined probability value, can be done in a very resource-efficient manner using the above-mentioned concept.

In an embodiment, the arithmetic encoder is configured to change the state variable value into a first direction (e.g. to become more positive) if a symbol to be encoded takes a first value (e.g. "1"), and to change the state variable value into a second direction (e.g. to become more negative) if a symbol to be encoded takes a second value (e.g. "0") which is different from the first value (for example, such that the state variable value can take positive and negative values), wherein the arithmetic encoder is configured to determine an entry of the lookup-table to be evaluated in dependence on an absolute value ($s_k^i$ if $s_k^i > 0$, $-s_k^i$ otherwise) of a respective state variable value (e.g. in dependence on a scaled and rounded version of an absolute value of the state variable value).

By using a state variable value which can, for example, take positive and negative values (for example, in dependence on a history of previously handled symbols, and, for example, in a symmetric manner for opposite previously handled symbols), and by selecting an entry of the lookup table in dependence on an absolute value of the respective state variable value, an efficiency of the concept can even be improved. For example, it is no longer necessary to have dedicated entries of the lookup table for each possible value (or quantized value) of the state variable value. Rather, it is possible to double-use an entry of the lookup table both for a positive state variable value and for a corresponding negative state variable value (i.e., for "inverse" state variable values having equal absolute values but opposite sign). Consequently, a number of entries of the lookup table can be kept small, and the "symmetry" of the determination of the interval size information with respect to opposite previously handled symbols can be exploited.

In an embodiment, the arithmetic encoder is configured to set a first probability value ($p_k^1$) to a value provided by the lookup table (e.g. to $$UT1\left[\left\lfloor s_i^k \cdot a_i^k \right\rfloor\right]$$

if the first state variable value takes a first sign (e.g. a positive sign), and wherein the arithmetic encoder is configured to set the first probability value ($p_k^1$) to a value obtained by subtracting a value provided by the lookup table (e.g. to $$1 - LUT1\left[\left\lfloor s_i^k \cdot a_i^k \right\rfloor\right]$$

from a predetermined value (e.g. 1) if the first state variable value takes a second sign (e.g. a negative sign).

Using such a mechanism, a number of entries of the lookup table can be kept small (for example, because an entry of the lookup table is only selected on the basis of an absolute value of the respective state variable value), while it is still possible to obtain "complimentary" probability values for opposite signs of the respective state variable value. Thus, a high degree of resource-efficiency and a low computational complexity is achieved for the determination of the probability values.

In an embodiment, the arithmetic encoder is configured to determine two or more probability values $p_i^k$ according to $$p_i^k = \begin{cases} LUT1\left[\left\lfloor s_i^k \cdot a_i^k \right\rfloor\right], & \text{if } s_i^k \geq 0 \\ 1 - LUT1\left[\left\lfloor -s_i^k \cdot a_i^k \right\rfloor\right], & \text{else.} \end{cases}$$

wherein LUT1 is a lookup-table containing probability values; wherein $\lfloor \bullet \rfloor$ is a floor operator; wherein $s_i^k$ is an i-th state variable value; and wherein $a_i^k$ is a weighting value associated with the i-th state variable value (for example, a weighting value that adapts a number range of the i-th state variable value to a number of entries of the lookup-table).

It has been found that such a computation is computationally efficient and keeps a resource-demand reasonably small.

In an embodiment, the arithmetic encoder is configured to determine two or more probability values $p_i^k$ according to $$p_i^k = \begin{cases} LUT1\left[\left\lfloor s_i^k \cdot a_i^k \right\rfloor\right], & \text{if } \left\lfloor s_i^k \cdot a_i^k \right\rfloor \geq 0 \\ 1 - LUT1\left[-\left\lfloor s_i^k \cdot a_i^k \right\rfloor\right], & \text{else} \end{cases}$$

wherein LUT1 is a lookup-table containing probability values; wherein $\lfloor \bullet \rfloor$ is a floor operator; wherein $s_i^k$ is an i-th state variable value; and wherein $a_i^k$ is a weighting value associated with the i-th state variable value (for example, a weighting value that adapts a number range of the i-th state variable value to a number of entries of the lookup-table).

It has been found that such a computation is advantageous in some circumstances, depending on the actual number representation. In particular, the floor operator is applied to the same operand irrespective of a sign of the state variable value. In particular, it is not necessary to remove the sign of the operand of the floor operator, which saves some computational complexity. Rather, a negation is only applied to the result of the floor operator, which is typically an integer value. Accordingly, the complexity for applying the negation operator is particularly small. In other words, the concept as described herein also brings along a particularly low complexity.

In an embodiment, the arithmetic encoder is configured to obtain a combined probability value $p^k$ on the basis of a plurality of probability values $p^k_i$ according to $$p_k = \sum_{i=1}^{N} p_i^k \cdot b_i^k$$

wherein N is a number of probability values considered (and may be equal to a number of state variable values considered); and wherein $b^k_i$ is a weighting value (for example, a weighting factor that controls an influence of individual state variable values onto the combined probability value) (wherein $b^k_i$ are advantageously integer-valued potencies of von 2, and wherein a ratio between two different $b^k_i$ is advantageously an integer-valued potency of 2).

By applying different weighting to the probability values obtained on the basis of different state variable values, the different impact of short-term statistics and long-term statistics onto the combined probability value can be considered, and a particularly meaningful combined probability value can be obtained.

In an embodiment, the arithmetic encoder is configured to map the first state variable value, or the scaled and/or rounded version ($\lfloor s^k_1 * a^k_1 \rfloor$) thereof, onto a first subinterval width value ($R * p_k^1$) using a two-dimensional look-up table, entries of which are addressed in dependence on the first state variable value (e.g. to determine a first lookup table entry coordinate, e.g. using a probability index i) and in dependence on a coding interval size information (e.g. R, or an index j derived from R) describing a size of a coding interval of the arithmetic encoding before an encoding of a symbol (e.g. to determine a second lookup table entry coordinate), wherein the arithmetic encoder is configured to map the second state variable value, or the scaled and/or rounded version ($\lfloor s^k_2 * a^k_2 \rfloor$) thereof, onto a second subinterval width value ($R * p_k^2$) using the two-dimensional look-up table, entries of which are addressed in dependence on the second state variable value (e.g. to determine a first lookup table entry coordinate) and in dependence on a coding interval size information (e.g. R) describing a size of a coding interval of the arithmetic encoding before an encoding of a symbol (e.g. to determine a second lookup table entry coordinate), wherein the arithmetic encoder is configured to obtain a combined subinterval width value using the first subinterval width value and the second subinterval width value (for example, using a weighted summation or using a weighted averaging).

By using such a two-dimensional lookup table, which reflects the multiplication of a plurality of different probability values with a plurality of different interval size values, a computational complexity can be reduced since a multiplication operation can be saved. For example, one of the two indices (row index and column index) which designates the entries of the two-dimensional lookup table is defined by a respective state variable value (or a scaled and/or rounded version thereof), and a second index is determined by a current (total) coding interval size. Thus, on the basis of the first index and the second index, an element (entry) of the two dimensional lookup table can be uniquely identified, and the identified element typically reflects a product of a probability value associated with the respective state variable value and of a coding interval size associated with the second table index. Consequently, by spending some memory, which may be a read-only memory in some cases, for the two-dimensional lookup table, an execution of a multiplication operation may be saved, which may be advantageous in terms of computational resources and also in terms of energy consumption.

In an embodiment of the arithmetic encoder, the two-dimensional look-up table is representable as a dyadic product between a first one-dimensional vector (forming a one-dimensional look-up table) entries of which comprise probability values for different value intervals of a value domain for the first and second state variable values, or the scaled and/or rounded version ($\lfloor s^k * a^k \rfloor$; $|s_k| \cdot a_k$) thereof, and a second one-dimensional vector ($Qr_2(R)$) entries of which comprise quantization levels for the coding interval size information.

By using such a three dimensional lookup table, a multiplication operation between different pairs of probability values and coding interval sizes can be reflected by the table. Accordingly, by selecting an appropriate element of the two dimensional lookup table, the execution of a multiplication operation can be saved. Furthermore, the entries of the two-dimensional lookup table can be obtained in a very simple manner using such an approach.

In an embodiment of the arithmetic encoder, elements of the two-dimensional lookup-table (RangTabLPS) are defined on the basis of a base lookup table (Base TabLPS), wherein a first group (or block; e.g. an "upper half") of the elements of the two-dimensional lookup-table are identical to elements of the base lookup-table or are rounded versions of elements of the base lookup table, and wherein a second group, (or block; e.g. a "lower half") of the elements of the two-dimensional lookup-table are scaled and rounded versions of elements of the base lookup-table.

By using such an approach, an approximately exponential increase or decay of the elements of the two dimensional lookup table can be obtained. For example, by defining the elements of the two dimensional lookup table such that a second group of the elements of the two dimensional lookup table are, substantially (for example, except for deviations caused by a rounding) a scaled version of the elements of the first group of elements of the two dimensional lookup table, a highly uniform two dimensional lookup table can be obtained. Also, it should be noted that it is easily possible to obtain the elements of the two dimensional lookup table using such an approach.

In an embodiment of the arithmetic encoder, the second group of elements of the two-dimensional lookup-table are right-shifted versions of elements of the base-lookup table By using such an approach, the elements of the two dimensional lookup table can be obtained in a particularly efficient manner, since right-shifting operations can be performed very easily. Also, the right-shifting operations cause an appropriate scaling and may also perform a rounding operation in a very efficient manner.

In an embodiment of the arithmetic encoder, a probability index ($Qp_2(p_{LPS})$ or i)) determines whether an element of the first group of elements of the two-dimensional lookup table or an element of a second group of elements of the two-dimensional lookup table is evaluated, wherein a first range (for example, between 0 and $\mu-1$) of probability indices (which are, for example, obtained by quantizing a probability value, e.g. $p_{LPS}$) is associated with elements of the first group of elements, and wherein a second range (for example, larger than or equal to u) of probability indices (which are, for example, obtained by quantizing a probability value, e.g. $p_{LPS}$, e.g. using a quantization function $Qp2(\cdot)$) is associated with elements of the second group of elements;

By using such a concept, a distinction whether an element of the first group of elements or an element of the second group of elements should be used, can be made in dependence on the probability index, which may, for example, be based on the respective state variable value. For example, the probability index (which may, for example, be defined by a probability of a least probable symbol, or by an integer index value) may, for example, be derived on the basis of the respective state variable value using a mapping. For example, the first probability value obtained using a mapping of the first state variable value, or the second probability value obtained using a mapping of the second state variable value, may be used to determine which element of the two dimensional lookup table should be evaluated (and, in particular, determines whether an element of the first group of elements of the two dimensional lookup table or an element of the second group of elements of the two dimensional lookup table is evaluated).

Also, using this concept, it is possible to determine the respective element of the two dimensional lookup table "on the fly" on the basis of the base lookup table, a number of elements of which is smaller than a number of table elements which can be addressed by the probability index and a coding interval size index.

In an embodiment of the arithmetic encoder, a division residual (i %$\mu$) of a division between the probability index (i) and a first size value (e.g. $\mu$; wherein the size value, for example, describes an extension of the base lookup table in a first direction) and an interval size index (which may, for example, be obtained on the basis on an interval size information R, for example using a quantization operation $Qr2(\cdot)$; for example, j) determine which element of the base lookup table is used to obtain the element of two-dimensional lookup table.

By using such a concept, an appropriate element of the base lookup table can be selected, even though an extension of the base lookup table in a first direction is smaller than a number of possible probability index values. By evaluating a divisional residual of a division between the probability index and a first size value, which may describe an extension of the base lookup table in the first direction, elements of the base lookup table can be reused for two or more different probability index values (which may, for example, differ by the first size value). Consequently, an entry of the base lookup table may be used twice, for example, using a different scaling, for two probability index values which differ by the first size value. Accordingly, it can be exploited that the two-dimensional lookup table typically describes an evolution over the probability index values, wherein an evolution in a second range of probability index values is a scaled version (for example, accept for rounding effects) when compared to an evolution in a first range of probability index values.

In an embodiment, the arithmetic encoder is configured to obtain an element of the two-dimensional lookup-table (RangTabLPS) according to $$\mathrm{RangeTabLPS}[i][j]=\mathrm{Scal}(\mathrm{BaseTabLPS}[i\%\mu][j],\lfloor i/\mu \rfloor);$$

wherein BaseTabLPS is a base lookup table of dimension $\mu\times\lambda$; wherein i is a table index associated with a probability information; wherein j is a table index associated with an interval size information (e.g. describing a current coding interval size); wherein % is a division residual operation; wherein / is a division operation; wherein Scal (x,y) is a scaling function (for example, defined as Scal (x,y)= $\lfloor x*a^{-by} \rfloor$, wherein $\lfloor \cdot \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

By using such an approach, interval size information, which may be defined by a result of the scaling function or scaling operation, may be obtained in a particularly memory-efficient manner. For example, the "BaseTabLPS" lookup table may be particularly small, since its first dimension $\mu$ is typically smaller than a range of values of the table index i associated with the probability information, and since its second dimension $\lambda$ may be equal to the number of possible different interval sizes described by the interval size information. Furthermore, the scaling function may be implemented in a particularly efficient manner, since the number of different scaling factors, defined by the floor-operation of the quotient of i and $\mu$, is relatively small. For example, if the range of the division between i and $\mu$ is between 0 and a maximum value smaller than 2, only two different scaling operations may be performed. For example, only two, three or four different scaling options may exist (depending on the quotient between i and $\mu$), and these scaling options may be implemented efficiently using multiplications with only a few predetermined values or even using mere shift operations.

In an embodiment of the arithmetic encoder, elements of the two-dimensional lookup-table (RangTabLPS) are defined on the basis of a probability table (probTabLPS), wherein the probability table describes interval sizes for a set of a plurality of probability values (for example, represented by indices i) and for a given (reference) coding interval size, and wherein elements of the two-dimensional lookup-table for a probability value which is not in the set of a plurality of probability values and/or for a coding interval size which is different from the given coding interval size are derived from the probability table using a scaling.

Using such an approach, it can be exploited that different interval sizes are often related with each other by a scaling, which is dependent on a difference between associated probability values and/or on a difference between associated coding interval sizes. Wording it differently, if the two dimensional lookup table does not comprise an element which fits the currently considered probability value and/or the currently considered coding interval size, an appropriate interval size can still be obtained, wherein another element of the two dimensional lookup table is scaled accordingly (for example, in dependence on the currently considered probability value and/or in dependence on the currently considered coding interval size).

In an embodiment of the arithmetic encoder, elements of the two-dimensional lookup-table are obtained using a (multiplicative) first scaling of a selected element (probTabLPS [i %µ]) of the probability table in dependence on the coding interval size (R), and using a second scaling of a result of the first scaling in dependence on whether an element associated with a current probability value (designated by index i) is included in the set of probability values or not (e.g. in dependence on whether the current probability value lies within a range of probability values covered by the probability table or not).

Accordingly, elements of the two dimensional lookup table can be obtained "on the fly" using an appropriate entry of the probability table and using an appropriate scaling, wherein the "probability table", which is evaluated, is typically significantly smaller than the two dimensional lookup table. In other words, on the basis of the two indices addressing an element of the two dimensional lookup table, an appropriate element of the probability table is selected and scaled. However, in many situations, such a concept provides an improved tradeoff between memory demand and computational complexity.

In an embodiment of the arithmetic encoder, a division residual (i %µ) of a division between a probability index (e.g. i; e.g. representing the current probability value) and a first size value (e.g. µ; wherein the size value, for example, describes an extension of the probability table) determines which element of the probability table is scaled in the first scaling; and/or an integer division result ($\lfloor i/\mu \rfloor$) of a division between the probability index (i) and the first size value determines a scaling factor ($2-\lfloor i/\mu \rfloor$) used in the second scaling; and/or the coding interval size determines a multiplicative scaling factor (Qr2(R)) of the first scaling.

Using such a concept, a small probability table, which only represents an interval size in a (comparatively small) part of a two dimensional grid of probability indices and coding interval size indices, can be used, which saves memory space. An appropriate interval size information can then be obtained by the above-mentioned selection of an element of the probability table and also by the above-mentioned two-times scaling of the selected element of the probability table.

In an embodiment, the arithmetic encoder is configured to obtain an element RangeTabLPS[i][j] of the two-dimensional lookup-table according to $$RangeTabLPS[i][j] = Scal(\lfloor probTabLPS[i \ \% \ \mu] \cdot Qr_2(R) \rfloor, \lfloor i/\mu \rfloor)$$

wherein i is a table index associated with a probability information; wherein j is a table index associated with an interval size information; wherein % is a division residual operation; wherein / is a division operation; wherein probTabLPS[ ] is the probability table; wherein µ is a number of elements of the probability table (wherein a range of values of I is typically larger than µ); wherein R is an interval size (or a current coding interval size); wherein Qr2(R) is a scaling factor which is dependent on R; wherein Scal (x,y) is a scaling function (for example, defined as Scal (x,y)=$\lfloor x*a^{-by} \rfloor$, wherein $\lfloor \cdot \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

By using such a concept for obtaining an appropriate element of the two dimensional lookup table, which may represent the interval size information or which may be equal to the interval size information, a very good tradeoff between memory requirements and computational complexity can be obtained. The table "probTabLPS" may, for example, be a one-dimensional table, wherein a number of elements of said table may be smaller than a number of different possible values of the table index i. However, by scaling the product of the selected element of the probability table probTabLPS and of the scaling factor Qr$_2$(R), which is dependent on the interval size R, a good accuracy can be reached and possible rounding errors can be kept reasonably small. Furthermore, since the scaling operates on integer values, which are obtained by a "floor" operator, an efficient scaling concept can be used which may be defined, for example, by an integer multiplication or an integer division or a bit shift operation. Thus, the computational load is really small.

In an embodiment, the arithmetic encoder is configured to obtain an element RangeTabLPS[i][j] of the two-dimensional lookup-table according to $$RangeTabLPS[i][j] = Scal(\lfloor probTabLPS[i \ \% \ \mu] \cdot Qr_2(R) \rfloor, \lfloor i/\mu \rfloor)$$

wherein i is a table index associated with a probability information; wherein j is a table index associated with an interval size information; wherein % is a division residual operation; wherein / is a division operation; wherein probTabLPS[ ] is the probability table; wherein µ is a number of elements of the probability table (wherein a range of values of I is typically larger than µ); wherein R is an interval size (or a current coding interval size); wherein Qr2(R) is a scaling factor which is dependent on R; wherein Scal (x,y) is a scaling function (for example, defined as Scal (x,y)=$\lfloor x*a^{-by} \rfloor$, wherein $\lfloor \cdot \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

This approach for obtaining an interval size information is also particularly efficient, and has been found to bring along high-quality results for the interval size information (which is obtained as a result of the first scaling and the second scaling).

In an embodiment of the arithmetic encoder, wherein a division residual ($\lfloor i \ \% \mu \rfloor$) of a division between a probability index (e.g. i; e.g. representing the current probability value) and a first size value (e.g. µ; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor ($2^{-\lfloor i/\mu \rfloor}$) used in the first scaling; and/or wherein the coding interval size (R) determines a multiplicative scaling factor (Qr$_2$(R)) of the second scaling.

By selecting an element of the probability table (which may be a one-dimensional probability table) in dependence on the above-mentioned division residual, the fact that interval sizes are substantially similar, except for a scaling, in different ranges of the probability index can be exploited. Accordingly, the probability table only reflects values in a single range of probability indices, and interval size values for other ranges of the probability index are obtained using the first scaling. The second scaling adapts the values represented by the probability table, or the values obtained on the basis thereof using the first scaling, to a coding interval size, in order to thereby obtain an appropriate interval size information.

Consequently, a good tradeoff between memory consumption, computational complexity and accuracy can be obtained, wherein, for example, the division residual and the integer division result may be obtained in a computationally very simple manner if the first size value is chosen appropriately (for example, to be a potency of two).

In an embodiment, the arithmetic encoder is configured to obtain an element RangeTabLPS[i][j] of the two-dimensional lookup-table according to $$RangeTabLPS[i][j] = \lfloor Scal(probTabLPS[i \ \% \ \mu], \lfloor i/\mu \rfloor) \cdot Qr_2(R) \rfloor$$

wherein i is a table index associated with a probability information; wherein j is a table index associated with an interval size information; wherein % is a division residual operation; wherein / is a division operation (e.g. providing an integer result); wherein probTabLPS[ ] is the probability table; wherein $\mu$ is a number of elements of the probability table (wherein a range of values of I is typically larger than $\mu$); wherein R is an interval size; wherein $Qr_2(R)$ is a scaling factor which is dependent on R; wherein Scal (x,y) is a scaling function (for example, defined as Scal (x,y)= $\lfloor x*a^{-by} \rfloor$, wherein $\lfloor \cdot \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

This computational rule implements the before-mentioned concepts in a very efficient manner.

In an embodiment of the arithmetic encoder, the two-dimensional look-up table is representable as a dyadic product between a first one-dimensional vector (forming a one-dimensional look-up table) entries of which comprise probability values for different value intervals of a value domain for the first and second state variable values, or the scaled and/or rounded version ($\lfloor s^{k}*a^{k} \rfloor$; $\lfloor |s_k|\cdot a_k \rfloor$) thereof, and a second one-dimensional vector ($Qr_2(R)$) entries of which comprise quantization levels for the coding interval size information.

Such a two-dimensional lookup table is well-usable for an efficient derivation of the interval size information on the basis of the state variable values and on the basis of a coding interval size information. A lookup within the two dimensional lookup table corresponds to a mapping of a state variable value onto a probability value and also to a multiplication of the obtained probability value with a coding interval size. Thus, it is very easily possible to obtain the interval size information, which may be equal to the selected entry of the two dimensional lookup table, wherein a respective element of the two dimensional lookup table may be selected in dependence on the respective state variable value and independence on the coding interval size information (wherein the respective state variable value may determine a first index of the element of the two dimensional lookup table, and wherein the coding interval size information may determine the second index).

In an embodiment, the arithmetic encoder is configured to compute from the first and second state variable values, or the scaled and/or rounded version ($\lfloor s^{k}*a^{k} \rfloor$) thereof, first and second subinterval width values ($R*p^{k}$), respectively, by mapping the first and second state variable values ($s_k$), or a scaled and/or rounded version thereof ($\lfloor s^{k}_2*a^{k}_2 \rfloor$) using a one-dimensional look-up table (LUT4) entries of which comprise probability values for different value intervals of a value domain for the first and second state variable values, or the scaled and/or rounded version ($\lfloor s^{k}*a^{k} \rfloor$) thereof, onto a first and second probability value, and quantizing a coding interval size information (e.g. R) describing a size of a coding interval of the arithmetic encoding before an encoding of a symbol onto a quantization level; determine products (either by look-up of precomputed products, or by multiplication) between the first and second probability value, on the one hand, and the quantization level, and obtaining a combined subinterval width value using the first subinterval width value and the second subinterval width value (for example, using a weighted summation or using a weighted averaging).

It has been found that using such an approach is also very efficient under certain circumstances. By deriving a first subinterval width value on the basis of the first state value only (but without considering the second state value) and by computing a second subinterval width value on the basis of the second state variable value only (but without considering the first state variable value), a substantially separate handling of the state variable values, which are obtained using different adaptation time constants, is maintained through most of the processing. Only in a final stage, the first subinterval width a value and the second subinterval width value are combined, to obtain a combined subinterval width value which brings along a high precision and avoids degradations which would, under some circumstances, occur if the first state variable value and the second state variable value were combined at a too-early stage.

In an embodiment, the arithmetic encoder is configured to perform the quantizing the coding interval size information by applying a logical right shift onto the coding interval size information.

This concept is particularly easy to implement, since a logical right shift may use only minimal computational resources.

In an embodiment, the arithmetic encoder is configured to perform the quantizing the coding interval size information R by $Qr_2(R)=(\lfloor R\cdot 2^{-u} \rfloor+v)\cdot 2^{-w}$, where u, v and w are parameters.

It has been found that such a quantization can also be implemented very easily. In particular, the computational effort is very low if the parameters u, v and w are chosen to be integer values (or integer values larger than 1).

In an embodiment of the arithmetic encoder, the entries of the one-dimensional look-up table monotonically decrease at an increase of the first and second state variable values, or the scaled and/or rounded version ($\lfloor s^{k}*a^{k} \rfloor$) thereof.

Using monotonically decreasing entries of the one dimensional lookup table has shown to bring along good results for the interval size information.

In an embodiment of the arithmetic encoder, wherein different value intervals of the value domain for the first and second state variable value, or the scaled and/or rounded version ($\lfloor s^{k}*a^{k} \rfloor$) thereof, are equally sized.

Using such an equal sizing of the value intervals allows for a simple quantization. Furthermore, an equal sizing of the value intervals allows for an on-the-fly determination of elements of the look-up table with moderate effort.

In an embodiment of the arithmetic encoder, wherein different value intervals of the value domain for the first and second state variable value, or the scaled and/or rounded version ($\lfloor s^k * a^k \rfloor$) thereof, are equally sized.

Using such a monotonic decrease of the entries of the one dimensional lookup table, it is possible to represent an exponential decay with good accuracy.

An embodiment according to the invention creates an arithmetic encoder for encoding a plurality of symbols having symbol values (e.g. binary values), wherein the arithmetic encoder is configured to derive an interval size information ($p^k$, $R*p^k$) for an arithmetic encoding of one or more symbol values to be encoded on the basis of a plurality of state variable values ($s_i^k$) (which are, for example, associated with a given context mode, indicated by index k), which represent statistics of a plurality of previously encoded symbol values (e.g. a sequence of binary values 0 and 1) with different adaptation time constants, wherein the arithmetic encoder is configured to derive a combined state variable value ($s_k$) (which may, for example, be a weighted sum of state variable values) one the basis of the plurality of (individual) state variable values ($s_i^k$), and wherein the arithmetic encoder is configured to map the combined state variable value ($s_k$), or a scaled and/or rounded version thereof ($\lfloor s^k_2 * a^k_2 \rfloor$) using a look-up table, in order to obtain the interval size information (e.g. $p_k$ or $R*p_k$) describing an interval size for the arithmetic encoding of one or more symbols to be encoded.

This embodiment according to the invention is based on the idea that a high efficiency in the determination of the interval size information is obtained if a combined state variable value is determined before a mapping is performed using a lookup table. Accordingly, it is no longer necessary to perform separate lookup-table lookups using the two (or more) state variable values. Rather, a single table lookup may be sufficient in order to determine the interval size information. In particular, it has been found that the combination of the first state variable value and of the second state variable value before performing the lookup-table lookup does not severely degrade the quality of the interval size information under many circumstances.

In an embodiment, the arithmetic encoder is configured to determine a weighted sum of state variable values, in order to obtain the combined state variable value.

It has been found that the computation of a weighted sum of the state variable values is an efficient manner to determine the combined state variable value and is also well-suited to consider the different relevance of the two state variable values, which is caused by the different adaptation time constants used when deriving the state variable values.

In an embodiment, the arithmetic encoder is configured to determine a sum of rounded values $$(\lfloor s_i^k \cdot d_i^k \rfloor),$$

which are obtained by rounding products of state variable values $$(s_i^k)$$

and associated weight values $$(d_i^k),$$

in order to obtain the combined state variable value ($s_k$).

It has been found that performing a rounding of scaled values before performing a summation brings along a particularly meaningful result. Negligible contributions of one of the state variable values are eliminated by the rounding and do not affect the combined state variable value. Accordingly, highly reliable results can be obtained, and a combined state variable value typically takes an integer value, which is well-suited to serve as an index for selecting an element of a lookup table.

In an embodiment, the arithmetic encoder is configured to determine the combined state variable value $s_k$ according to $$s_k = \sum_{i=1}^{N} \lfloor s_i^k \cdot d_i^k \rfloor$$

wherein $s^k_2$ are state variable values, wherein N is a number of state variable values considered, wherein $\lfloor \bullet \rfloor$ is a floor operator, wherein $d^k_i$ are weighting values associated with the state variable values (for example, weighting factors that control the influence of the individual state variable values onto the combined state variable value) (wherein $d^k_i$ are advantageously integer-valued potencies of von 2, and wherein a ratio between two different $d^k_i$ is advantageously an integer-valued potency of 2) [wherein a ratio between two different $d^k_i$ is advantageously larger than or equal to 8).

This concept for the derivation of the combined state variable value brings along very meaningful combined state variable values, as explained before.

In an embodiment, the arithmetic encoder is configured to change the state variable value into a first direction (e.g. to become more positive) if a symbol to be encoded takes a first value (e.g. "1"), and to change the state variable value into a second direction (e.g. to become more negative) if a symbol to be encoded takes a second value (e.g. "0") which is different from the first value (for example, such that the state variable value can take positive and negative values), and wherein the arithmetic encoder is configured to determine an entry of the lookup-table to be evaluated in dependence on an absolute value ($s_k$ if $s_k^i > 0$, $-s_k$ otherwise) of the combined state variable value (e.g in dependence on a scaled and rounded version of an absolute value of the combined state variable value).

This concept for the determination of the state variable values (e.g., for the determination of the first state variable value and for the second state variable value) brings along the same advantages as in the case where a separate mapping of the first state variable value and of the second state variable value is used.

In an embodiment, the arithmetic encoder is configured to set a probability value ($p^k$) to a value provided by the lookup table (e.g. to LUT2[$\lfloor s_k \cdot a_k \rfloor$]) if the combined state variable value takes a first sign (e.g. a positive sign), and wherein the arithmetic encoder is configured to set the probability value ($p^k$) to a value obtained by subtracting a value provided by the lookup table (e.g. to LUT2[$\lfloor -s_k \cdot a_k \rfloor$]) from a predetermined value (e.g. 1) if the combined state variable value takes a second sign (e.g. a negative sign).

This concept for mapping the combined state variable value onto a probability value is efficient, since the size of the lookup table can be reduced. In particular, a number of elements of the lookup table can be reduced, since a same element of the lookup table is associated with a given positive combined state variable value and a negative version of the given (positive) combined state variable value. In other words, in the given concept, the absolute value of the combined state variable value determines which element of the lookup table is evaluated for the provision of the probability value.

However, the sign of the combined state variable value is still considered in an appropriate and efficient manner by setting the probability value to the value provided by the lookup table or to a value obtained by subtracting a value provided by the lookup table from a predetermined value dependent on the sign. Accordingly, a meaningful probability value can be obtained on the basis of the combined state value with low computational complexity.

In an embodiment, the arithmetic encoder is configured to determine a combined probability value $p_k$ according to $$p_k = \begin{cases} LUT2[\lfloor s_k \cdot a_k \rfloor], & \text{if } s_k \geq 0 \\ 1 - LUT2[\lfloor -s_k \cdot a_k \rfloor], & \text{else.} \end{cases}$$

wherein LUT2 is a lookup-table containing probability values; wherein $\lfloor \cdot \rfloor$ is a floor operator; wherein $s^k$ is a combined variable value; and wherein $a^k$ is a weighting value associated with the combined state variable value (for example, a weighting value that adapts a number range of the i-th state variable value to a number of entries of the lookup-table).

This concept for the determination of the combined probability value on the basis of the combined state variable value $s_k$ implements the idea outlined before in a computationally highly efficient manner.

In an embodiment, the arithmetic encoder is configured to determine a combined probability value $p_k$ according to $$p_k = \begin{cases} LUT2[\lfloor s_k \cdot a_k \rfloor], & \text{if } \lfloor s_k \cdot a_k \rfloor \geq 0 \\ 1 - LUT2[-\lfloor s_k \cdot a_k \rfloor], & \text{else} \end{cases}$$

wherein LUT2 is a lookup-table containing probability values; wherein $\lfloor \cdot \rfloor$ is a floor operator; wherein $s^k$ is a combined variable value; and wherein $a^k$ is a weighting value associated with the combined state variable value (for example, a weighting value that adapts a number range of the i-th state variable value to a number of entries of the lookup-table).

In this concept, there is no absolute value computation of the scaled combined state variable value $s_k$. Rather, there is only a "floor" operation, which is applied to the scaled ("weighted") combined state variable value which can, in some circumstance, be implemented with lower effort than an absolute value formation. A negation is only applied to an integer value, which is obtained by a downward-rounding (floor operator) of the weighted combined state variable value. However, negating an integer value is typically less complicated than negating a fractional value or a value in a floating point representation. Accordingly, the concept discussed here can be helpful to reduce a complexity under some circumstances.

In an embodiment, the arithmetic encoder is configured to map the combined state variable value, or the scaled and/or rounded version ($\lfloor s^k * a^k \rfloor$) thereof, onto a subinterval width value ($R*p^k$) using a two-dimensional look-up table, entries of which are addressed in dependence on the combined state variable value (e.g. to determine a first lookup table entry coordinate) and in dependence on a coding interval size information (e.g. R) describing a size of a coding interval of the arithmetic encoding before an encoding of a symbol (e.g. to determine a second lookup table entry coordinate).

Using this concept, a mapping of the combined state variable value onto a combined probability value and a multiplication of the combined probability value with a coding interval size can be combined into a single lookup table lookup operation. Accordingly, a two dimensional lookup table is needed, but a multiplication operation is saved. The entries of the two dimensional lookup table may be pre-computed, which keeps the combinational load at run time very low. Rather, a first table index may be determined on the basis of a combined state variable value, or a scaled and/or rounded version thereof, and a second table index may be determined on the basis of a coding interval size information (for example, using a rounding or a quantization). The first step index and the second state index may uniquely designate an element of the two dimensional lookup table, and the designated element of the two dimensional lookup table may be used as the sub interval width value (or as the interval size information). Accordingly, a very efficient concept is obtained, which saves computational complexity in case that sufficient memory for the lookup table is available.

In an embodiment of the arithmetic encoder, the two-dimensional look-up table is representable as a dyadic product between a first one-dimensional vector (LUT4[ . . . ]; forming a one-dimensional look-up table) entries of which comprise probability values for different value intervals of a value domain for the combined state variable value, or the scaled and/or rounded version ($\lfloor s^k * a^k \rfloor$; $|s_k| \cdot a_k$) thereof, and a second one-dimensional vector ($Qr_2$ (R)) entries of which comprise quantization levels for the coding interval size information.

Such a two dimensional lookup table brings along very good results. In particular, all the elements of this two dimensional lookup table represent the multiplication of respective probability values associated with the combined state variable values and of a coding interval size. Thus, the two dimensional lookup table described herein eliminates the need for a multiplication, which can be considered as very resource efficient.

In an embodiment of the arithmetic encoder, elements of the two-dimensional lookup-table (RangTabLPS) are defined on the basis of a base lookup table (Base TabLPS), wherein a first group (or block; e.g. an "upper half") of the elements of the two-dimensional lookup-table are identical to elements of the base lookup-table or are rounded versions of elements of the base lookup table, and wherein a second group, (or block; e.g. a "lower half") of the elements of the two-dimensional lookup-table are scaled and rounded versions of elements of the base lookup-table.

By defining the element of the two dimensional lookup table on the basis of a base lookup table, the two dimensional lookup table can be generated in a very simple manner. Furthermore, since the second group of elements of the two dimensional lookup table are scaled and rounded versions of the elements of the base lookup table (while the elements of the first group of elements of the two dimensional lookup table are identical to elements of the base lookup table or are rounded versions of elements of the base lookup table) an exponential evolution of the elements in a row or in a column of the two dimensional lookup table is well reflected. By using the concept that a second block of the elements of the two dimensional lookup table is substantially (except for rounding effects) a scaled version of a first block of elements of the two dimensional lookup table, it is possible to reflect an appropriate characteristic for mapping the combined state variable value onto an interval size information.

In an embodiment of the arithmetic encoder, the second group of elements of the two-dimensional lookup-table are right-shifted versions of elements of the base-lookup table.

This allows for a simple generation of the entries (elements) of the two-dimensional lookup-table.

It has been found that a right-shifting element of the base-lookup table is a very efficient concept which combines a scaling and a rounding operation.

In an embodiment of the arithmetic encoder, a probability index ($Qp_2(p_{LPS})$ or i) determines whether an element of the first group of elements of the two-dimensional lookup table or an element of a second group of elements of the two-dimensional lookup table is evaluated, wherein a first range (for example, between 0 and $\mu$–1) of probability indices (which are, for example, obtained by quantizing a probability value, e.g. $p_{LPS}$) is associated with elements of the first group of elements, and wherein a second range (for example, larger than or equal to $\mu$) of probability indices (which are, for example, obtained by quantizing a probability value, e.g. $p_{LPS}$, e.g. using a quantization function $Qp2(\bullet)$) is associated with elements of the second group of elements.

By using a probability index, which may be derived directly from the combined state variable value (without using a probability value as an intermediate quantity) or which may be derived using a combined probability value which is based on a combined state variable value, a selection of an element of the two dimensional lookup table may be made very efficiently. Also, the probability index is used to switch between a usage of elements of the first group of elements and elements of the second group of elements, which allows for an efficient on-the-fly determination of elements of the two dimensional lookup table.

In an embodiment of the arithmetic encoder, a division residual (i %$\mu$) of a division between the probability index (i) and a first size value (e.g. $\mu$; wherein the size value, for example, describes an extension of the base lookup table in a first direction) and an interval size index (which may, for example, be obtained on the basis on an interval size information R, for example using a quantization operation $Qr2(\bullet)$; for example, j) determine which element of the base lookup table is used to obtain the element of two-dimensional lookup table.

In an embodiment, the arithmetic encoder is configured to obtain an element of the two-dimensional lookup-table (RangTabLPS) according to $$RangeTabLPS[i][j] = Scal(BaseTabLPS[i \% \mu][j], \lfloor i/\mu \rfloor)$$

wherein BaseTabLPS is a base lookup table of dimension $\mu \times \lambda$; wherein i is a table index associated with a probability information; wherein j is a table index associated with an interval size information (e.g. describing a current coding interval size); wherein % is a division residual operation; wherein / is a division operation; wherein Scal (x,y) is a scaling function (for example, defined as Scal (x,y)= $\lfloor x * a^{-by} \rfloor$, wherein $\lfloor \bullet \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

By evaluating said division residual to determine which element of the base lookup table is used to obtain the element of the two dimensional lookup table, an on-the-fly determination of the elements of the two dimensional lookup table can be performed with very high efficiency. In particular, the fact that the two dimensional lookup table comprises two or more groups of elements, which are based on the same elements of the base lookup table, can be reflected by the usage of the division residual for the determination which elements of the base lookup table is used to obtain the element of the two dimensional lookup table. In other words, a periodic relationship between elements of the two dimensional lookup table and elements of the base lookup table is well-reflected by the consideration of said division residual, since the division residual is also periodic with increasing probability index.

In an embodiment of the arithmetic encoder, elements of the two-dimensional lookup-table (RangTabLPS) are defined on the basis of a probability table (probTabLPS), wherein the probability table describes interval sizes for a set of a plurality of probability values (for example, represented by indices i) and for a given (reference) coding interval size, and wherein elements of the two-dimensional lookup-table for a probability value which is not in the set of a plurality of probability values and/or for a coding interval size which is different from the given coding interval size are derived from the probability table using a scaling.

This concept is based on the same considerations like the corresponding concept described for the case of a separate mapping of the state variable values.

In an embodiment of the arithmetic encoder, elements of the two-dimensional lookup-table (RangTabLPS) are defined on the basis of a probability table (probTabLPS), wherein the probability table describes interval sizes for a set of a plurality of probability values (for example, represented by indices i) and for a given (reference) coding interval size, and wherein elements of the two-dimensional lookup-table for a probability value which is not in the set of a plurality of probability values and/or for a coding interval size which is different from the given coding interval size are derived from the probability table using a scaling.

It has been found that such an on-the-fly determination of an element of the two dimensional lookup table comprises a particularly high resource efficiency. Furthermore, it should be noted that the above comments made with respect to the corresponding algorithm used within the context of a separate mapping of the first state variable value and of the second state variable value also apply. By using a probability table, which is typically smaller (e.g., comprises less elements) than the two dimensional lookup table, as the basis for a determination of the elements of the two dimensional lookup table, a very high efficiency can be obtained. For example, the probability table may represent the mapping of different probability values and the different (quantized) coding interval sizes over a significant range, and may therefore help to avoid multiplications which go beyond a simple scaling (wherein a "simple" scaling may, for example, be implemented using shift operations).

Elements of the two dimensional lookup table for one or more probability values which are not in the set of a plurality of probability values and for one or more coding interval sizes which are different from the given coding interval size are derived from the probability table using a scaling. Accordingly, it is sufficient to have a very small probability table, which may, for example, only comprise one row or one column. So, the number of elements of the probability table may even be smaller than the number of different possible probability values (i.e., smaller than the number of different possible probability indexes of the two dimensional lookup table). Furthermore, it should be noted that the scaling depends on the probability values and/or depends on the coding interval size. The scaling may, for example, be performed using a very simple mechanism, like a bit-shift operation if the size of the probability table is chosen appropriately. Such "simple" scaling operations, which are based on bit-shift operations, may use significantly less computational resources when compared to "normal" multiplications with arbitrary variable operands (which are, for example, different from potencies of two).

In an embodiment of the arithmetic encoder, elements of the two-dimensional lookup-table are obtained using a (multiplicative) first scaling of a selected element (probTabLPS[i %μ]) of the probability table in dependence on the coding interval size (R), and using a second scaling of a result of the first scaling in dependence on whether an element associated with a current probability value (designated by index i) is included in the set of probability values or not (e.g. in dependence on whether the current probability value lies within a range of probability values covered by the probability table or not).

It has been found that such a computation of elements of the two dimensional lookup table is particularly efficient. Furthermore, reference is also made to the above discussion of the corresponding functionality provided in the context of a separate mapping of the first state variable value and of the second state variable value.

In an embodiment of the arithmetic encoder, a division residual (i %μ) of a division between a probability index (e.g. i; e.g. representing the current probability value) and a first size value (e.g. μ; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor ($2^{-\lfloor i/\mu \rfloor}$) used in the second scaling; and/or wherein the coding interval size determines a multiplicative scaling factor (Qr2(R)) of the first scaling.

Regarding this functionality, reference is also made to the above discussion of the corresponding functionality provided in the context of a separate mapping of the first state variable value and of the second state variable value.

In an embodiment, the arithmetic encoder is configured to obtain an element RangeTabLPS[i][j] of the two-dimensional lookup-table according to $$RangeTabLPS[i][j] = Scal(\lfloor probTabLPS[i \% \mu] \cdot Qr_2(R) \rfloor, \lfloor i/\mu \rfloor)$$

wherein i is a table index associated with a probability information; wherein j is a table index associated with an interval size information; wherein % is a division residual operation; wherein / is a division operation; wherein probTabLPS[ ] is the probability table; wherein μ is a number of elements of the probability table (wherein a range of values of I is typically larger than μ); wherein R is an interval size (or a current coding interval size); wherein Qr2(R) is a scaling factor which is dependent on R; wherein Scal (x,y) is a scaling function (for example, defined as Scal $(x,y)=\lfloor x*a^{-by} \rfloor$, wherein $\lfloor \cdot \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

Regarding this functionality, reference is also made to the above discussion of the corresponding functionality provided in the context of a separate mapping of the first state variable value and of the second state variable value.

In an embodiment of the arithmetic encoder, elements of the two-dimensional lookup-table are obtained using a (multiplicative) first scaling of a selected element (probTabLPS[i %μ]) of the probability table in dependence on whether an element associated with a current probability value (designated by index i) is included in the set of probability values or not (e.g. in dependence on whether the current probability value lies within a range of probability values covered by the probability table or not) and using a second scaling of a result of the first scaling in dependence on the coding interval size (R).

Regarding this functionality, reference is also made to the above discussion of the corresponding functionality provided in the context of a separate mapping of the first state variable value and of the second state variable value.

In an embodiment of the arithmetic encoder, a division residual ([i %μ]) of a division between a probability index (e.g. i; e.g. representing the current probability value) and a first size value (e.g. μ; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor ($2^{-\lfloor i/\mu \rfloor}$) used in the first scaling; and/or wherein the coding interval size (R) determines a multiplicative scaling factor (Qr₂(R)) of the second scaling.

Regarding this functionality, reference is also made to the above discussion of the corresponding functionality provided in the context of a separate mapping of the first state variable value and of the second state variable value, wherein the combined state variable value or the combined probability value is used instead of the respective individual state variable value or the respective individual probability values.

In an embodiment, the arithmetic encoder is configured to obtain an element RangeTabLPS[i][j] of the two-dimensional lookup-table according to $$RangeTabLPS[i][j] = \lfloor Scal(probTabLPS[i \% \mu], \lfloor i/\mu \rfloor) \cdot Qr_2(R) \rfloor$$

wherein i is a table index associated with a probability information; wherein j is a table index associated with an interval size information; wherein % is a division residual operation; wherein / is a division operation (e.g. providing an integer result); wherein probTabLPS[ ] is the probability table; wherein μ is a number of elements of the probability table (wherein a range of values of I is typically larger than μ); wherein R is an interval size; wherein Qr₂(R) is a scaling factor which is dependent on R; wherein Scal (x,y) is a scaling function (for example, defined as Scal (x,y)= $\lfloor x*a^{-by} \rfloor$, wherein $\lfloor \cdot \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

Regarding this functionality, reference is also made to the above discussion of the corresponding functionality provided in the context of a separate mapping of the first state variable value and of the second state variable value, wherein the combined state variable value takes the place of the individual state variable values and wherein the combined probability value takes the place of the individual probability values.

In an embodiment, the arithmetic encoder is configured to compute from the combined state variable value, or the scaled and/or rounded version ($\lfloor s^{k}*a^{k}\rfloor$) thereof, a subinterval width value ($R*p^{k}$) by mapping the combined state variable value ($s_k$), or a scaled and/or rounded version thereof ($\lfloor s^{k}*a^{k}\rfloor$; $\lfloor |s_k|\cdot a_k\rfloor$) using a one-dimensional look-up table (LUT4) entries of which comprise probability values for different value intervals of a value domain for the combined state variable value, or the scaled and/or rounded version ($\lfloor s^{k}*a^{k}\rfloor$; $\lfloor |s^{k}|\cdot a^{k}\rfloor$) thereof, onto a combined probability value, and quantizing a coding interval size information (e.g. R) describing a size of a coding interval of the arithmetic encoding before an encoding of a symbol onto a quantization level; a product (either by look-up of precomputed products, or by multiplication) between the combined probability value and the quantization level.

Regarding this functionality, reference is also made to the above discussion of the corresponding functionality provided in the context of a separate mapping of the first state variable value and of the second state variable value, wherein the combined state variable value takes the place of the individual state variable values, and wherein the combined probability value takes the place of the individual probability values.

In an embodiment, the arithmetic encoder is configured to perform the quantizing the coding interval size information by applying a logical right shift onto the coding interval size information.

Regarding this functionality, reference is also made to the above discussion of the corresponding functionality provided in the context of a separate mapping of the first state variable value and of the second state variable value.

In an embodiment, the arithmetic encoder is configured to perform the quantizing the coding interval size information R by $Qr_2(R)=(\lfloor R\cdot 2^{-u}\rfloor+v)\cdot 2^{-w}$, where u, v and w are parameters.

Regarding this functionality, reference is also made to the above discussion of the corresponding functionality provided in the context of a separate mapping of the first state variable value and of the second state variable value.

In an embodiment of the arithmetic encoder, the entries of the one-dimensional look-up table monotonically decrease at an increase of the combined state variable value, or the scaled and/or rounded version ($\lfloor s^{k}*a^{k}\rfloor$) thereof.

Regarding this functionality, reference is also made to the above discussion of the corresponding functionality provided in the context of a separate mapping of the first state variable value and of the second state variable value.

In an embodiment of the arithmetic encoder, different value intervals of the value domain for the combined state variable value, or the scaled and/or rounded version ($\lfloor s^{k}*a^{k}\rfloor$) thereof, are equally sized.

Regarding this functionality, reference is also made to the above discussion of the corresponding functionality provided in the context of a separate mapping of the first state variable value and of the second state variable value.

In an embodiment of the arithmetic encoder, the entries of the one-dimensional look-up table monotonically decrease with decreasing rate at an increase of the combined state variable value, or the scaled and/or rounded version ($\lfloor s^{k}*a^{k}\rfloor$) thereof.

Regarding this functionality, reference is also made to the above discussion of the corresponding functionality provided in the context of a separate mapping of the first state variable value and of the second state variable value.

In an embodiment of the arithmetic encoder, the lookup-table defines (for example, within a tolerance of +/−10% or +/−20%) an exponential decay (e.g. down from 0.5).

It has been found that an exponential decay well reflects an appropriate relationship for a derivation of an interval size information on the basis of state variable values. Also, an exponential decay can be represented very efficiently using a lookup table, wherein even an on-the-fly determination of elements of the lookup table is possible with small effort.

In an embodiment, the arithmetic encoder is configured to update the plurality of variable state values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k - \lfloor A[z + \lfloor -s_i^k \cdot m_i^k \rfloor] \cdot n_i^k \rfloor, & \text{If symbol to be encoded is 0.} \end{cases}$$

wherein z is a predetermined (constant) offset value; wherein $$m_i^k$$

are one or more weighting values; wherein $$n_i^k$$

are one or more weighting values, wherein A is $$A[z+\hat{s}] = \text{offset} + \sum_{i=1}^{\hat{N}} \max(0, \hat{b}_i - \hat{s}) << \hat{a}_i$$

or deviates therefrom merely for one or more extreme values of its argument by zero setting or magnitude reduction to avoid the updated $$s_i^k$$

leaving a predetermined value range, (e.g. consider that $$s_i^k$$

has a value domain larger than $$s_i^k \cdot m_i^k;$$

that is, $$s_i^k$$

is quasi quantized onto $$s_i^k \cdot m_i^k;$$

for extreme values of $$s_i^k \cdot m_i^k, s_i^k$$

may be modified by an unamended A according to above formula to leave its value domain; to avoid this, the entries corresponding to these extreme values might be reduced or zeroed), where offset, $\hat{N}$, $\hat{b}_i$, and $\hat{a}_i$ are predetermined parameters (examples are set out above).

It has been found that such an update of the state variables can be done with high computational efficiency, wherein the mapping table may be precomputed. For example, it can be achieved that the state variable values $$s_i^k$$

remain with a predetermined range (for example, between a predetermined minimum value and a predetermined maximum value). Moreover, using an appropriate choice of the mapping table A, it can be achieved that the state variable values are well adapted for a description of statistics of previously processed (e.g., encoded or decoded) symbols. Also, it should be noted that an adaptation time constant of the respective state variable values can be adapted by an appropriate choice of the weighting values m and n. Thus, the algorithm described here can be efficiently used for the update of the state variable values $$s_i^k.$$

In an embodiment, the arithmetic encoder is configured to derive $$A\left[z + \left\lfloor s_i^k \cdot m_i^k \right\rfloor\right]$$

by table look-up or computationally.

Thus, different concepts are possible to derive the updated state variable values.

An embodiment according to the invention creates an arithmetic encoder for encoding a plurality of symbols having symbol values (e.g. binary values), wherein the arithmetic encoder is configured to determine one or more state variable values ($s_1^k$, $s_2^k$), which represent statistics of a plurality of previously encoded symbol values (e.g. a sequence of binary values 0 and 1) (for example, in the case of a plurality of state variable values, statistics with different adaptation time constants), and wherein the arithmetic encoder is configured to derive an interval size information ($p^k$, $R*p^k$) for an arithmetic encoding of one or more symbol values to be encoded on the basis of the one or more state variable values ($s_i^k$) (which are, for example, associated with a given context mode, indicated by index k), which represent statistics of a plurality of previously encoded symbol values (e.g. a sequence of binary values 0 and 1) (for example, in the case of a plurality of state variable values, statistics with different adaptation time constants), wherein the arithmetic encoder is configured to update a first state variable value ($s_1^k$) in dependence on a symbol to be encoded and using a look-up table (A) (for example, after encoding the symbol to be encoded).

This embodiment according to the invention is based on the finding that an update of a state variable value, which is used for a derivation of an interval size information for an arithmetic coding (e.g., an encoding or a decoding) can be performed with particularly good results using a lookup table, because the usage of a lookup table allows for an update of the state variable value which is particularly well-adapted to characteristics of a signal to be encoded or to be decoded. For example, it is easily possible to represent a fine-tuned relationship between an "old" state variable value and an updated state variable value using a lookup table, while there is no need to perform extensive computations (like, for example, an evaluation of a trigonometric function or of an exponential function or of a logarithmic function, or the like). Thus, an implementation of an update of a state variable value using a lookup table helps to keep a computational complexity reasonably small. Ideally, only multiplications (or simple multiplications, e.g. bit shift operations), rounding operations and additions are used beside the lookup table lookup in order to obtain the updated state variable value on the basis of the "old" state variable value. For example, the currently processed symbol (for example, a symbol to be encoded or a decoded symbol) decides which part of a, for example, lookup-table based mapping rules is evaluated in order to obtain the updated state variable value.

To conclude, the provision of an updated state variable value using a lookup table has been found to provide both a high flexibility and a low computational complexity.

In an embodiment, the arithmetic encoder is configured to update a second state variable value ($s_2^k$) in dependence on a symbol to be encoded and using the look-up table (A) (for example, after encoding the symbol to be encoded).

It has been found that it is advantageous to update a second state variable value using the same lookup table which is used to update the first state variable value. Possible differences, for example, with respect to the adaptation time constants of the first state variable value and the second state variable value, can be considered, for example, using one or more scaling factors, which may, for example, be applied in the selection of an element of the lookup table and/or for a scaling of a selected element of the lookup table. To conclude, even if only a single lookup table is used for the derivation of two or more state variable values, the two or more state variable values can be adapted to represent different statistic characteristics of the handled symbol values (i.e., of the previously encoded symbol values or of the decoded symbol values).

In an embodiment, the arithmetic encoder is configured update the first state variable value and the second state variable values using different adaptation time constants.

By updating the first state variable value and the second state variable value using different adaptation time constants, different statistic characteristics of the previously handled symbols can be reflected by the state variable values. It has been found that the availability of state variable values representing statistics of the handled symbols with different adaptation time constants is very helpful for an accurate adjustment of an interval size for the arithmetic coding (encoding/decoding) of the symbols. Also, it has been found that lookup-table-based update of the state variable values provides a very high reliability and a low computational complexity.

In an embodiment, the arithmetic encoder is configured to selectively increase or decrease a previous state variable value by a value determined using the look-up table in dependence on whether a symbol to be encoded takes a first value or a second value which is different from the first value.

By using such an approach, the state variable value can be adapted recursively, wherein the handled symbol (for example, a symbol to be encoded, or a previously encoded symbol, or a previously decoded symbol) determines the direction (increase or decrease) of the change of the state variable value. On the other hand, the size of the adaptation (i.e., of the increase or decrease) is determined by the selected lookup table entry, wherein a scaling may apply. Consequently, there is an efficient mechanism for the update of the state variable value, which provides a high degree of flexibility and still is very resource-efficient.

In an embodiment, the arithmetic encoder is configured to increase a previous state variable value by a comparatively larger value in case that the previous state variable value is negative when compared to a case that the previous state variable value is positive if a symbol to be encoded takes a first value; and wherein the arithmetic encoder is configured to decrease a previous state variable value by a comparatively larger value in case that the previous state variable value is positive when compared to a case that the previous state variable value is negative if a symbol to be encoded takes a second value which is different from the first value (which is reached, for example, by an appropriate choice of the lookup-table).

Using such an approach, it can be reached that a state variable value develops towards a maximum positive value in an exponential manner, and develops towards a minimum value in an exponential manner. This approximation towards the (positive) maximum value and towards the (negative) minimum value may be in an approximately asymptotic manner. In other words, the further the current state variable value is away from the (positive) maximum value, the larger the (increase) step towards the (positive) maximum value, and the further the current state variable value is away from the (negative) minimum value, the larger the (decrease) step towards the (negative) minimum value. Thus, an exponential asymptotic behavior can be approximated using this concept. However, it has been found that such a concept is very well-suited for the update of the state variable values. In particular, it has been found that such an approach is well suited for an "infinite impulse response" approach for the determination of the state variable value.

In an embodiment, the arithmetic encoder is configured to determine an index of an entry of the lookup table to be evaluated when updating the first state variable value in dependence on a sum of a predetermined (e.g. fixed) offset value (z) and a previously computed first state variable value $$(s_1^k),$$

or a scaled and/or rounded version $$(\lfloor s_1^k \cdot m_1^k \rfloor)$$

thereof, if a symbol to be encoded takes a first value; and wherein the arithmetic encoder is configured to determine an index of an entry of the lookup table to be evaluated when updating the first state variable value in dependence on a sum of a predetermined (e.g. fixed) offset value (z) and a in inversed (multiplied by −1) version $$(-s_1^k)$$

of a previously computed first state variable value, or a scaled and/or rounded version $$(\lfloor -s_1^k \cdot m_1^k \rfloor)$$

thereof (e.g. of the inversed version of the previously computed first state variable value), if a symbol to be encoded takes a second value.

Using such approach, an appropriate entry of the lookup table can be selected with moderate effort, taking into consideration a currently handled symbol. Both the previously computed state variable value and the handled (encoded or decoded) symbol determine the selection of an entry of the lookup table, and may consequently determine by how much the updated state variable value is increased or decreased when compared to the previously computed state variable value. The offset value may, for example, ensure that the sum of the offset value and of the scaled (and possibly inversed, depending on the handled symbol) previously computed state variable value results in a valid lookup table index since valid lookup table indices are typically non-negative. Using such a concept, it is easily possible to select an appropriate lookup table index and to efficiently provide the updated state variable value.

In an embodiment, the arithmetic encoder is configured to determine an index of an entry of the lookup table to be evaluated when updating the second state variable value in dependence on a sum of a predetermined (e.g. fixed) offset value (z) and a previously computed second state variable value $$(s_2^k),$$

or a scaled and/or rounded version $$(\lfloor s_2^k \cdot m_2^k \rfloor)$$

thereof, if a symbol to be encoded takes a first value; and wherein the arithmetic encoder is configured to determine an index of an entry of the lookup table to be evaluated when updating the second state variable value in dependence on a sum of a predetermined (e.g. fixed) offset value (z) and a in inversed (multiplied by −1) version $$(-s_2^k)$$

of a previously computed second state variable value, or a scaled and/or rounded version $$(\lfloor -s_2^k \cdot m_2^k \rfloor)$$

thereof (e.g. of the inversed version of the previously computed second state variable value), if a symbol to be encoded takes a second value.

This concept for the update of the second state variable value is substantially identical to the concept for the update of the first state variable value, wherein, for example, the same lookup table may be evaluated to save memory resources, and wherein, for example, a different scaling value when compared to the update of the first state variable value may be used, to thereby obtain a modified state variable value update characteristic. For example, different adaptation time constants for the first state variable value and for the state variable value may be obtained by using different scaling values for the determination of the updated first state variable value and the updated second state variable value.

In an embodiment, the arithmetic encoder is configured to apply a first scaling value ($m_1^k$), to scale the previously computed first state variable value ($s_1^k$), when determining an index of an entry of the lookup table to be evaluated when updating the first state variable value, and wherein the arithmetic encoder is configured to apply a second scaling value ($m_2^k$), to scale the previously computed second state variable value ($s_2^k$), when determining an index of an entry of the lookup table to be evaluated when updating the second state variable value, wherein the first scaling value is different from the second scaling value (and wherein the first and the second scaling values are advantageously integer potencies of 2, and wherein a ratio between the first scaling value and the second scaling value is advantageously an integer potency if 2, and wherein the first scaling value and the second scaling value advantageously differ by a factor of at least 8).

By using different scaling values when determining an index of an entry of a lookup table to be evaluated when updating the first state variable value and when determining an index of an entry of the lookup table to be evaluated when updating the second state variable value, different adaptation time constants can be implemented efficiently, wherein the fundamental state variable value update algorithm and the used lookup table may be identical and wherein the only significant difference may be the choice of the scaling values. This allows for a very resource-saving implementation.

In an embodiment, the arithmetic encoder is configured to scale a value returned by an evaluation of the lookup table using a first scaling value (e.g. $n_1^k$) when updating the first state variable value, wherein the arithmetic encoder is configured to scale a value returned by an evaluation of the lookup table using a second scaling value (e.g. $n_2^k$) when updating the second state variable value, wherein the first scaling value is different from the second scaling value.

The described different scaling of the value returned by the evaluation of the lookup table (e.g. of the selected lookup table entry) allows for an efficient implementation of different adaptation time constants when updating the first state variable value and the second state variable value. Furthermore, such scaling allows to use the same lookup table for the update of the first state variable value and for the update of the second state variable value, which helps to save memory resources.

In an embodiment, the arithmetic encoder is configured to determine one or more updated state variable values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k - \lfloor A[z + \lfloor -s_i^k \cdot m_i^k \rfloor] \cdot n_i^k \rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

It has been found that such an update mechanism for the state variable value can be implemented with high computational efficiency and provides reliable results.

In an embodiment, the arithmetic encoder is configured to determine one or more updated state variable values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k - \lfloor A[z - 1 - \lfloor s_i^k \cdot m_i^k \rfloor] \cdot n_i^k \rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

It has been found that such a mechanism for the update of the state variable value can also be very advantageous in some situations. In particular, it is not necessary to invert a floating point value, which may be computationally inefficient in some implementations, using such an approach. Thus, the present concept may bring along a very good resource efficiency in some circumstances.

In an embodiment, the arithmetic encoder is configured to determine one or more updated state variable values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k + \lfloor -A[z + \lfloor -s_i^k \cdot m_i^k \rfloor] \cdot n_i^k \rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

It has been found that this concept also brings along a particularly high computational efficiency and a good accuracy in some implementation environments.

In an embodiment, the arithmetic encoder is configured to determine one or more updated state variable values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k + \lfloor -A[z - 1 - \lfloor s_i^k \cdot m_i^k \rfloor] \cdot n_i^k \rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

It has been found that this concept also brings along advantages in terms of computational efficiency and reliability in some circumstances.

In an embodiment of the arithmetic encoder, the entries of A decrease monotonically with increasing lookup table index.

Using such an approach, it can be reached that an approximation of the state variable value towards a maximum value or towards a minimum value is monotonous and/or continuous and/or asymptotic. For example, it can be reached that state variables which are far away from a respective maximum value or minimum value are modified towards the maximum value or towards the minimum value comparatively fast, while state variable values which are closer to the respective maximum value or minimum value are changed toward said maximum value or minimum value comparatively slower. Thus, the above-mentioned choice of the entries of the lookup table allows for a smooth approximation of the maximum values or minimum values, which has been found to be very helpful for the derivation of interval size information on the basis of the one more state variable values.

In an embodiment of the arithmetic encoder, A is $$A[z + \hat{s}] = \text{offset} + \sum_{i=1}^{\hat{N}} \max(0, \hat{b}_i - \hat{s}) \ll \hat{a}_i$$

or deviates therefrom merely for one or more extreme values of its argument by zero setting or magnitude reduction to avoid the updated $$s_i^k$$

leaving a predetermined value range, (e.g. consider that $$s_i^k$$

has a value domain larger than $$s_i^k \cdot m_i^k ;$$

that is, $$s_i^k$$

is quasi quantized onto $$s_i^k \cdot m_i^k ;$$

for extreme values of $$s_i^k \cdot m_i^k, s_i^k$$

may be modified by an unamended A according to above formula to leave its value domain; to avoid this, the entries corresponding to these extreme values might be reduced or zeroed), where offset, $\hat{N}$, $\hat{b}_i$, and $\hat{a}_i$ are predetermined parameters (examples are set out above).

It has been found that such a choice of the lookup table A brings along a particularly advantageous behavior of the state variable values which are updated using said lookup table A.

In an embodiment of the arithmetic encoder, a last entry of the lookup table (which is addressed when the first state variable value reaches a predetermined range of values which extends up to a maximum allowable value, or when the first state variable value exceeds a predetermined threshold value) is equal to zero.

By using a last entry of the lookup table, which is equal to 0, it can easily be avoided that the updated state variable value exceeds a maximum value and/or a minimum value.

In an embodiment, the arithmetic encoder is configured to apply a clipping operation to the updated state variable values, to keep the updated and clipped state variable values within a predetermined range of values.

Using such a mechanism, it can easily be prevented that a state variable value exceeds the predetermined range between a minimum value and a maximum value. Accordingly, it can be ensured that the state variable value takes "reasonable" values.

In an embodiment, the arithmetic encoder is configured to apply a clipping operation according to $$s_i^k = \min\left(\max\left(s_i^k, h_i^k\right), g_i^k\right)$$

to the updated state variable values, wherein $$g_i^k$$

is a maximum allowed value for $$s_i^k,$$

and wherein $$h_i^k$$

is a minimum allowed value for $$s_i^k.$$

It has been found that such a clipping operation can be implemented in an efficient manner and avoids invalid state variable values.

In an embodiment, the arithmetic encoder is configured to apply different scaling values for different context models (for example, such that at least one of the scaling values differs between two different context models).

Using different scaling values for different context models, the different statistic characteristics of the different context models (which may be associated with different types of information and/or types of bit stream syntax elements) can be considered. By using different scaling values for the different context models, the update procedure for the state variable values can easily be adapted to different context models without fundamentally changing the underlying algorithm. Thus, appropriate scaling values can be obtained in a very efficient manner.

In an embodiment, the arithmetic encoder is configured to obtain the interval size information as defined in one of the above embodiments.

It has been found that the concept for the update of the state variable values can be well-used in combination with the above-mentioned concept for the derivation of the interval size information.

An embodiment according to the invention creates an arithmetic encoder for encoding a plurality of symbols having symbol values (e.g. binary values), wherein the arithmetic encoder is configured to derive an interval size value ($R_{LPS}$) for an arithmetic encoding of one or more symbol values to be encoded on the basis of one or more state variable values ($s_i^k$) (which are, for example, associated with a given context mode, indicated by index k), which represent statistics of a plurality of previously encoded symbol values (e.g. a sequence of binary values 0 and 1) (e.g. with different adaptation time constants) wherein the arithmetic encoder is configured to determine the interval size value ($R_{LPS}$) using a base lookup table (Base TabLPS), (a dimension of which in terms of probability indices is smaller than a number of possible probability indices i), wherein the arithmetic encoder is configured to determine the interval size value ($R_{LPS}$) such that a determined interval size value is identical to an element of the base lookup table or is a rounded version of an element of the base lookup table if a probability index (i), which is obtained on the basis of the one or more state variable values (for example, as $i=Qp(p_{LPS})$), is within a first range (e.g. smaller than $\mu$), and such that a determined interval size value is obtained using a scaling and rounding of an element of the base lookup table if the probability index is within a second range (e.g. larger than or equal to $\mu$); and wherein the arithmetic encoder is configured to perform the arithmetic encoding of one or more symbols using the interval size value ($R_{LPS}$).

This embodiment according to the invention is based on the idea that a determination of an interval size value in an arithmetic encoder can be performed using a "base lookup table", a dimension of which is smaller than a number of different interval size values associated with a given current coding interval size by re-using elements of said base lookup table, one time without a scaling and one time with a scaling. Accordingly, it can be exploited that interval size values for the arithmetic coding (encoding/decoding), which are associated with different ranges of state variable values, substantially differ by a scaling (for example, except for some rounding effect). Accordingly, a comparatively small "base lookup table" can be used, entries of which are used multiple times for different probability indices (wherein the probability indices may be derived on the basis of respective state variable values).

To conclude, the concept described here allows for a highly efficient determination of the interval size values on the basis of one or more state variable values.

In an embodiment, the arithmetic encoder is configured to determine the interval size value, such that the determined interval size value ($R_{LPS}$) is a right-shifted version of an element of the base-lookup table if the probability index is within the second range.

This concept is based on the idea that a right-shifting operation is computationally very efficient, and also provides for reliable interval size values if the probability index is within the second range (while, advantageously, no shift operation is applied to elements of the base lookup table if the probability index is within the first range). Consequently, interval size values provided for "corresponding" probability indices within the first range and within the second range mainly differ by a bit-shifting (except for a possible rounding). This is typically true over a range of probability index values, or even over the complete "first range" (which typically comprises more than two different values). Furthermore, it should be noted that the right-shift operation typically corresponds to a division by a potency of two.

In an embodiment, the probability index ($Qp2(p_{LPS})$) determines whether an element of the lookup table is provided as the interval size value ($R_{LPS}$), or whether an element of the lookup table is scaled and rounded to obtain the interval size value ($R_{LPS}$).

Since the probability index (or, more specifically, the question whether the probability index is within the first range or within the second range) decides whether a scaling (and optionally a rounding) is applied to obtain the interval size value on the basis of an element of the lookup table (base lookup table), the algorithm can be kept very simple. For example, the check whether the probability index lies within the first range or within the second range can easily be performed by a division of the probability index by a predetermined value, or by a comparison of the probability index with one or more threshold values. Accordingly, it can easily be decided, on the basis of the probability index, whether the scaling (and the optional rounding) should be performed or not. Thus, the concept for the derivation of the interval size value is very efficient.

In an embodiment of the arithmetic encoder, a division residual ($i \% \mu$) of a division between the probability index (i) and a first size value (e.g. $\mu$; wherein the size value, for example, describes an extension of the base lookup table in a first direction) and an interval size index (which may, for example, be obtained on the basis on an interval size information or total interval size information R, for example using a quantization operation $Qr2(\bullet)$) determine which element of the base lookup table is used to obtain the interval size value.

By selecting an entry of the base lookup table in dependence on the division residual and also in dependence on the interval size index, a two dimensional base lookup table can easily be evaluated, wherein the elements of the two dimensional base lookup table may incorporate a multiplication with an interval size value (which may be represented by the interval size index). Thus, it is possible to save a multiplication with an interval size value by having a two dimension base lookup table (wherein the division residual may be used as a first table index and wherein the interval size index may serve as a second table index). Furthermore, usage of the division residual as the first table index is well-adapted to the fact that elements of the base lookup table are selected cyclically with increasing probability index (because subsequent ranges of the probability index select a common range of the base lookup table). To conclude, the above-mentioned implementation allows for a very simple access of an element of the base lookup table and helps to avoid a multiplication with an interval size value due to the two-dimensional nature of the base lookup table.

In an embodiment, the arithmetic encoder is configured to obtain the interval size value $R_{XPS}$ (e.g. $R_{LPS}$) according to $$R_{XPS} = Scal(BaseTabLPS[i \% \mu][j], \lfloor i/\mu \rfloor)$$

wherein BaseTabLPS is a base lookup table of dimension $\mu \times \lambda$; wherein i is a table index associated with a probability information; wherein j is a table index associated with an interval size information (e.g. the total interval size information R); wherein $\%$ is a division residual operation; wherein / is a division operation; wherein Scal (x,y) is a scaling function (for example, defined as Scal $(x,y) = \lfloor x*a^{-}_{by} \rfloor$, wherein $\lfloor \bullet \rfloor$ is a floor operation, wherein a is advantageously a constant larger than or equal to 2, and wherein b is advantageously a constant larger than or equal to 1, and wherein the scaling function may be implemented using a shift-to-the-right bit shift operation, wherein y determines whether and by how many bits a shift-to-the-right of x is performed).

It has been found that such a concept for the determination of the interval size value, which constitutes the interval size information, is highly computationally efficient and allows for the usage of a comparatively small base lookup table. In particular, multiplication operations can be avoided. Furthermore, the divisional residual operation and the division operation may also be implemented in a very computationally efficient manner, for example, if the dimension $\mu$ is a potency of 2. Thus, the described concept for the derivation of the interval size value allows for a computationally very efficient implementation.

In an embodiment, the arithmetic encoder is configured to derive an interval size value ($R_{LPS}$) for an arithmetic encoding of one or more symbol values to be encoded on the basis of one or more state variable values ($s_i^k$) (which are, for example, associated with a given context mode, indicated by index k), which represent statistics of a plurality of previously encoded symbol values (e.g. a sequence of binary values 0 and 1) (e.g. with different adaptation time constants); wherein the arithmetic encoder is configured to determine the interval size value ($R_{LPS}$) using a probability table (Prob TabLPS), (a dimension of which in terms of probability indices is smaller than a number of possible probability indices i) on the basis of a (current) probability value derived from the one or more state variable values and on the basis of a (current) coding interval size (R), wherein the probability table describes interval sizes (interval size values) for a set of a plurality of probability values (for example, for probability indices between 0 and $\mu-1$) and for a (single) given (reference) coding interval size, and wherein the arithmetic encoder is configured to scale an element of the probability table (Prob_TabLPS) (for example, an element selected in dependence on the current probability value), to obtain the interval size value[$R_{LPS}$] if a current probability value is not in the set of a plurality of probability values (for example, is a probability index associated with the current probability value is larger than or equal to $\mu$) and/or if a current coding interval size (R) is different from the given (reference) coding interval size; and wherein the arithmetic encoder is configured to perform the arithmetic encoding of one or more symbols using the interval size value ($R_{LPS}$).

This concept is based on the idea that interval size values associated with different (non-overlapping) ranges of probability values (or probability indexes) are substantially (except for possible rounding effect) related by a scaling operation. It should also be noted that the scaling operation may, for example, be implemented in a computationally efficient manner, for example, using bit-shift operations, if the size of the lookup table (probability table) is chosen appropriately. Consequently, it is possible to derive the interval size value, which is used for the arithmetic coding (encoding or decoding) with small computational effort and also using only a small-size lookup table, which saves memory.

In an embodiment, the arithmetic encoder is configured to obtain an interval size value using a (multiplicative) first scaling of a selected element (probTabLPS[i %μ]) of the probability table in dependence on the (current) coding interval size (R), and using a second scaling of a result of the first scaling in dependence on whether an element associated with a current probability value (designated by index i) is included in the set of a plurality of probability values or not (e.g. in dependence on whether the current probability value lies within a range of probability values covered by the probability table or not).

By using a two-step multiplication or scaling, to obtain the interval size information, allows the usage of a small probability table. For example, the probability table may only "directly" cover a single coding interval size and a given, comparatively small range of probability values (which may be represented by the "set of a plurality of probability values"). Accordingly, for any other coding interval sizes, and for any probability values which are not included in the set of a plurality of probability values which are "directly" covered by the probability table, a scaling is performed, such that meaningful and reliable interval size values are obtained.

In an embodiment of the arithmetic encoder, a division residual (i %μ) of a division between a probability index (e.g. i; e.g. representing the current probability value) and a first size value (e.g. μ; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor ($2-\lfloor i/\mu \rfloor$) used in the second scaling; and/or wherein the coding interval size (R) determines a multiplicative scaling factor (Qr2(R)) of the first scaling.

Using a division residual to determine which element of the probability is scaled helps to exploit the fact that entries of the probability table are periodically reused with increasing probability index (e.g., in a cyclic manner). Usage of a division residual expresses this fact. Also, a division residual can, in some circumstances, be computed with very high computational efficiency, particularly if the division is made by a potency of two.

Moreover, by determining the scaling factor on the basis of the integer division result allows to easily allocate scaling factors to different (adjacent) ranges of probability index values. Furthermore, the integer division result can, under some circumstances, be computed in a computationally highly efficient manner, in particular, if the division is made by a potency of two.

Moreover, determining a multiplicative scaling factor in dependence on the coding interval size reflects the fact that the interval size value scales with the coding interval size. Accordingly, the interval size value can be obtained with high efficiency and accuracy.

In an embodiment, the arithmetic encoder is configured to obtain the interval size value $R_{XPS}$ (e.g. $R_{LPS}$) according to $$R_{XPS} = Scal(\lfloor probTabLPS[i \% \mu] \cdot Qr_2(R) \rfloor, \lfloor i/\mu \rfloor)$$

wherein i is a table index associated with a probability information; wherein j is a table index associated with an interval size information; wherein % is a division residual operation; wherein / is a division operation; wherein probTabLPS[ ] is the probability table; wherein μ is a number of elements of the probability table (wherein a range of values of i is typically larger than μ); wherein R is an interval size (e.g. a current coding interval size); wherein $Qr_2(R)$ is a scaling factor which is dependent on R; wherein Scal (x,y) is a scaling function (for example, defined as Scal $(x,y)=\lfloor x*a^{-by} \rfloor$, wherein $\lfloor \cdot \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

Such an algorithm for the determination of the interval size value has been found to be computationally efficient and to provide good quality results. The probability table can be comparatively small, and the scaling function can be implemented in a computationally efficient manner, for example, using one or more bit shift operations.

In an embodiment, the arithmetic encoder is configured to obtain an interval size value using a (multiplicative) first scaling of a selected element (probTabLPS[i %μ]) of the probability table in dependence on whether an element associated with a current probability value (designated by index i) is included in the probability value or not (e.g. in dependence on whether the current probability value lies within a range of probability values covered by the probability table or not), and using a second scaling of a result of the first scaling in dependence on the coding interval size (R).

In this concept, a processing order of the first scaling and of the second scaling is reversed when compared to the above-mentioned concept. However, the fundamental considerations remain the same.

In an embodiment, a division residual (i %μ) of a division between a probability index (e.g. i; e.g. representing the current probability value) and a first size value (e.g. μ; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor (e.g. $2-\lfloor i/\mu \rfloor$ or $a-b\lfloor i/\mu \rfloor$) used in the first scaling; and/or wherein the (current) coding interval size (R) determines a multiplicative scaling factor (Qr2(R)) of the second scaling.

In this concept, the order of the first scaling and of the second scaling is reversed when compared to the above-mentioned concept. However, the fundamental considerations remain unchanged.

In an embodiment, the arithmetic encoder is configured to obtain the interval size value $R_{XPS}$. (e.g. $R_{LPS}$) according to $$R_{XPS} = \lfloor Scal(probTabLPS[i \% \mu], \lfloor i/\mu \rfloor) \cdot Qr_2(R) \rfloor$$

wherein i is a table index associated with a probability information; wherein j is a table index associated with an (current) interval size information; wherein % is a division residual operation; wherein / is a division operation (e.g. providing an integer result); wherein probTabLPS[ ] is the probability table; wherein $\mu$ is a number of elements of the probability table (wherein a range of values of i is typically larger than $\mu$); wherein R is an interval size (e.g. a current coding interval size); wherein $Qr_2(R)$ is a scaling factor which is dependent on R; wherein Scal (x,y) is a scaling function (for example, defined as Scal $(x,y)=\lfloor x*a^{-by}\rfloor$, wherein $\lfloor \bullet \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

In this concept, the scaling order of the first scaling and of the second scaling is reversed when compared to the above-mentioned implementation. However, the fundamental underlying ideas remain unchanged.

In the following, a number of embodiments will be described which are related to an arithmetic decoding. However, the ideas, considerations and details underlying these ideas, which are related to an arithmetic decoding, are substantially identical to the ideas, considerations and details underlying concepts for arithmetic encoding. Accordingly, the above explanations also apply in an analogous manner. However, symbol values to be encoded correspond to symbol values to be decoded or to previously decoded symbols, and previously encoded symbol values correspond to previously decoded symbol values. Moreover, a correspondence between encoding features and decoding features is apparent for the person skilled in the art and also apparent from a comparison of the claim wording.

An embodiment according to the invention creates an arithmetic decoder for decoding a plurality of symbols having symbol values (e.g. binary values), wherein the arithmetic decoder is configured to derive an interval size value $(R_{LPS})$ for an arithmetic decoding of one or more symbol values to be decoded on the basis of one or more state variable values $(s_i^k)$ (which are, for example, associated with a given context mode, indicated by index k), which represent statistics of a plurality of previously decoded symbol values (e.g. a sequence of binary values 0 and 1) (e.g. with different adaptation time constants), wherein the arithmetic decoder is configured to determine the interval size value $(R_{LPS})$ using a base lookup table (Base TabLPS), (a dimension of which in terms of probability indices is smaller than a number of possible probability indices i), wherein the arithmetic decoder is configured to determine the interval size value $(R_{LPS})$ such that a determined interval size value is identical to an element of the base lookup table or is a rounded version of an element of the base lookup table if a probability index (i), which is obtained on the basis of the one or more state variable values (for example, as i=$Qp(p_{LPS})$), is within a first range (e.g. smaller than $\mu$), and such that a determined interval size value is obtained using a scaling and rounding of an element of the base lookup table if the probability index is within a second range (e.g. larger than or equal to $\mu$); and wherein the arithmetic decoder is configured to perform the arithmetic decoding of one or more symbols using the interval size value $(R_{LPS})$.

In an embodiment, the arithmetic decoder is configured to determine the interval size value, such that the determined interval size value $(R_{LPS})$ is a right-shifted version of an element of the base-lookup table if the probability index is within the second range.

In an embodiment of the arithmetic decoder, the probability index $(Qp2(p_{LPS}))$ determines whether an element of the lookup table is provided as the interval size value $(R_{LPS})$, or whether an element of the lookup table is scaled and rounded to obtain the interval size value $(R_{LPS})$.

In an embodiment of the arithmetic decoder, a division residual (i %$\mu$) of a division between the probability index (i) and a first size value (e.g. $\mu$; wherein the size value, for example, describes an extension of the base lookup table in a first direction) and an interval size index (which may, for example, be obtained on the basis on an interval size information or total interval size information R, for example using a quantization operation Qr2($\bullet$)) determine which element of the base lookup table is used to obtain the interval size value.

In an embodiment, the arithmetic decoder is configured to obtain the interval size value $R_{XPS}$ (e.g. $R_{LPS}$) according to $$R_{XPS} = Scal(BaseTabLPS[i \% \mu][j], \lfloor i/\mu \rfloor)$$

wherein BaseTabLPS is a base lookup table of dimension $\mu \times \lambda$; wherein i is a table index associated with a probability information; wherein j is a table index associated with an interval size information (e.g. the total interval size information R); wherein % is a division residual operation; wherein / is a division operation; wherein Scal (x,y) is a scaling function (for example, defined as Scal $(x,y)= \lfloor x*a^{-by}\rfloor$, wherein $\lfloor \bullet \rfloor$ is a floor operation, wherein a is advantageously a constant larger than or equal to 2, and wherein b is advantageously a constant larger than or equal to 1, and wherein the scaling function is preferable implemented using a shift-to-the-right bit shift operation, wherein y determines whether and by how many bits a shift-to-the-right of x is performed).

An embodiment according to the invention creates an arithmetic decoder for decoding a plurality of symbols having symbol values (e.g. binary values), wherein the arithmetic decoder is configured to derive an interval size value $(R_{LPS})$ for an arithmetic decoding of one or more symbol values to be decoded on the basis of one or more state variable values $(s_i^k)$ (which are, for example, associated with a given context mode, indicated by index k), which represent statistics of a plurality of previously decoded symbol values (e.g. a sequence of binary values 0 and 1) (e.g. with different adaptation time constants); wherein the arithmetic decoder is configured to determine the interval size value $(R_{LPS})$ using a probability table (Prob TabLPS), (a dimension of which in terms of probability indices is smaller than a number of possible probability indices i) on the basis of a (current) probability value derived from the one or more state variable values and on the basis of a (current) coding interval size (R), wherein the probability table describes interval sizes (interval size values) for a set of a plurality of probability values (for example, for probability indices between 0 and $\mu-1$) and for a (single) given (reference) coding interval size, and wherein the arithmetic decoder is configured to scale an element of the probability table (Prob_TabLPS) (for example, an element selected in dependence on the current probability value), to obtain the interval size value[$R_{LPS}$) if a current probability value is not in the set of a plurality of probability values (for example, is a probability index associated with the current probability value is larger than or equal to μ) and/or if a current coding interval size (R) is different from the given (reference) coding interval size; and wherein the arithmetic decoder is configured to perform the arithmetic decoding of one or more symbols using the interval size value ($R_{LPS}$).

In an embodiment, the arithmetic decoder is configured to obtain an interval size value using a (multiplicative) first scaling of a selected element (probTabLPS[i %μ]) of the probability table in dependence on the (current) coding interval size (R), and using a second scaling of a result of the first scaling in dependence on whether an element associated with a current probability value (designated by index i) is included in the set of a plurality of probability values or not (e.g. in dependence on whether the current probability value lies within a range of probability values covered by the probability table or not).

In an embodiment of the arithmetic decoder, a division residual (i %μ) of a division between a probability index (e.g. i; e.g. representing the current probability value) and a first size value (e.g. μ; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor ($2^{-\lfloor i/\mu \rfloor}$) used in the second scaling; and/or wherein the coding interval size (R) determines a multiplicative scaling factor (Qr2(R)) of the first scaling.

In an embodiment, the arithmetic decoder is configured to obtain the interval size value $R_{XPS}$ (e.g. $R_{LPS}$) according to $$R_{XPS} = Scal(\lfloor probTabLPS[i \% \mu] \cdot Qr_2(R) \rfloor, \lfloor i/\mu \rfloor)$$

wherein i is a table index associated with a probability information; wherein j is a table index associated with an interval size information; wherein % is a division residual operation; wherein / is a division operation; wherein probTabLPS[ ] is the probability table; wherein μ is a number of elements of the probability table (wherein a range of values of i is typically larger than μ); wherein R is an interval size (e.g. a current coding interval size); wherein $Qr_2(R)$ is a scaling factor which is dependent on R; wherein Scal (x,y) is a scaling function (for example, defined as Scal (x,y)=$\lfloor x*a^{-by} \rfloor$, wherein $\lfloor \bullet \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

In an embodiment, the arithmetic decoder is configured to obtain an interval size value using a (multiplicative) first scaling of a selected element (probTabLPS[i %μ]) of the probability table in dependence on whether an element associated with a current probability value (designated by index i) is included in the probability value or not (e.g. in dependence on whether the current probability value lies within a range of probability values covered by the probability table or not), and using a second scaling of a result of the first scaling in dependence on the coding interval size (R).

In an embodiment of the arithmetic decoder, a division residual (i %μ) of a division between a probability index (e.g. i; e.g. representing the current probability value) and a first size value (e.g. μ; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor (e.g. $2^{-\lfloor i/\mu \rfloor}$ or $a^{-b\lfloor i/\mu \rfloor}$) used in the first scaling; and/or wherein the (current) coding interval size (R) determines a multiplicative scaling factor ($Qr_2(R)$) of the second scaling.

In an embodiment, the arithmetic decoder is configured to obtain the interval size value $R_{XPS}$ (e.g. $R_{LPS}$) according to $$R_{XPS} = \lfloor Scal(probTabLPS[i \% \mu], \lfloor i/\mu \rfloor) \cdot Qr_2(R) \rfloor$$

wherein i is a table index associated with a probability information; wherein j is a table index associated with an (current) interval size information; wherein % is a division residual operation;
wherein / is a division operation (e.g. providing an integer result); wherein probTabLPS[ ] is the probability table; wherein μ is a number of elements of the probability table (wherein a range of values of i is typically larger than μ); wherein R is an interval size (e.g. a current coding interval size); wherein $Qr_2(R)$ is a scaling factor which is dependent on R; wherein Scal (x,y) is a scaling function (for example, defined as Scal (x,y)=$\lfloor x*a^{-by} \rfloor$, wherein $\lfloor \bullet \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

In the following, some further embodiments which are related to an arithmetic encoding will be discussed.

An embodiment according to the invention creates an arithmetic encoder for encoding a plurality of symbols having symbol values (e.g. binary values), wherein the arithmetic encoder is configured to determine one state variable value ($s_k$), which represents a statistic of a plurality of previously encoded symbol values, and wherein the arithmetic encoder is configured to compute from the combined state variable value, or the scaled and/or rounded version ($\lfloor s^{k}*a^k \rfloor$) thereof, a subinterval width value ($R_{LPS}$) for an arithmetic encoding of a symbol value to be encoded by mapping the one state variable value ($s_k$), or a scaled and/or rounded version thereof ($\lfloor s^{k}*a^k \rfloor$; $\lfloor |s_k| \cdot a_k \rfloor$) using a one-dimensional look-up table (probTabLPS[Qp2( . . . )]) entries of which comprise probability values for different value intervals of a value domain for the combined state variable value, or the scaled and/or rounded version ($\lfloor s^{k}*a^k \rfloor$; $\lfloor |s_k| \cdot a^k \rfloor$) thereof, onto a probability value, and quantizing a coding interval size information (e.g. R) describing a size of a coding interval of the arithmetic encoding before the arithmetic encoding of the symbol value to be encoded onto a quantization level ($Qr_2(R)$); determine a product (either by look-up of precomputed products, or by multiplication) between the probability value and the quantization level, wherein the arithmetic encoder is configured to perform a state variable value update in dependence on the symbol value to be encoded.

This embodiment is based on the finding that a very simple, one dimensional lookup table can be used for the determination of a subinterval width value on the basis of a combined state variable value. The coding interval size is considered by the quantization of the coding interval size information, and by the determination of a product between the probability value and the quantization value (or quantization level). Accordingly, reliable results are obtained with moderate effort.

In an embodiment, the arithmetic encoder is configured to derive as the one state variable value ($s_k$) a combined state variable value (which may, for example, be a weighted sum of state variable values) one the basis of a plurality of state variable values ($s_i^k$) (e.g. a sequence of binary values 0 and 1) (for example, in the case of a plurality of state variable values, statistics with different adaptation time constants), which represent statistics of the plurality of previously encoded symbol values (e.g. a sequence of binary values 0 and 1) with different adaptation time constants.

It has been found that using a combined state variable value as the one state variable value brings along particularly good results. The consideration of different adaptation time constants allows for the consideration of both short time statistics and longtime statistics, which makes the subinterval width value particularly reliable.

In an embodiment, the arithmetic encoder is configured to determine a weighted sum of state variable values, in order to obtain the combined state variable value.

Such a computation of the combined state variable value allows for a consideration of the different impact of short term statistics and long term statistics onto the combined state variable value while keeping a computation effort reasonably small.

In an embodiment, the arithmetic encoder is configured to determine a sum of rounded values $$\left(\lfloor s_i^k \cdot d_i^k \rfloor\right),$$

which are obtained by rounding products of state variable values $$\left(s_i^k\right)$$

and associated weight values $$\left(d_i^k\right),$$

in order to obtain the combined state variable value ($s_k$).

Applying a rounding operation before the summation reduces the computational effort and also eliminates an impact of very small products of a state variable value and an associated weight value. Thus, a reliability is increased.

In an embodiment, the arithmetic encoder is configured to determine the combined state variable value $s_k$ according to $$s_k = \sum_{i=1}^{N} \lfloor s_i^k \cdot d_i^k \rfloor$$

wherein $s_2^k$ are state variable values, wherein N is a number of state variable values considered, wherein $\lfloor \cdot \rfloor$ is a floor operator, wherein $d_i^k$ are weighting values associated with the state variable values (for example, weighting factors that control the influence of the individual state variable values onto the combined state variable value) (wherein $d_i^k$ are advantageously integer-valued potencies of von 2, and wherein a ratio between two different $d_i^k$ is advantageously an integer-valued potency of 2) [wherein a ratio between two different $d_i^k$ is advantageously larger than or equal to 8).

It has been found that such a derivation of the combined state variable value is particularly advantageous. Reference is also made to the above explanation of the corresponding concept for the determination of the combined state variable value.

In an embodiment, the arithmetic encoder is configured to, in performing the state variable value update, update the plurality of state variable values $$s_i^k$$

according to $$s_i^k = \begin{cases} s_i^k + \lfloor A[z + \lfloor s_i^k \cdot m_i^k \rfloor] \cdot n_i^k \rfloor, \\ s_i^k - \lfloor A[z + \lfloor -s_i^k \cdot m_i^k \rfloor] \cdot n_i^k \rfloor, \end{cases}$$

If symbol to be encoded is 1.

If symbol to be encoded is 0.

wherein z is a predetermined (constant) offset value; wherein $$m_i^k$$

are one or more weighting values; wherein $$n_i^k$$

are one or more weighting values, wherein A is $$A[z + \hat{s}] = \text{offset} + \sum_{i=1}^{\hat{N}} \max(0, \hat{b}_i - \hat{s}) << \hat{a}_i$$

or deviates therefrom merely for one or more extreme values of its argument by zero setting or magnitude reduction to avoid the updated $$s_i^k$$

leaving a predetermined value range, (e.g. consider that $$s_i^k$$

has a value domain larger than $$s_i^k \cdot m_i^k;$$

that is, $$s_i^k$$

is quasi quantized onto $$s_i^k \cdot m_i^k;$$

for extreme values of $$s_i^k \cdot m_i^k, s_i^k$$

may be modified by an unamended A according to above formula to leave its value domain; to avoid this, the entries corresponding to these extreme values might be reduced or zeroed); where offset, $\hat{N}$, $\hat{b}_i$, and $\hat{a}_i$ are predetermined parameters (examples are set out above).

It has been found that such an update of the state variable values is particularly advantageous. Reference is also made to the above explanations with respect to this concept for the update of the state variables.

In an embodiment, the arithmetic encoder is configured to derive $$A\left[z + \left\lfloor s_i^k \cdot m_i^k \right\rfloor\right]$$

by table look-up or computationally.

Regarding this concept, reference is made to the above explanations.

In an embodiment, the arithmetic encoder is configured to determine one or more updated state variable values $$s_i^k$$

according to $$s_i^k = \begin{cases} s_i^k + \left\lfloor A\left[z + \left\lfloor s_i^k \cdot m_i^k \right\rfloor\right] \cdot n_i^k \right\rfloor, \\ s_i^k - \left\lfloor A\left[z - 1 - \left\lfloor s_i^k \cdot m_i^k \right\rfloor\right] \cdot n_i^k \right\rfloor, \end{cases}$$

If symbol to be encoded is 1.
If symbol to be encoded is 0.
wherein A is a lookup table (for example, comprising integer values), wherein z is a predetermined (constant) offset value; wherein $$m_i^k$$

are one or more weighting values; wherein $$n_i^k$$

are one or more weighting values.

Regarding advantages of this concept for the update of one or more state variable values, reference is made to the above explanations.

In an embodiment, the arithmetic encoder is configured to determine one or more updated state variable values $$s_i^k$$

according to $$s_i^k = \begin{cases} s_i^k + \left\lfloor A\left[z + \left\lfloor s_i^k \cdot m_i^k \right\rfloor\right] \cdot n_i^k \right\rfloor, & \text{If symbol to be encoded is 1.} \\ s_i^k + \left\lfloor -A\left[z + \left\lfloor -s_i^k \cdot m_i^k \right\rfloor\right] \cdot n_i^k \right\rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

Regarding advantages of this concept for the update of the one or more state variable values, reference is made to the above explanations.

In an embodiment, the arithmetic encoder is configured to determine one or more updated state variable values $$s_i^k$$

according to $$s_i^k = \begin{cases} s_i^k + \left\lfloor A\left[z + \left\lfloor s_i^k \cdot m_i^k \right\rfloor\right] \cdot n_i^k \right\rfloor, & \text{If symbol to be encoded is 1.} \\ s_i^k + \left\lfloor -A\left[z - 1 - \left\lfloor s_i^k \cdot m_i^k \right\rfloor\right] \cdot n_i^k \right\rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

Regarding advantages of this concept for the update of one or more state variable values, reference is made to the above explanations.

In an embodiment, the arithmetic encoder is configured to perform the quantizing the coding interval size information by applying a logical right shift onto the coding interval size information.

A logical right shift of the coding interval size information is computationally highly efficient.

In an embodiment, the arithmetic encoder is configured to perform the quantizing the coding interval size information R by $Qr_2(R)=(\lfloor R \cdot 2^{-u} \rfloor + v) \cdot 2^{-w}$, where u, v and w are parameters.

Regarding advantages of this quantization of the coding interval size information, reference is made to the above discussion.

In an embodiment of the arithmetic encoder, the entries of the one-dimensional look-up table monotonically decrease at an increase of the one state variable value, or the scaled and/or rounded version ($\lfloor s^k * a^k \rfloor$) thereof.

Regarding advantages of this structure of the one-dimensional lookup table, reference is made to the above discussion.

In an embodiment of the arithmetic encoder, different value intervals of the value domain for the one state variable value, or the scaled and/or rounded version ($\lfloor s^k * a^k \rfloor$) thereof, are equally sized.

Regarding advantages of this concept, reference is made to the above discussion.

In an embodiment of the arithmetic encoder, the entries of the one-dimensional look-up table monotonically decrease with decreasing rate at an increase of the one state variable value, or the scaled and/or rounded version ($\lfloor s^k * a^k \rfloor$) thereof.

Regarding advantages of this concept, reference is made to the above discussion.

In the following, concepts for an arithmetic decoding will be described which correspond to the above-discussed concepts for the arithmetic encoding. Accordingly, the same explanations also apply, and the same details described above can optionally be used. However, it should be noted that an arithmetic encoder corresponds to an arithmetic decoder. Moreover, previously encoded symbol values typically correspond to previously decoded symbol values, and symbol values to be encoded may typically correspond to previously decoded symbol values (or to symbol values to be decoded). However, regarding the correspondence of features, reference is also made to a comparison on the corresponding claims defining related (or corresponding) concepts.

An embodiment according to the invention creates an arithmetic decoder for decoding a plurality of symbols having symbol values (e.g. binary values), wherein the arithmetic decoder is configured to derive an interval size information ($p^k$, $R*p^k$) for an arithmetic decoding of one or more symbol values to be decoded on the basis of a plurality of state variable values ($s_i^k$) (which are, for example, associated with a given context model, indicated by index k), which represent statistics of a plurality of previously decoded symbol values (e.g. a sequence of binary values 0 and 1) [for example, an estimate of a probabilities that one or more symbols to be decoded comprises certain symbol values) with different adaptation time constants, wherein the arithmetic decoder is configured to map a first state variable value ($s_1^k$), or a scaled and/or rounded version ($\lfloor s_1^k * a_1^k \rfloor$) thereof, using a lookup-table (LUT1) and to map a second state variable value ($s_2^k$), or a scaled and/or rounded version ($\lfloor s_2^k * a_2^k \rfloor$) thereof using the lookup-table (LUT1), in order to obtain the interval size information (e.g. $p_k$ or $R*p_k$) describing an interval size for the arithmetic decoding of one or more symbols to be decoded.

In an embodiment, the arithmetic decoder is configured to map the first state variable value, or the scaled and/or rounded version ($\lfloor s_1^k * a_1^k \rfloor$) thereof, onto a first probability value ($p_k^1$) using the look-up table, and wherein the arithmetic decoder is configured to map the second state variable value, or the scaled and/or rounded version ($\lfloor s_2^k * a_2^k \rfloor$) thereof, onto a second probability value ($p_k^2$) using the look-up table, and wherein the arithmetic decoder is configured to obtain a combined probability value (pk) using the first probability value and the second probability value (for example, using a weighted summation or using a weighted averaging).

In an embodiment, the arithmetic decoder is configured to change the state variable value into a first direction (e.g. to become more positive) if a decoded symbol takes a first value (e.g. "1"), and to change the state variable value into a second direction (e.g. to become more negative) if a decoded symbol takes a second value (e.g. "0") which is different from the first value (for example, such that the state variable value can take positive and negative values), wherein the arithmetic decoder is configured to determine an entry of the lookup-table to be evaluated in dependence on an absolute value ($s_k^i$ if $s_k^i > 0$, $-s_k^i$ otherwise) of a respective state variable value (e.g in dependence on a scaled and rounded version of an absolute value of the state variable value).

In an embodiment, the arithmetic decoder is configured to set a first probability value ($p_1^k$) to a value provided by the lookup table (e.g. to $$LUT1[\lfloor s_i^k \cdot a_i^k \rfloor])$$

if the first state variable value takes a first sign (e.g. a positive sign), and wherein the arithmetic decoder is configured to set the first probability value ($p_1^k$) to a value obtained by subtracting a value provided by the lookup table (e.g. to $$1 - LUT1[\lfloor s_i^k \cdot a_i^k \rfloor])$$

from a predetermined value (e.g. 1) if the first state variable value takes a second sign (e.g. a negative sign).

In an embodiment, the arithmetic decoder is configured to determine two or more probability values $p_i^k$ according to $$p_i^k = \begin{cases} LUT1[\lfloor s_i^k \cdot a_i^k \rfloor], & \text{if } s_i^k \geq 0. \\ 1 - LUT1[\lfloor -s_i^k \cdot a_i^k \rfloor], & \text{else.} \end{cases}$$

wherein LUT1 is a lookup-table containing probability values; wherein $\lfloor \bullet \rfloor$ is a floor operator; wherein $s_i^k$ is an i-th state variable value; and wherein $a_i^k$ is a weighting value associated with the i-th state variable value (for example, a weighting value that adapts a number range of the i-th state variable value to a number of entries of the lookup-table).

In an embodiment, the arithmetic decoder is configured to determine two or more probability values $p_i^k$ according to $$p_i^k = \begin{cases} LUT1[\lfloor s_i^k \cdot a_i^k \rfloor], & \text{if } \lfloor s_i^k \cdot a_i^k \rfloor \geq 0. \\ 1 - LUT1[-\lfloor s_i^k \cdot a_i^k \rfloor], & \text{else} \end{cases}$$

wherein LUT1 is a lookup-table containing probability values; wherein $\lfloor \cdot \rfloor$ is a floor operator; wherein $s^k_i$ is an i-th state variable value; and wherein $a^k_i$ is a weighting value associated with the i-th state variable value (for example, a weighting value that adapts a number range of the i-th state variable value to a number of entries of the lookup-table).

In an embodiment, the arithmetic decoder is configured to obtain a combined probability value $p^k$ on the basis of a plurality of probability values $p^k_i$ according to $$p_k = \sum_{i=1}^{N} p_i^k \cdot b_i^k$$

wherein N is a number of probability values considered (and may be equal to a number of state variable values considered); and wherein $b^k_i$ is a weighting value (for example, a weighting factor that controls an influence of individual state variable values onto the combined probability value) [wherein $b^k_i$ are advantageously integer-valued potencies of von 2, and wherein a ratio between two different $b^k_i$ is advantageously an integer-valued potency of 2)

In an embodiment, the arithmetic decoder is configured to map the first state variable value, or the scaled and/or rounded version $(\lfloor s^k_1 {*} a^k_1 \rfloor)$ thereof, onto a first subinterval width value $(R{*}p_k^{1})$ using a two-dimensional look-up table, entries of which are addressed in dependence on the first state variable value (e.g. to determine a first lookup table entry coordinate) and in dependence on a coding interval size information (e.g. R) describing a size of a coding interval of the arithmetic decoding before a decoding of a symbol (e.g. to determine a second lookup table entry coordinate), wherein the arithmetic decoder is configured to map the second state variable value, or the scaled and/or rounded version $(\lfloor s^k_1 {*} a^k_1 \rfloor)$ thereof, onto a second subinterval width value $(R{*}p^k_2)$ using the two-dimensional look-up table, entries of which are addressed in dependence on the second state variable value (e.g. to determine a first lookup table entry coordinate) and in dependence on a coding interval size information (e.g. R) describing a size of a coding interval of the arithmetic decoding before a decoding of a symbol (e.g. to determine a second lookup table entry coordinate); wherein the arithmetic decoder is configured to obtain a combined subinterval width value using the first subinterval width value and the second subinterval width value (for example, using a weighted summation or using a weighted averaging).

In an embodiment of the arithmetic decoder, the two-dimensional look-up table is representable as a dyadic product between a first one-dimensional vector (forming a one-dimensional look-up table) entries of which comprise probability values for different value intervals of a value domain for the first and second state variable values, or the scaled and/or rounded version $(\lfloor s^k {*} a^k \rfloor; |s_k| \cdot a_k)$ thereof, and a second one-dimensional vector $(Qr_2(R))$ entries of which comprise quantization levels for the coding interval size information.

In an embodiment of the arithmetic decoder, elements of the two-dimensional lookup-table (RangTabLPS) are defined on the basis of a base lookup table (Base TabLPS), wherein a first group (or block; e.g. an "upper half") of the elements of the two-dimensional lookup-table are identical to elements of the base lookup-table or are rounded versions of elements of the base lookup table, and wherein a second group, (or block; e.g. a "lower half") of the elements of the two-dimensional lookup-table are scaled and rounded versions of elements of the base lookup-table.

In an embodiment of the arithmetic decoder, the second group of elements of the two-dimensional lookup-table are right-shifted versions of elements of the base-lookup table.

In an embodiment of the arithmetic decoder, a probability index $(Qp_2(p_{LPS})$ or i) determines whether an element of the first group of elements of the two-dimensional lookup table or an element of a second group of elements of the two-dimensional lookup table is evaluated, wherein a first range (for example, between 0 and $\mu-1$) of probability indices (which are, for example, obtained by quantizing a probability value, e.g. $p_{LPS}$) is associated with elements of the first group of elements, and wherein a second range (for example, larger than or equal to $\mu$) of probability indices (which are, for example, obtained by quantizing a probability value, e.g. $p_{LPS}$, e.g. using a quantization function $Qp2(\cdot)$) is associated with elements of the second group of elements.

In an embodiment of the arithmetic decoder, a division residual (i $\%\mu$) of a division between the probability index (i) and a first size value (e.g. $\mu$; wherein the size value, for example, describes an extension of the base lookup table in a first direction) and an interval size index (which may, for example, be obtained on the basis on an interval size information R, for example using a quantization operation $Qr2(\cdot)$; for example, j) determine which element of the base lookup table is used to obtain the element of two-dimensional lookup table.

In an embodiment, the arithmetic decoder is configured to obtain an element of the two-dimensional lookup-table (RangTabLPS) according to $$RangeTabLPS[i][j] = Scal(BaseTabLPS[i \% \mu][j], \lfloor i/\mu \rfloor)$$

wherein BaseTabLPS is a base lookup table of dimension $\mu{\times}\lambda$; wherein i is a table index associated with a probability information; wherein j is a table index associated with an interval size information (e.g. describing a current coding interval size); wherein $\%$ is a division residual operation; wherein / is a division operation; wherein Scal (x,y) is a scaling function (for example, defined as Scal (x,y)= $\lfloor x {*} a^{-by} \rfloor$, wherein $\lfloor \cdot \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

In an embodiment of the arithmetic decoder, elements of the two-dimensional lookup-table (RangTabLPS) are defined on the basis of a probability table (probTabLPS), wherein the probability table describes interval sizes for a set of a plurality of probability values (for example, represented by indices i) and for a given (reference) coding interval size, and wherein elements of the two-dimensional lookup-table for a probability value which is not in the set of a plurality of probability values and/or for a coding interval size which is different from the given coding interval size are derived from the probability table using a scaling.

In an embodiment of the arithmetic decoder, elements of the two-dimensional lookup-table are obtained using a (multiplicative) first scaling of a selected element (probTabLPS[i $\%\mu$]) of the probability table in dependence on the coding interval size (R), and using a second scaling of a result of the first scaling in dependence on whether an element associated with a current probability value (designated by index i) is included in the set of probability values or not (e.g. in dependence on whether the current probability value lies within a range of probability values covered by the probability table or not).

In an embodiment of the arithmetic decoder, a division residual (i %μ) of a division between a probability index (e.g. i; e.g. representing the current probability value) and a first size value (e.g. μ; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor ($2^{-\lfloor i/\mu \rfloor}$) used in the second scaling; and/or wherein the coding interval size determines a multiplicative scaling factor (Qr2(R)) of the first scaling.

In an embodiment, the arithmetic decoder is configured to obtain an element RangeTabLPS[i][j] of the two-dimensional lookup-table according to $$RangeTabLPS[i][j] = Scal(\lfloor probTabLPS[i \ \% \mu] \cdot Qr_2(R) \rfloor, \lfloor i/\mu \rfloor)$$

wherein i is a table index associated with a probability information; wherein j is a table index associated with an interval size information; wherein % is a division residual operation; wherein / is a division operation; wherein probTabLPS[ ] is the probability table; wherein μ is a number of elements of the probability table (wherein a range of values of I is typically larger than μ); wherein R is an interval size (or a current coding interval size); wherein Qr2(R) is a scaling factor which is dependent on R; wherein Scal (x,y) is a scaling function (for example, defined as Scal (x,y)=$\lfloor x*a^{-by} \rfloor$, wherein $\lfloor \bullet \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

In an embodiment of the arithmetic decoder, elements of the two-dimensional lookup-table are obtained using a (multiplicative) first scaling of a selected element (probTabLPS[i %μ]) of the probability table in dependence on whether an element associated with a current probability value (designated by index i) is included in the set of probability values or not (e.g. in dependence on whether the current probability value lies within a range of probability values covered by the probability table or not) and using a second scaling of a result of the first scaling in dependence on the coding interval size (R).

In an embodiment of the arithmetic decoder, a division residual ($\lfloor i \ \% \mu \rfloor$) of a division between a probability index (e.g. i; e.g. representing the current probability value) and a first size value (e.g. μ; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor ($2^{-\lfloor i/\mu \rfloor}$) used in the first scaling; and/or wherein the coding interval size (R) determines a multiplicative scaling factor (Qr₂(R)) of the second scaling.

In an embodiment, the arithmetic decoder is configured to obtain an element RangeTabLPS[i][j] of the two-dimensional lookup-table according to $$RangeTabLPS[i][j] = \lfloor Scal(probTabLPS[i \ \% \mu], \lfloor i/\mu \rfloor) \cdot Qr_2(R) \rfloor$$

wherein i is a table index associated with a probability information; wherein j is a table index associated with an interval size information; wherein % is a division residual operation; wherein / is a division operation (e.g. providing an integer result); wherein probTabLPS[ ] is the probability table; wherein μ is a number of elements of the probability table (wherein a range of values of I is typically larger than μ); wherein R is an interval size; wherein Qr₂(R) is a scaling factor which is dependent on R; wherein Scal (x,y) is a scaling function (for example, defined as Scal (x,y)=$\lfloor x*a^{-by} \rfloor$, wherein $\lfloor \bullet \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

In an embodiment, the arithmetic decoder is configured to compute from the first and second state variable values, or the scaled and/or rounded version ($\lfloor s^k*a^k \rfloor$) thereof, first and second subinterval width values (R*p^k), respectively, by mapping the first and second state variable values (s_k), or a scaled and/or rounded version thereof ($\lfloor s^k_2*a^k_2 \rfloor$) using a one-dimensional look-up table (LUT4) entries of which comprise probability values for different value intervals of a value domain for the first and second state variable values, or the scaled and/or rounded version ($\lfloor s^k*a^k \rfloor$) thereof, onto a first and second probability value, and quantizing a coding interval size information (e.g. R) describing a size of a coding interval of the arithmetic encoding before an encoding of a symbol onto a quantization level; determine products (either by look-up of precomputed products, or by multiplication) between the first and second probability value, on the one hand, and the quantization level, and obtaining a combined subinterval width value using the first subinterval width value and the second subinterval width value (for example, using a weighted summation or using a weighted averaging).

In an embodiment, the arithmetic decoder is configured to perform the quantizing the coding interval size information by applying a logical right shift onto the coding interval size information.

In an embodiment, the arithmetic decoder is configured to perform the quantizing the coding interval size information R by Qr₂(R)=($\lfloor R \cdot 2^{-u} \rfloor$+v)·$2^{-w}$, where u, v and w are parameters.

In an embodiment of the arithmetic decoder, the entries of the one-dimensional look-up table monotonically decrease at an increase of the first and second state variable values, or the scaled and/or rounded version ($\lfloor s^k*a^k \rfloor$) thereof.

In an embodiment of the arithmetic decoder, different value intervals of the value domain for the first and second state variable value, or the scaled and/or rounded version ($\lfloor s^k*a^k \rfloor$) thereof, are equally sized.

In an embodiment of the arithmetic decoder, the entries of the one-dimensional look-up table monotonically decrease with decreasing rate at an increase of the first and second state variable values, or the scaled and/or rounded version ($\lfloor s^k*a^k \rfloor$) thereof.

An embodiment according to the invention creates an arithmetic decoder for decoding a plurality of symbols having symbol values (e.g. binary values), wherein the arithmetic decoder is configured to derive an interval size information ($p^k$, $R*p^k$) for an arithmetic decoding of one or more symbol values to be decoded on the basis of a plurality of state variable values ($s_i^k$) (which are, for example, associated with a given context mode, indicated by index k), which represent statistics of a plurality of previously decoded symbol values (e.g. a sequence of binary values 0 and 1) (for example, an estimate of a probabilities that one or more symbols to be decoded comprises certain symbol values) with different adaptation time constants, wherein the arithmetic decoder is configured to derive a combined state variable value ($s_k$) (which may, for example, be a weighted sum of state variable values) one the basis of the plurality of (individual) state variable values ($s_i^k$), and wherein the arithmetic decoder is configured to map the combined state variable value ($s_k$), or a scaled and/or rounded version thereof ($\lfloor s_2^k * a_2^k \rfloor$) using a look-up table, in order to obtain the interval size information (e.g. $p_k$ or $R*p_k$) describing an interval size for the arithmetic decoding of one or more symbols to be decoded.

In an embodiment, the arithmetic decoder is configured to determine a weighted sum of state variable values, in order to obtain the combined state variable value.

In an embodiment, the arithmetic decoder is configured to determine a sum of rounded values $$\left(\lfloor s_i^k \cdot d_i^k \rfloor\right),$$

which are obtained by rounding products of state variable values $$\left(s_i^k\right)$$

and associated weight values $$\left(d_i^k\right),$$

in order to obtain the combined state variable value ($s_k$).

In an embodiment, the arithmetic decoder is configured to determine the combined state variable value $s_k$ according to $$s_k = \sum_{i=1}^{N} \lfloor s_i^k \cdot d_i^k \rfloor$$

wherein $s_2^k$ are state variable values, wherein N is a number of state variable values considered, wherein $\lfloor \bullet \rfloor$ is a floor operator, wherein $d_i^k$ are weighting values associated with the state variable values (for example, weighting factors that control the influence of the individual state variable values onto the combined state variable value) (wherein $d_i^k$ are advantageously integer-valued potencies of von 2, and wherein a ratio between two different $d_i^k$ is advantageously an integer-valued potency of 2)[wherein a ratio between two different $d_i^k$ is advantageously larger than or equal to 8).

In an embodiment, the arithmetic decoder is configured to change the state variable value into a first direction (e.g. to become more positive) if a decoded symbol takes a first value (e.g. "1"), and to change the state variable value into a second direction (e.g. to become more negative) if a decoded symbol takes a second value (e.g. "0") which is different from the first value (for example, such that the state variable value can take positive and negative values), and wherein the arithmetic decoder is configured to determine an entry of the lookup-table to be evaluated in dependence on an absolute value ($s_k$ if $s_k^i > 0$, $-s_k$ otherwise) of the combined state variable value (e.g in dependence on a scaled and rounded version of an absolute value of the combined state variable value).

In an embodiment, the arithmetic decoder is configured to set a probability value ($p^k$) to a value provided by the lookup table (e.g. to LUT2[$\lfloor s_k \cdot a_k \rfloor$]) if the combined state variable value takes a first sign (e.g. a positive sign), and wherein the arithmetic decoder is configured to set the probability value ($p^k$) to a value obtained by subtracting a value provided by the lookup table (e.g. to LUT2[$\lfloor -s_k \cdot a_k \rfloor$]) from a predetermined value (e.g. 1) if the combined state variable value takes a second sign (e.g. a negative sign).

In an embodiment, the arithmetic decoder is configured to determine a combined probability value $p_k$ according to $$p_k = \begin{cases} LUT2[\lfloor s_k \cdot a_k \rfloor], & \text{if } s_k \geq 0. \\ 1 - LUT2[\lfloor -s_k \cdot a_k \rfloor], & \text{else.} \end{cases}$$

wherein LUT2 is a lookup-table containing probability values; wherein $\lfloor \bullet \rfloor$ is a floor operator; wherein $s^k$ is a combined variable value; and wherein $a^k$ is a weighting value associated with the combined state variable value (for example, a weighting value that adapts a number range of the i-th state variable value to a number of entries of the lookup-table).

In an embodiment, the arithmetic decoder is configured to determine a combined probability value $p_k$ according to $$p_k = \begin{cases} LUT2[\lfloor s_k \cdot a_k \rfloor], & \text{if } \lfloor s_k \cdot a_k \rfloor \geq 0. \\ 1 - LUT2[-\lfloor s_k \cdot a_k \rfloor], & \text{else} \end{cases}$$

wherein LUT2 is a lookup-table containing probability values; wherein $\lfloor \bullet \rfloor$ is a floor operator; wherein $s^k$ is a combined variable value; and wherein $a^k$ is a weighting value associated with the combined state variable value (for example, a weighting value that adapts a number range of the i-th state variable value to a number of entries of the lookup-table).

In an embodiment, the arithmetic decoder is configured to map the combined state variable value, or the scaled and/or rounded version ($\lfloor s^k * a^k \rfloor$) thereof, onto a subinterval width value ($R*p^k$) using a two-dimensional look-up table, entries of which are addressed in dependence on the combined state variable value (e.g. to determine a first lookup table entry coordinate) and in dependence on a coding interval size information (e.g. R) describing a size of a coding interval of the arithmetic decoding before a decoding of a symbol (e.g. to determine a second lookup table entry coordinate).

In an embodiment of the arithmetic decoder, the two-dimensional look-up table is representable as a dyadic product between a first one-dimensional vector (LUT4[ . . . ]; forming a one-dimensional look-up table) entries of which comprise probability values for different value intervals of a value domain for the combined state variable value, or the scaled and/or rounded version ($\lfloor s^k * a^k \rfloor$;

$\lfloor |s_k| \cdot a_k \rfloor$) thereof, and a second one-dimensional vector ($Qr_2$ (R)) entries of which comprise quantization levels for the coding interval size information.

In an embodiment of the arithmetic decoder, elements of the two-dimensional lookup-table (RangTabLPS) are defined on the basis of a base lookup table (Base TabLPS), wherein a first group (or block; e.g. an "upper half") of the elements of the two-dimensional lookup-table are identical to elements of the base lookup-table or are rounded versions of elements of the base lookup table, and wherein a second group, (or block; e.g. a "lower half") of the elements of the two-dimensional lookup-table are scaled and rounded versions of elements of the base lookup-table.

In an embodiment of the arithmetic decoder, the second group of elements of the two-dimensional lookup-table are right-shifted versions of elements of the base-lookup table.

In an embodiment of the arithmetic decoder, a probability index ($Qp_2(p_{LPS})$ or i) determines whether an element of the first group of elements of the two-dimensional lookup table or an element of a second group of elements of the two-dimensional lookup table is evaluated, wherein a first range (for example, between 0 and $\mu-1$) of probability indices (which are, for example, obtained by quantizing a probability value, e.g. $p_{LPS}$) is associated with elements of the first group of elements, and wherein a second range (for example, larger than or equal to $\mu$) of probability indices (which are, for example, obtained by quantizing a probability value, e.g. $p_{LPS}$, e.g. using a quantization function $Qp2(\bullet)$) is associated with elements of the second group of elements.

In an embodiment of the arithmetic decoder, a division residual (i $\%\mu$) of a division between the probability index (i) and a first size value (e.g. $\mu$; wherein the size value, for example, describes an extension of the base lookup table in a first direction) and an interval size index (which may, for example, be obtained on the basis on an interval size information R, for example using a quantization operation $Qr2(\bullet)$; for example, j) determine which element of the base lookup table is used to obtain the element of two-dimensional lookup table.

In an embodiment, the arithmetic decoder is configured to obtain an element of the two-dimensional lookup-table (RangTabLPS) according to $$RangeTabLPS[i][j] = Scal(BaseTabLPS[i\ \%\mu][j], \lfloor i/\mu \rfloor)$$

wherein BaseTabLPS is a base lookup table of dimension $\mu\times\lambda$; wherein i is a table index associated with a probability information; wherein j is a table index associated with an interval size information (e.g. describing a current coding interval size); wherein % is a division residual operation; wherein / is a division operation; wherein Scal (x,y) is a scaling function (for example, defined as Scal (x,y)= $\lfloor x * a^{-by} \rfloor$, wherein $\lfloor \bullet \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

In an embodiment of the arithmetic decoder, elements of the two-dimensional lookup-table (RangTabLPS) are defined on the basis of a probability table (probTabLPS), wherein the probability table describes interval sizes for a set of a plurality of probability values (for example, represented by indices i) and for a given (reference) coding interval size, and wherein elements of the two-dimensional lookup-table for a probability value which is not in the set of a plurality of probability values and/or for a coding interval size which is different from the given coding interval size are derived from the probability table using a scaling.

In an embodiment of the arithmetic decoder, elements of the two-dimensional lookup-table are obtained using a (multiplicative) first scaling of a selected element (probTabLPS[i $\%\mu$]) of the probability table in dependence on the coding interval size (R), and using a second scaling of a result of the first scaling in dependence on whether an element associated with a current probability value (designated by index i) is included in the set of probability values or not (e.g. in dependence on whether the current probability value lies within a range of probability values covered by the probability table or not).

In an embodiment of the arithmetic decoder, a division residual (i $\%\mu$) of a division between a probability index (e.g. i; e.g. representing the current probability value) and a first size value (e.g. $\mu$; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor ($2^{-\lfloor i/\mu \rfloor}$) used in the second scaling; and/or wherein the coding interval size determines a multiplicative scaling factor ($Qr2(R)$) of the first scaling.

In an embodiment, the arithmetic decoder is configured to obtain an element RangeTabLPS[i][j] of the two-dimensional lookup-table according to $$RangeTabLPS[i][j] = Scal(\lfloor probTabLPS[i\ \%\mu] \cdot Qr_2(R)\rfloor, \lfloor i/\mu \rfloor)$$

wherein i is a table index associated with a probability information; wherein j is a table index associated with an interval size information; wherein % is a division residual operation; wherein / is a division operation; wherein probTabLPS[ ] is the probability table; wherein $\mu$ is a number of elements of the probability table (wherein a range of values of I is typically larger than $\mu$); wherein R is an interval size (or a current coding interval size); wherein Qr2(R) is a scaling factor which is dependent on R; wherein Scal (x,y) is a scaling function (for example, defined as Scal $(x,y)=\lfloor x * a^{-by} \rfloor$, wherein $\lfloor \bullet \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

In an embodiment of the arithmetic decoder, elements of the two-dimensional lookup-table are obtained using a (multiplicative) first scaling of a selected element (probTabLPS[i $\%\mu$]) of the probability table in dependence on whether an element associated with a current probability value (designated by index i) is included in the set of probability values or not (e.g. in dependence on whether the current probability value lies within a range of probability values covered by the probability table or not) and using a second scaling of a result of the first scaling in dependence on the coding interval size (R).

In an embodiment of the arithmetic decoder, a division residual ($\lfloor i\ \%\mu \rfloor$) of a division between a probability index (e.g. i; e.g. representing the current probability value) and a first size value (e.g. $\mu$; wherein the size value, for example, describes an extension of the probability table) determines which element of the probability table is scaled in the first scaling; and/or wherein an integer division result ($\lfloor i/\mu \rfloor$) of a division between the probability index (i) and the first size value determines a scaling factor ($2^{-\lfloor i/\mu \rfloor}$) used in the first scaling; and/or wherein the coding interval size (R) determines a multiplicative scaling factor ($Qr_2(R)$) of the second scaling.

In an embodiment, the arithmetic decoder is configured to obtain an element RangeTabLPS[i][j] of the two-dimensional lookup-table according to $$RangeTabLPS[i][j] = \lfloor Scal(probTabLPS[i \% \mu], \lfloor i/\mu \rfloor) \cdot Qr_2(R) \rfloor$$

wherein i is a table index associated with a probability information; wherein j is a table index associated with an interval size information; wherein % is a division residual operation; wherein / is a division operation (e.g. providing an integer result); wherein probTabLPS[ ] is the probability table; wherein $\mu$ is a number of elements of the probability table (wherein a range of values of I is typically larger than $\mu$); wherein R is an interval size; wherein $Qr_2(R)$ is a scaling factor which is dependent on R; wherein Scal (x,y) is a scaling function (for example, defined as Scal (x,y)= $\lfloor x*a^{-by} \rfloor$, wherein $\lfloor \bullet \rfloor$ is a floor operation, wherein a is advantageously a constant larger than or equal to 2, and wherein b is advantageously a constant larger than or equal to 1, and wherein the scaling function is advantageously implemented using a shift-to-the-right bit shift operation, wherein y determines whether and by how many bits a shift-to-the-right of x is performed).

In an embodiment, the arithmetic decoder is configured to compute from the combined state variable value, or the scaled and/or rounded version ($\lfloor s^k * a^k \rfloor$) thereof, a subinterval width value ($R*p^k$) by mapping the combined state variable value ($s_k$), or a scaled and/or rounded version thereof ($\lfloor s^k * a^k \rfloor$; $\lfloor |s_k| \cdot a_k \rfloor$) using a one-dimensional look-up table (LUT4) entries of which comprise probability values for different value intervals of a value domain for the combined state variable value, or the scaled and/or rounded version ($\lfloor s^k * a^k \rfloor$; $\lfloor |s_k| \cdot a_k \rfloor$) thereof, onto a combined probability value, and quantizing a coding interval size information (e.g. R) describing a size of a coding interval of the arithmetic encoding before an encoding of a symbol onto a quantization level; determine a product (either by look-up of precomputed products, or by multiplication) between the combined probability value and the quantization level.

In an embodiment, the arithmetic decoder is configured to perform the quantizing the coding interval size information by applying a logical right shift onto the coding interval size information.

In an embodiment, the arithmetic decoder is configured to perform the quantizing the coding interval size information R by $Qr_2(R) = (\lfloor R \cdot 2^{-\mu} \rfloor + v) \cdot 2^{-w}$, where u, v and w are parameters.

In an embodiment of the arithmetic decoder, the entries of the one-dimensional look-up table monotonically decrease at an increase of the combined state variable value, or the scaled and/or rounded version ($\lfloor s^k * a^k \rfloor$) thereof.

In an embodiment of the arithmetic decoder, different value intervals of the value domain for the combined state variable value, or the scaled and/or rounded version ($\lfloor s^k * a^k \rfloor$) thereof, are equally sized.

In an embodiment of the arithmetic decoder, the entries of the one-dimensional look-up table monotonically decrease with decreasing rate at an increase of the combined state variable value, or the scaled and/or rounded version ($\lfloor s^k * a^k \rfloor$) thereof.

In an embodiment of the arithmetic decoder, the lookup-table defines (for example, within a tolerance of $+/-10\%$ or $+/-20\%$) an exponential decay (e.g. down from 0.5).

In an embodiment, the arithmetic decoder is configured to update the plurality of variable state values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k - \lfloor A[z + \lfloor -s_i^k \cdot m_i^k \rfloor] \cdot n_i^k \rfloor, & \text{If symbol to be encoded is 0.} \end{cases}$$

wherein z is a predetermined (constant) offset value; wherein $$m_i^k$$

are one or more weighting values; wherein $$n_i^k$$

are one or more weighting values, wherein A is $$A[z + \hat{s}] = \text{offset} + \sum_{i=1}^{\hat{N}} \max(0, \hat{b}_i - \hat{s}) << \hat{a}_i$$

or deviates therefrom merely for one or more extreme values of its argument by zero setting or magnitude reduction to avoid the updated $$s_i^k$$

leaving a predetermined value range, (e.g. consider that $$s_i^k$$

has a value domain larger than $$s_i^k \cdot m_i^k;$$

that is, $$s_i^k$$

is quasi quantized onto $$s_i^k \cdot m_i^k;$$

for extreme values of $$s_i^k \cdot m_i^k, s_i^k$$

may be modified by an unamended A according to above formula to leave its value domain; to avoid this, the entries corresponding to these extreme values might be reduced or zeroed); where offset, $\hat{N}$, $\hat{b}_i$, and $\hat{a}_i$ are predetermined parameters (examples are set out above).

In an embodiment, the arithmetic decoder is configured to derive $$A[z + \lfloor s_i^k \cdot m_i^k \rfloor]$$

by table look-up or computationally.

An embodiment according to the invention creates an arithmetic decoder for decoding a plurality of symbols having symbol values (e.g. binary values), wherein the arithmetic decoder is configured to determine one or more state variable values ($s_1^k$, $s_2^k$), which represent statistics of a plurality of previously decoded symbol values (e.g. a sequence of binary values 0 and 1) (for example, an estimate of a probabilities that one or more symbols to be decoded comprises certain symbol values) (for example, in the case that a plurality of state variable values are determined, statistics with different adaptation time constants), and wherein the arithmetic decoder is configured to derive an interval size information ($p^k$, $R*p^k$) for an arithmetic decoding of one or more symbol values to be decoded on the basis of the one or more state variable values ($s_i^k$) (which are, for example, associated with a given context mode, indicated by index k), which represent statistics of a plurality of previously decoded symbol values (e.g. a sequence of binary values 0 and 1) (for example, in the case that a plurality of state variable values are determined, statistics with different adaptation time constants), wherein the arithmetic decoder is configured to update a first state variable value ($s_1^k$) in dependence on a decoded symbol and using a look-up table (A) (for example, after decoding the symbol to be decoded).

In an embodiment, the arithmetic decoder is configured to update a second state variable value ($s_2^k$) in dependence on a decoded symbol and using the look-up table (A) (for example, after decoding the symbol to be decoded).

In an embodiment, the arithmetic decoder is configured update the first state variable value and the second state variable values using different adaptation time constants.

In an embodiment, the arithmetic decoder is configured to selectively increase or decrease a previous state variable value by a value determined using the look-up table in dependence on whether a decoded symbol takes a first value or a second value which is different from the first value.

In an embodiment, the arithmetic decoder is configured to increase a previous state variable value by a comparatively larger value in case that the previous state variable value is negative when compared to a case that the previous state variable value is positive if a decoded symbol takes a first value; and wherein the arithmetic decoder is configured to decrease a previous state variable value by a comparatively larger value in case that the previous state variable value is positive when compared to a case that the previous state variable value is negative if a decoded symbol takes a second value which is different from the first value (which is reached, for example, by an appropriate choice of the lookup-table).

In an embodiment, the arithmetic decoder is configured to determine an index of an entry of the lookup table to be evaluated when updating the first state variable value in dependence on a sum of a predetermined (e.g. fixed) offset value (z) and a previously computed first state variable value $$(s_1^k),$$

or a scaled and/or rounded version $$(\lfloor s_1^k \cdot m_1^k \rfloor)$$

thereof, if a decoded symbol takes a first value; and wherein the arithmetic decoder is configured to determine an index of an entry of the lookup table to be evaluated when updating the first state variable value in dependence on a sum of a predetermined (e.g. fixed) offset value (z) and a in inversed (multiplied by −1) version $$(-s_1^k)$$

of a previously computed first state variable value, or a scaled and/or rounded version $$(\lfloor -s_1^k \cdot m_1^k \rfloor)$$

thereof (e.g. of the inversed version of the previously computed first state variable value), if a decoded symbol takes a second value.

In an embodiment, the arithmetic decoder is configured to determine an index of an entry of the lookup table to be evaluated when updating the second state variable value in dependence on a sum of a predetermined (e.g. fixed) offset value (z) and a previously computed second state variable value $$(s_2^k),$$

or a scaled and/or rounded version $$(\lfloor s_2^k \cdot m_2^k \rfloor)$$

thereof, if a decoded symbol takes a first value; and wherein the arithmetic decoder is configured to determine an index of an entry of the lookup table to be evaluated when updating the second state variable value in dependence on a sum of a predetermined (e.g. fixed) offset value (z) and a in inversed (multiplied by −1) version $$(-s_2^k)$$

of a previously computed second state variable value, or a scaled and/or rounded version $$(\lfloor -s_2^k \cdot m_2^k \rfloor)$$

thereof (e.g. of the inversed version of the previously computed second state variable value), if a decoded symbol takes a second value.

In an embodiment, the arithmetic decoder is configured to apply a first scaling value ($m_1^k$), to scale the previously computed first state variable value ($s_1^k$), when determining an index of an entry of the lookup table to be evaluated when updating the first state variable value, and wherein the arithmetic decoder is configured to apply a second scaling value ($m_2^k$), to scale the previously computed second state variable value ($s_2^k$), when determining an index of an entry of the lookup table to be evaluated when updating the second state variable value, wherein the first scaling value is different from the second scaling value (and wherein the first and the second scaling values are advantageously integer potencies of 2, and wherein a ratio between the first scaling value and the second scaling value is advantageously an integer potency if 2, and wherein the first scaling value and the second scaling value advantageously differ by a factor of at least 8).

In an embodiment, the arithmetic decoder is configured to scale a value returned by an evaluation of the lookup table using a first scaling value (e.g. $n_1^k$) when updating the first state variable value, wherein the arithmetic decoder is configured to scale a value returned by an evaluation of the lookup table using a second scaling value (e.g. $n_2^k$) when updating the second state variable value, wherein the first scaling value is different from the second scaling value.

In an embodiment, the arithmetic decoder is configured to determine one or more updated state variable values $$s_i^k$$

according to $$s_i^k = \begin{cases} s_i^k + \lfloor A[z + \lfloor s_i^k \cdot m_i^k \rfloor] \cdot n_i^k \rfloor, & \text{If decoded symbol is 1.} \\ s_i^k - \lfloor A[z + \lfloor -s_i^k \cdot m_i^k \rfloor] \cdot n_i^k \rfloor, & \text{If decoded symbol is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

In an embodiment, the arithmetic decoder is configured to determine one or more updated state variable values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k - \lfloor A[z - 1 - \lfloor s_i^k \cdot m_i^k \rfloor] \cdot n_i^k \rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

In an embodiment, the arithmetic decoder is configured to determine one or more updated state variable values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k + \lfloor -A[z + \lfloor -s_i^k \cdot m_i^k \rfloor] \cdot n_i^k \rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

In an embodiment, the arithmetic decoder is configured to determine one or more updated state variable values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k + \lfloor -A[z - 1 - \lfloor s_i^k \cdot m_i^k \rfloor] \cdot n_i^k \rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

In an embodiment of the arithmetic decoder, the entries of A decrease monotonically with increasing lookup table index.

In an embodiment of the arithmetic decoder, A is $$A[z + \hat{s}] = \text{offset} + \sum_{i=1}^{\hat{N}} \max(0, \hat{b}_i - \hat{s}) << \hat{a}_i$$

or deviates therefrom merely for one or more extreme values of its argument by zero setting or magnitude reduction to avoid the updated $$s_i^k$$

leaving a predetermined value range, (e.g. consider that $$s_i^k$$

has a value domain larger than $$s_i^k \cdot m_i^k;$$

that is, $$s_i^k$$

is quasi quantized onto $$s_i^k \cdot m_i^k;$$

for extreme values of $$s_i^k \cdot m_i^k, s_i^k$$

may be modified by an unamended A according to above formula to leave its value domain; to avoid this, the entries corresponding to these extreme values might be reduced or zeroed); where offset, $\hat{N}$, $\hat{b}_i$, and $\hat{a}_i$ are predetermined parameters (examples are set out above).

In an embodiment of the arithmetic decoder, a last entry of the lookup table (which is addressed when the first state variable value reaches a predetermined range of values which extends up to a maximum allowable value, or when the first state variable value exceeds a predetermined threshold value) is equal to zero.

In an embodiment, the arithmetic decoder is configured to apply a clipping operation to the updated state variable values, to keep the updated and clipped state variable values within a predetermined range of values.

In an embodiment, the arithmetic decoder is configured to apply a clipping operation according to $$s_i^k = \min(\max(s_i^k, h_i^k), g_i^k)$$

to the updated state variable values, wherein $$g_i^k$$

is a maximum allowed value for $$s_i^k,$$

and wherein $$h_i^k$$

is a minimum allowed value for $$s_i^k.$$

In an embodiment, the arithmetic decoder is configured to apply different scaling values for different context models (for example, such that at least one of the scaling values differs between two different context models).

In an embodiment, the arithmetic decoder is configured to obtain the interval size information as defined in one of the above embodiments.

An embodiment according to the invention creates an arithmetic decoder for decoding a plurality of symbols having symbol values (e.g. binary values), wherein the arithmetic decoder is configured to determine one state variable value ($s_k$), which represent a statistic of a plurality of previously decoded symbol values, and wherein the arithmetic decoder is configured to compute from the combined state variable value, or the scaled and/or rounded version ($\lfloor s^k * a^k \rfloor$) thereof, a subinterval width value ($R_{LPS}$) for an arithmetic decoding of a symbol value to be decoded by mapping the one state variable value ($s_k$), or a scaled and/or rounded version thereof ($\lfloor s^k * a^k \rfloor$; $\lfloor |s_k| \cdot a_k \rfloor$) using a one-dimensional look-up table (probTabLPS[Qp$_2$( . . . )]) entries of which comprise probability values for different value intervals of a value domain for the combined state variable value, or the scaled and/or rounded version ($\lfloor s^k * a^k \rfloor$; $\lfloor |s_k| \cdot a_k \rfloor$) thereof, onto a combined probability value, and quantizing a coding interval size information (e.g. R) describing a size of a coding interval of the arithmetic encoding before the arithmetic decoding of the symbol value to be encoded onto a quantization level ($Qr_2(R)$); determine a product (either by look-up of precomputed products, or by multiplication) between the probability value and the quantization level, wherein the arithmetic decoder is configured to perform a state variable value update in dependence on the symbol to be decoded (actually decoded).

In an embodiment, the arithmetic decoder is configured to derive as the one state variable value ($s_k$) a combined state variable value (which may, for example, be a weighted sum of state variable values) one the basis of a plurality of state variable values ($s_i^k$) (e.g. a sequence of binary values 0 and 1) (for example, in the case of a plurality of state variable values, statistics with different adaptation time constants), which represent statistics of the plurality of previously decoded symbol values (e.g. a sequence of binary values 0 and 1) with different adaptation time constants.

In an embodiment, the arithmetic decoder is configured to determine a weighted sum of state variable values, in order to obtain the combined state variable value.

In an embodiment, the arithmetic decoder is configured to determine a sum of rounded values $$(\lfloor s_i^k \cdot d_i^k \rfloor),$$

which are obtained by rounding products of state variable values $$(s_i^k)$$

and associated weight values $$(d_i^k),$$

in order to obtain the combined state variable value ($s_k$).

In an embodiment, the arithmetic decoder is configured to determine the combined state variable value $s_k$ according to $$s_k = \sum_{i=1}^{N} \lfloor s_i^k \cdot d_i^k \rfloor$$

wherein $s^k_2$ are state variable values, wherein N is a number of state variable values considered, wherein $\lfloor \cdot \rfloor$ is a floor operator, wherein $d^k_i$ are weighting values associated with the state variable values (for example, weighting factors that control the influence of the individual state variable values onto the combined state variable value) (wherein $d^k_i$ are advantageously integer-valued potencies of von 2, and wherein a ratio between two different $d^k_i$ is advantageously an integer-valued potency of 2)[wherein a ratio between two different $d^k_i$ is advantageously larger than or equal to 8).

In an embodiment, he arithmetic decoder is configured to, in performing the state variable value update, update the plurality of state variable values $$s_i^k$$

according to $$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k - \lfloor A[z + \lfloor -s_i^k \cdot m_i^k \rfloor] \cdot n_i^k \rfloor, & \text{If symbol to be encoded is 0.} \end{cases}$$

wherein z is a predetermined (constant) offset value; wherein $$m_i^k$$

are one or more weighting values; wherein $$n_i^k$$

are one or more weighting values, wherein A is $$A[z + \hat{s}] = \text{offset} + \sum_{i=1}^{\hat{N}} \max(0, \hat{b}_i - \hat{s}) << \hat{a}_i$$

or deviates therefrom merely for one or more extreme values of its argument by zero setting or magnitude reduction to avoid the updated $$s_i^k$$

leaving a predetermined value range, (e.g. consider that $$s_i^k$$

has a value domain larger than $$s_i^k \cdot m_i^k;$$

that is, $$s_i^k$$

is quasi quantized onto $$s_i^k \cdot m_i^k;$$

for extreme values of $$s_i^k \cdot m_i^k, s_i^k$$

may be modified by an unamended A according to above formula to leave its value domain; to avoid this, the entries corresponding to these extreme values might be reduced or zeroed); where offset, $\hat{N}$, $\hat{b}_i$, and $\hat{a}_i$ are predetermined parameters (examples are set out above).

In an embodiment, the arithmetic decoder is configured to derive $$A\left[z + \left\lfloor s_i^k \cdot m_i^k \right\rfloor\right]$$

by table look-up or computationally.

In an embodiment, the arithmetic decoder is configured to determine one or more updated state variable values $$s_i^k$$

according to $$s_i^k = \begin{cases} s_i^k + \left\lfloor A\left[z + \left\lfloor s_i^k \cdot m_i^k \right\rfloor\right] \cdot n_i^k \right\rfloor, & \text{If symbol to be encoded is 1.} \\ s_i^k - \left\lfloor A\left[z - 1 - \left\lfloor s_i^k \cdot m_i^k \right\rfloor\right] \cdot n_i^k \right\rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

In an embodiment, the arithmetic decoder is configured to determine one or more updated state variable values $$s_i^k$$

according to $$s_i^k = \begin{cases} s_i^k + \left\lfloor A\left[z + \left\lfloor s_i^k \cdot m_i^k \right\rfloor\right] \cdot n_i^k \right\rfloor, & \text{If symbol to be encoded is 1.} \\ s_i^k + \left\lfloor -A\left[z + \left\lfloor -s_i^k \cdot m_i^k \right\rfloor\right] \cdot n_i^k \right\rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

In an embodiment, the arithmetic decoder is configured to determine one or more updated state variable values $$s_i^k$$

according to $$s_i^k = \begin{cases} s_i^k + \left\lfloor A\left[z + \left\lfloor s_i^k \cdot m_i^k \right\rfloor\right] \cdot n_i^k \right\rfloor, & \text{If symbol to be encoded is 1.} \\ s_i^k + \left\lfloor -A\left[z - 1 - \left\lfloor s_i^k \cdot m_i^k \right\rfloor\right] \cdot n_i^k \right\rfloor, & \text{If symbol to be encoded is 0.} \end{cases}$$

wherein A is a lookup table (for example, comprising integer values), wherein z is a predetermined (constant) offset value; wherein $$m_i^k$$

are one or more weighting values; wherein $$n_i^k$$

are one or more weighting values.

In an embodiment, the arithmetic decoder is configured to perform the quantizing the coding interval size information by applying a logical right shift onto the coding interval size information.

In an embodiment, the arithmetic decoder is configured to perform the quantizing the coding interval size information R by $Qr_2(R) = (\lfloor R \cdot 2^{-\mu} \rfloor + v) \cdot 2^{-w}$, where u, v and w are parameters.

In an embodiment of the arithmetic decoder, the entries of the one-dimensional look-up table monotonically decrease at an increase of the one state variable value, or the scaled and/or rounded version ($\lfloor s^k * a^k \rfloor$) thereof.

In an embodiment of the arithmetic decoder, different value intervals of the value domain for the one state variable value, or the scaled and/or rounded version ($\lfloor s^k * a^k \rfloor$) thereof, are equally sized.

In an embodiment of the arithmetic decoder, the entries of the one-dimensional look-up table monotonically decrease with decreasing rate at an increase of the one state variable value, or the scaled and/or rounded version ($\lfloor s^k * a^k \rfloor$) thereof.

An embodiment according to the invention creates a video encoder, wherein the video encoder is configured to encode a plurality of video frames, wherein the video encoder comprises an arithmetic encoder for providing an encoded binary sequence on the basis of a sequence of binary values representing a video content, according to one of the above embodiments.

It should be noted that the arithmetic encoder discussed herein is well-suited for usage within a video encoder. In this case, the symbols to be encoded and/or the previously encoded symbols may be symbols of a video bit stream. For example, the symbols to be encoded and/or the previously encoded symbols may represent bits of a side information or control information and/or bits of encoded transform coefficients representing a video content. In other words, the symbols to be encoded and/or the previously encoded symbols may represent any of the information which is included into the bit stream for representing a video content. However, it should be noted that the state variable values may be determined individually for different "contexts", i.e., for different types of information. For example, only the bits associated with a given type of information (for example, a specific type of side information) may contribute to a given state variable value or to a given set of state variable values which is used to obtain a given combined state variable value. Thus, the interval size information may also be derived individually for different contexts, i.e., for the encoding of symbol values which are associated with different types of information (e.g., side information).

An embodiment according to the invention creates a video decoder, wherein the video decoder is configured to decode a plurality of video frames, wherein the video decoder comprises an arithmetic decoder (120;220) for providing a decoded binary sequence (for example, on the basis of decoded symbol values) on the basis of an encoded representation (211) of the binary sequence, according to one of the above embodiments.

The video decoder is based on the same considerations as the video encoder. Accordingly, the above explanations also apply, wherein encoded symbols or symbols to be encoded correspond to decoded symbols.

Moreover, it should be noted that further embodiments according to the invention create respective methods and computer programs.

An embodiment according to the invention creates a method for encoding a plurality of symbols having symbol values (e.g. binary values), wherein the method comprises deriving an interval size information ($p^k$, $R*p^k$) for an arithmetic encoding of one or more symbol values to be encoded on the basis of a plurality of state variable values ($s_i^k$) (which are, for example, associated with a given context mode, indicated by index k), which represent statistics of a plurality of previously encoded symbol values (e.g. a sequence of binary values 0 and 1) with different adaptation time constants, wherein the method comprises mapping a first state variable value ($s_1^k$), or a scaled and/or rounded version ($\lfloor s_1^k * a_1^k \rfloor$) thereof, using a lookup-table (LUT1) and mapping a second state variable value ($s_2^k$), or a scaled and/or rounded version ($\lfloor s_2^k * a_2^k \rfloor$) thereof using the lookup-table (LUT1), in order to obtain the interval size information (e.g. $p^k$ or $R*p^k$) describing an interval size for the arithmetic encoding of one or more symbols to be encoded.

An embodiment according to the invention creates a method for encoding a plurality of symbols having symbol values (e.g. binary values), wherein the method comprises deriving an interval size information ($p^k$, $R*p^k$) for an arithmetic encoding of one or more symbol values to be encoded on the basis of a plurality of state variable values ($s_i^k$) (which are, for example, associated with a given context mode, indicated by index k), which represent statistics of a plurality of previously encoded symbol values (e.g. a sequence of binary values 0 and 1) with different adaptation time constants, wherein the method comprises deriving a combined state variable value ($s_k$) (which may, for example, be a weighted sum of state variable values) one the basis of the plurality of (individual) state variable values ($s_i^k$), and wherein the method comprises mapping the combined state variable value ($s_k$), or a scaled and/or rounded version thereof ($\lfloor s_2^k * a_2^k \rfloor$) using a look-up table, in order to obtain the interval size information (e.g. $p_k$ or $R*p_k$) describing an interval size for the arithmetic encoding of one or more symbols to be encoded.

An embodiment according to the invention creates a method for encoding a plurality of symbols having symbol values (e.g. binary values), wherein the method comprises determining one or more state variable values ($s_1^k$, $s_2^k$), which represent statistics of a plurality of previously encoded symbol values (e.g. a sequence of binary values 0 and 1) (for example, in the case of a plurality of state variable values, statistics with different adaptation time constants), and wherein the method comprises deriving an interval size information ($p^k$, $R*p^k$) for an arithmetic encoding of one or more symbol values to be encoded on the basis of the one or more state variable values ($s_i^k$) (which are, for example, associated with a given context mode, indicated by index k), which represent statistics of a plurality of previously encoded symbol values (e.g. a sequence of binary values 0 and 1) (for example, in the case of a plurality of state variable values, statistics with different adaptation time constants), wherein the method comprises updating a first state variable value ($s_1^k$) in dependence on a symbol to be encoded and using a look-up table (A) (for example, after encoding the symbol to be encoded).

An embodiment according to the invention creates a method for decoding a plurality of symbols having symbol values (e.g. binary values), wherein the method comprises deriving an interval size information ($p^k$, $R*p^k$) for an arithmetic decoding of one or more symbol values to be decoded on the basis of a plurality of state variable values ($s_i^k$) (which are, for example, associated with a given context model, indicated by index k), which represent statistics of a plurality of previously decoded symbol values (e.g. a sequence of binary values 0 and 1) (for example, an estimate of a probabilities that one or more symbols to be decoded comprises certain symbol values)) with different adaptation time constants, wherein the method comprises mapping a first state variable value ($s_1^k$), or a scaled and/or rounded version ($\lfloor s_1^k * a_1^k \rfloor$) thereof, using a lookup-table (LUT1) and mapping a second state variable value ($s_2^k$), or a scaled and/or rounded version ($\lfloor s_2^k * a_2^k \rfloor$) thereof using the lookup-table (LUT1), in order to obtain the interval size information (e.g. $p_k$ or $R*p_k$) describing an interval size for the arithmetic decoding of one or more symbols to be decoded.

An embodiment according to the invention creates a method for decoding a plurality of symbols having symbol values (e.g. binary values), wherein the method comprises deriving an interval size information ($p^k$, $R*p^k$) for an arithmetic decoding of one or more symbol values to be decoded on the basis of a plurality of state variable values ($s_i^k$) (which are, for example, associated with a given context mode, indicated by index k), which represent statistics of a plurality of previously decoded symbol values (e.g. a sequence of binary values 0 and 1) (for example, an estimate of a probabilities that one or more symbols to be decoded comprises certain symbol values) with different adaptation time constants, wherein the method comprises deriving a combined state variable value ($s_k$) (which may, for example, be a weighted sum of state variable values) one the basis of the plurality of (individual) state variable values ($s_i^k$), and wherein the method comprises mapping the combined state variable value ($s_k$), or a scaled and/or rounded version thereof ($\lfloor s_2^k * a_2^k \rfloor$) using a look-up table, in order to obtain the interval size information (e.g. $p_k$ or $R*p_k$) describing an interval size for the arithmetic decoding of one or more symbols to be decoded.

An embodiment according to the invention creates a method for decoding a plurality of symbols having symbol values (e.g. binary values), wherein the method comprises determining one or more state variable values ($s_1^k$, $s_2^k$), which represent statistics of a plurality of previously decoded symbol values (e.g. a sequence of binary values 0 and 1) (for example, an estimate of a probabilities that one or more symbols to be decoded comprises certain symbol values) (for example, in the case that a plurality of state variable values are determined, statistics with different adaptation time constants), and wherein the method comprises deriving an interval size information ($p^k$, $R*p^k$) for an arithmetic decoding of one or more symbol values to be decoded on the basis of the one or more state variable values ($s_i^k$) (which are, for example, associated with a given context mode, indicated by index k), which represent statistics of a plurality of previously decoded symbol values (e.g. a sequence of binary values 0 and 1) (for example, in the case that a plurality of state variable values are determined, statistics with different adaptation time constants), wherein the method comprises updating a first state variable value ($s_1^k$) in dependence on a decoded symbol and using a look-up table (A).

Embodiments according to the invention create Methods performed by encoder and decoder according to one of the above embodiments.

An embodiment according to the invention creates a computer program for performing the method according to one of the above embodiments when the computer program runs on a computer.

An embodiment according to the invention creates a method for encoding a plurality of symbols having symbol values (e.g. binary values), wherein the method comprises deriving an interval size value ($R_{LPS}$) for an arithmetic encoding of one or more symbol values to be encoded on the basis of one or more state variable values ($s_i^k$) (which are, for example, associated with a given context mode, indicated by index k), which represent statistics of a plurality of previously encoded symbol values (e.g. a sequence of binary values 0 and 1) (e.g. with different adaptation time constants); wherein the method comprises determining the interval size value ($R_{LPS}$) using a base lookup table (Base TabLPS), (a dimension of which in terms of probability indices is smaller than a number of possible probability indices i), wherein the method comprises determining the interval size value ($R_{LPS}$) such that a determined interval size value is identical to an element of the base lookup table or is a rounded version of an element of the base lookup table if a probability index (i), which is obtained on the basis of the one or more state variable values (for example, as i=Qp($p_{LPS}$)), is within a first range (e.g. smaller than μ), and such that a determined interval size value is obtained using a scaling and rounding of an element of the base lookup table if the probability index is within a second range (e.g. larger than or equal to μ); and wherein the method comprises performing the arithmetic encoding of one or more symbols using the interval size value ($R_{LPS}$).

An embodiment according to the invention creates a method for encoding a plurality of symbols having symbol values (e.g. binary values), wherein the method comprises deriving an interval size value ($R_{LPS}$) for an arithmetic encoding of one or more symbol values to be encoded on the basis of one or more state variable values ($s_i^k$) (which are, for example, associated with a given context mode, indicated by index k), which represent statistics of a plurality of previously encoded symbol values (e.g. a sequence of binary values 0 and 1) (e.g. with different adaptation time constants); wherein the method comprises determining the interval size value ($R_{LPS}$) using a probability table (Prob TabLPS), (a dimension of which in terms of probability indices is smaller than a number of possible probability indices i) on the basis of a (current) probability value derived from the one or more state variable values and on the basis of a (current) coding interval size (R), wherein the probability table describes interval sizes (interval size values) for a set of a plurality of probability values (for example, for probability indices between 0 and μ−1) and for a (single) given (reference) coding interval size, and wherein the method comprises scaling an element of the probability table (Prob_TabLPS) (for example, an element selected in dependence on the current probability value), to obtain the interval size value[$R_{LPS}$] if a current probability value is not in the set of a plurality of probability values (for example, is a probability index associated with the current probability value is larger than or equal to μ) and/or if a current coding interval size (R) is different from the given (reference) coding interval size; and wherein the method comprises performing the arithmetic encoding of one or more symbols using the interval size value ($R_{LPS}$).

An embodiment according to the invention creates a method for decoding a plurality of symbols having symbol values (e.g. binary values), wherein the method comprises deriving an interval size value ($R_{LPS}$) for an arithmetic decoding of one or more symbol values to be decoded on the basis of one or more state variable values ($s_i^k$) (which are, for example, associated with a given context mode, indicated by index k), which represent statistics of a plurality of previously decoded symbol values (e.g. a sequence of binary values 0 and 1) (e.g. with different adaptation time constants); wherein the method comprises determining the interval size value ($R_{LPS}$) using a base lookup table (Base TabLPS), (a dimension of which in terms of probability indices is smaller than a number of possible probability indices i), wherein the method comprises determining the interval size value ($R_{LPS}$) such that a determined interval size value is identical to an element of the base lookup table or is a rounded version of an element of the base lookup table if a probability index (i), which is obtained on the basis of the one or more state variable values (for example, as i=Qp($p_{LPS}$)), is within a first range (e.g. smaller than μ), and such that a determined interval size value is obtained using a scaling and rounding of an element of the base lookup table if the probability index is within a second range (e.g. larger than or equal to μ); and wherein the method comprises performing the arithmetic decoding of one or more symbols using the interval size value ($R_{LPS}$).

An embodiment according to the invention creates a method for decoding a plurality of symbols having symbol values (e.g. binary values), wherein the method comprises deriving an interval size value ($R_{LPS}$) for an arithmetic decoding of one or more symbol values to be decoded on the basis of one or more state variable values ($s_i^k$) (which are, for example, associated with a given context mode, indicated by index k), which represent statistics of a plurality of previously decoded symbol values (e.g. a sequence of binary values 0 and 1) (e.g. with different adaptation time constants); wherein the method comprises determining the interval size value ($R_{LPS}$) using a probability table (Prob TabLPS), (a dimension of which in terms of probability indices is smaller than a number of possible probability indices i) on the basis of a (current) probability value derived from the one or more state variable values and on the basis of a (current) coding interval size (R), wherein the probability table describes interval sizes (interval size values) for a set of a plurality of probability values (for example, for probability indices between 0 and μ–1) and for a (single) given (reference) coding interval size, and wherein the method comprises scaling an element of the probability table (Prob_TabLPS) (for example, an element selected in dependence on the current probability value), to obtain the interval size value[$R_{LPS}$) if a current probability value is not in the set of a plurality of probability values (for example, is a probability index associated with the current probability value is larger than or equal to μ) and/or if a current coding interval size (R) is different from the given (reference) coding interval size; and wherein the method comprises performing the arithmetic decoding of one or more symbols using the interval size value ($R_{LPS}$).

An embodiment according to the invention creates a computer program for performing the method according to one of the above embodiments when the computer program runs on a computer.

The above-mentioned methods are based on the same considerations as the above-discussed apparatuses. However, it should be noted that the methods can optionally be supplemented by any of the features, functionalities and the details described herein, also with respect to the apparatuses. The methods can optionally be supplemented by said features, functionalities and the details both individually and taken in combination. The same is also true for the computer programs.

BRIEF DESCRIPTION OF THE DRAWINGS

Embodiments of the present invention will be detailed subsequently referring to the appended drawings, in which.

DETAILED DESCRIPTION OF THE INVENTION

1. Encoder According to FIG. 1

The following description of the figures starts with a presentation of a description of an encoder (FIG. 1) and a decoder (FIG. 2) of a block-based predictive codec for coding pictures of a video in order to form an example for a coding framework into which embodiments of the present invention may be built in. The respective encoder and decoder are described with respect to FIGS. 1 to 3. Thereinafter the description of embodiments of the concept of the present invention is presented along with a description as to how such concepts could be built into the encoder and decoder of FIGS. 1 and 2, respectively, although the embodiments described with the subsequent FIG. 4 and following, may also be used to form encoders and decoders not operating according to the coding framework underlying the encoder and decoder of FIGS. 1 and 2.

Figure 1:
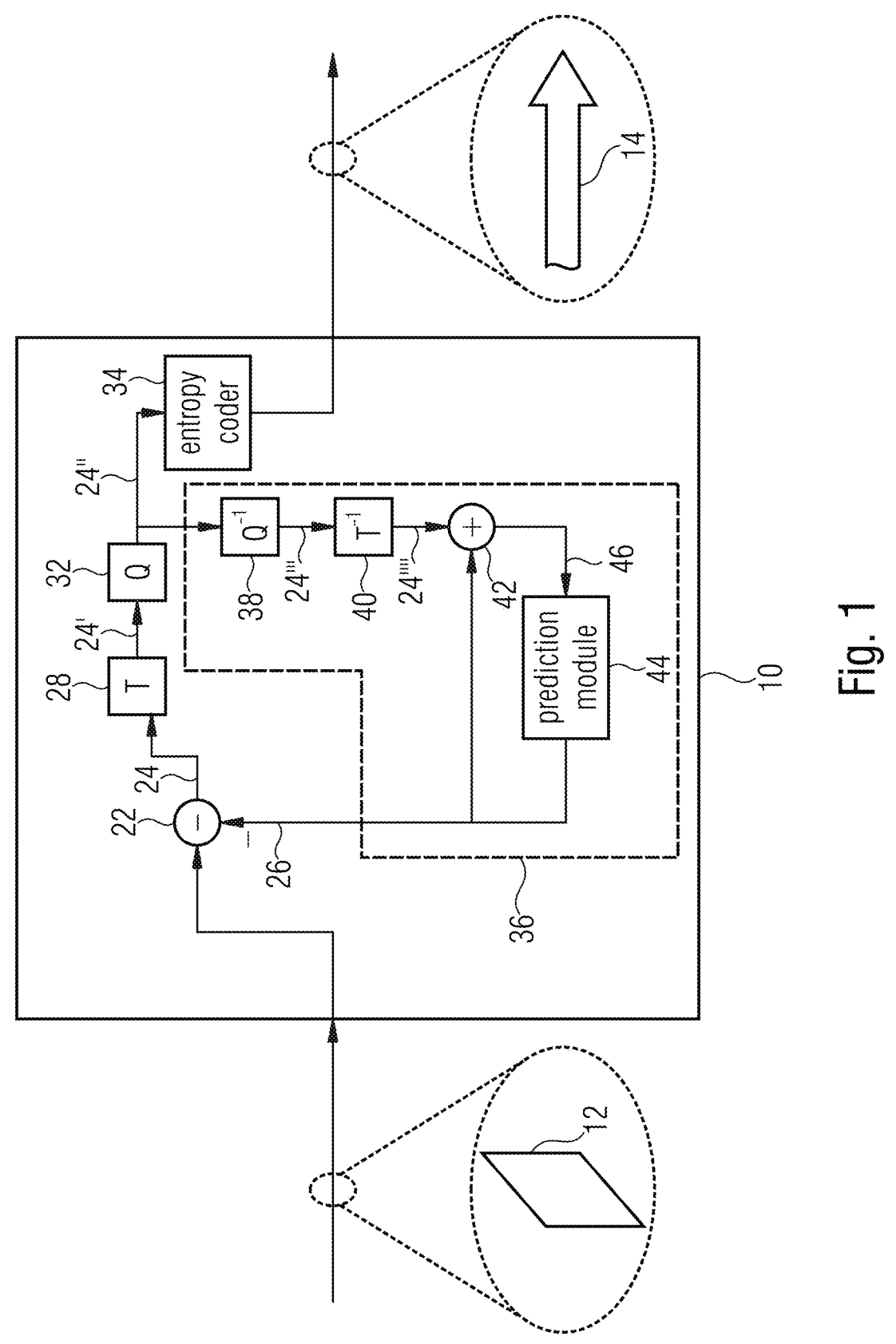
FIG. 1 shows a block schematic diagram of an apparatus for predictively coding a picture in a data stream, according to an embodiment of the present invention.
Figure 2:
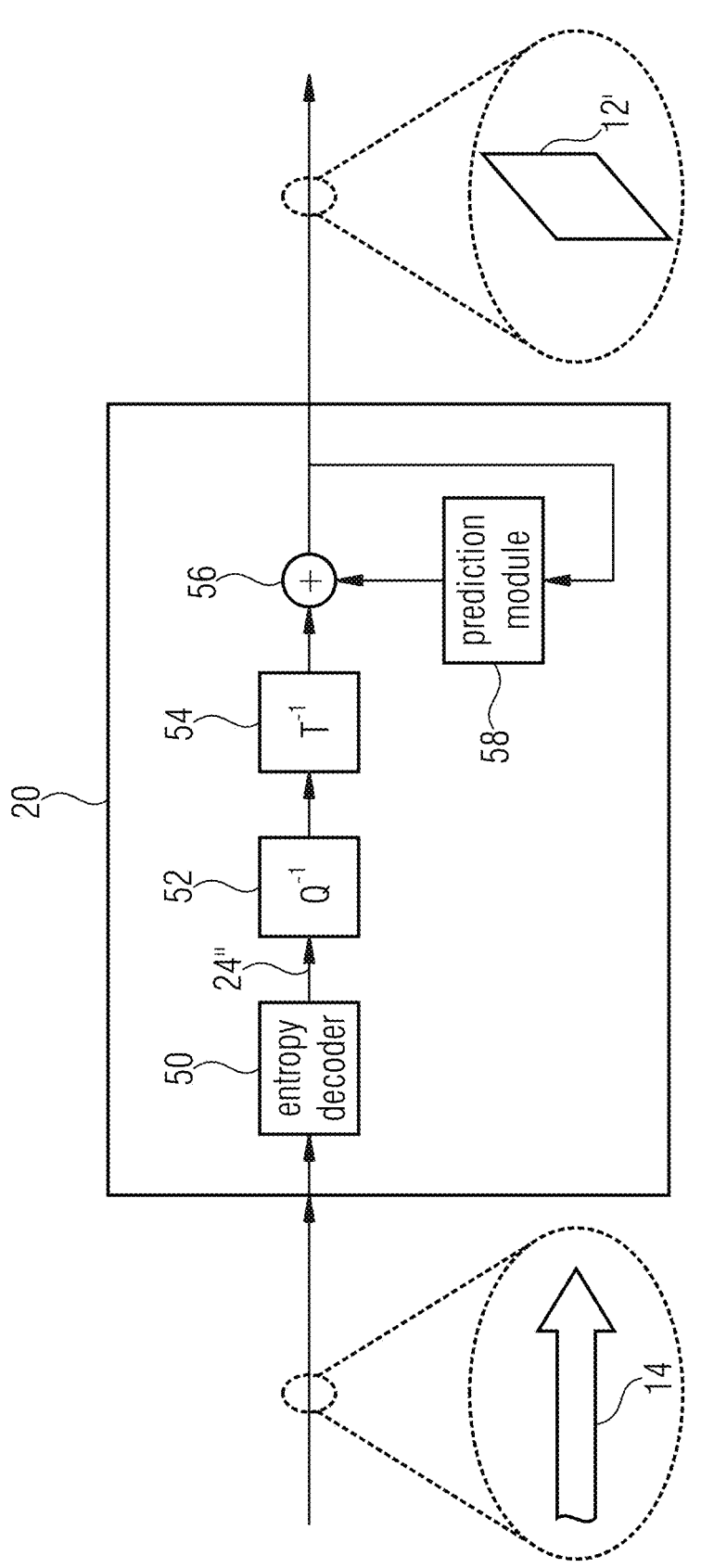
FIG. 2 shows a block schematic diagram of a decoder, according to an embodiment of the present invention.

Embodiments according to the invention may comprise video encoders and video decoders as described with respect to FIGS. 1 and 2. Also, any of the concepts disclosed herein may, for example, be used in the entropy coder 34 or in the entropy decoder 50 as described with reference to FIGS. 1 and 2.

FIG. 1 shows an apparatus for predictively coding a picture 12 into a data stream 14 exemplarily using transform-based residual coding. The apparatus, or encoder, is indicated using reference sign 10. FIG. 2 shows a corresponding decoder 20, i.e. an apparatus 20 configured to predictively decode the picture 12' from the data stream 14 also using transform-based residual decoding, wherein the apostrophe has been used to indicate that the picture 12' as reconstructed by the decoder 20 deviates from picture 12 originally encoded by apparatus 10 in terms of coding loss introduced by a quantization of the prediction residual signal. FIG. 1 and FIG. 2 exemplarily use transform based prediction residual coding, although embodiments of the present application are not restricted to this kind of prediction residual coding. This is true for other details described with respect to FIGS. 1 and 2, too, as will be outlined hereinafter.

The encoder 10 is configured to subject the prediction residual signal to spatial-to-spectral transformation and to encode the prediction residual signal, thus obtained, into the data stream 14. Likewise, the decoder 20 is configured to decode the prediction residual signal from the data stream 14 and subject the prediction residual signal thus obtained to spectral-to-spatial transformation.

Internally, the encoder 10 may comprise a prediction residual signal former 22 which generates a prediction residual 24 so as to measure a deviation of a prediction signal 26 from the original signal, i.e. from the picture 12. The prediction residual signal former 22 may, for instance, be a subtractor which subtracts the prediction signal from the original signal, i.e. from the picture 12. The encoder 10 then further comprises a transformer 28 which subjects the prediction residual signal 24 to a spatial-to-spectral transformation to obtain a spectral-domain prediction residual signal 24' which is then subject to quantization by a quantizer 32, also comprised by the encoder 10. The thus quantized prediction residual signal 24" is coded into bitstream 14. To this end, encoder 10 may optionally comprise an entropy coder 34 which entropy codes the prediction residual signal as transformed and quantized into data stream 14. The prediction signal 26 is generated by a prediction stage 36 of encoder 10 on the basis of the prediction residual signal 24" encoded into, and decodable from, data stream 14. To this end, the prediction stage 36 may internally, as is shown in FIG. 1, comprise a dequantizer 38 which dequantizes prediction residual signal 24" so as to gain spectral-domain prediction residual signal 24''', which corresponds to signal 24' except for quantization loss, followed by an inverse transformer 40 which subjects the latter prediction residual signal 24''' to an inverse transformation, i.e. a spectral-to-spatial transformation, to obtain prediction residual signal 24'''', which corresponds to the original prediction residual signal 24 except for quantization loss. A combiner 42 of the prediction stage 36 then recombines, such as by addition, the prediction signal 26 and the prediction residual signal 24'''' so as to obtain a reconstructed signal 46, i.e. a reconstruction of the original signal 12. Reconstructed signal 46 may correspond to signal 12'. A prediction module 44 of prediction stage 36 then generates the prediction signal 26 on the basis of signal 46 by using, for instance, spatial prediction, i.e. intra-picture prediction, and/or temporal prediction, i.e. inter-picture prediction.

2. Decoder According to FIG. 2

Likewise, decoder 20, as shown in FIG. 2, may be internally composed of components corresponding to, and interconnected in a manner corresponding to, prediction stage 36. In particular, entropy decoder 50 of decoder 20 may entropy decode the quantized spectral-domain prediction residual signal 24" from the data stream, whereupon dequantizer 52, inverse transformer 54, combiner 56 and prediction module 58, interconnected and cooperating in the manner described above with respect to the modules of prediction stage 36, recover the reconstructed signal on the basis of prediction residual signal 24" so that, as shown in FIG. 2, the output of combiner 56 results in the reconstructed signal, namely picture 12'.

Although not specifically described above, it is readily clear that the encoder 10 may set some coding parameters including, for instance, prediction modes, motion parameters and the like, according to some optimization scheme such as, for instance, in a manner optimizing some rate and distortion related criterion, i.e. coding cost. For example, encoder 10 and decoder 20 and the corresponding modules 44, 58, respectively, may support different prediction modes such as intra-coding modes and inter-coding modes. The granularity at which encoder and decoder switch between these prediction mode types may correspond to a subdivision of picture 12 and 12', respectively, into coding segments or coding blocks. In units of these coding segments, for instance, the picture may be subdivided into blocks being intra-coded and blocks being inter-coded. Intra-coded blocks are predicted on the basis of a spatial, already coded/decoded neighborhood of the respective block as is outlined in more detail below. Several intra-coding modes may exist and be selected for a respective intra-coded segment including directional or angular intra-coding modes according to which the respective segment is filled by extrapolating the sample values of the neighborhood along a certain direction which is specific for the respective directional intra-coding mode, into the respective intra-coded segment. The intra-coding modes may, for instance, also comprise one or more further modes such as a DC coding mode, according to which the prediction for the respective intra-coded block assigns a DC value to all samples within the respective intra-coded segment, and/or a planar intra-coding mode according to which the prediction of the respective block is approximated or determined to be a spatial distribution of sample values described by a two-dimensional linear function over the sample positions of the respective intra-coded block with driving tilt and offset of the plane defined by the two-dimensional linear function on the basis of the neighboring samples. Compared thereto, inter-coded blocks may be predicted, for instance, temporally. For inter-coded blocks, motion vectors may be signaled within the data stream, the motion vectors indicating the spatial displacement of the portion of a previously coded picture of the video to which picture 12 belongs, at which the previously coded/decoded picture is sampled in order to obtain the prediction signal for the respective inter-coded block. This means, in addition to the residual signal coding comprised by data stream 14, such as the entropy-coded transform coefficient levels representing the quantized spectral-domain prediction residual signal 24", data stream 14 may have encoded thereinto coding mode parameters for assigning the coding modes to the various blocks, prediction parameters for some of the blocks, such as motion parameters for inter-coded segments, and optional further parameters such as parameters for controlling and signaling the subdivision of picture 12 and 12', respectively, into the segments. The decoder 20 uses these parameters to subdivide the picture in the same manner as the encoder did, to assign the same prediction modes to the segments, and to perform the same prediction to result in the same prediction signal.

3. Functionality According to FIG. 3

Figure 3:
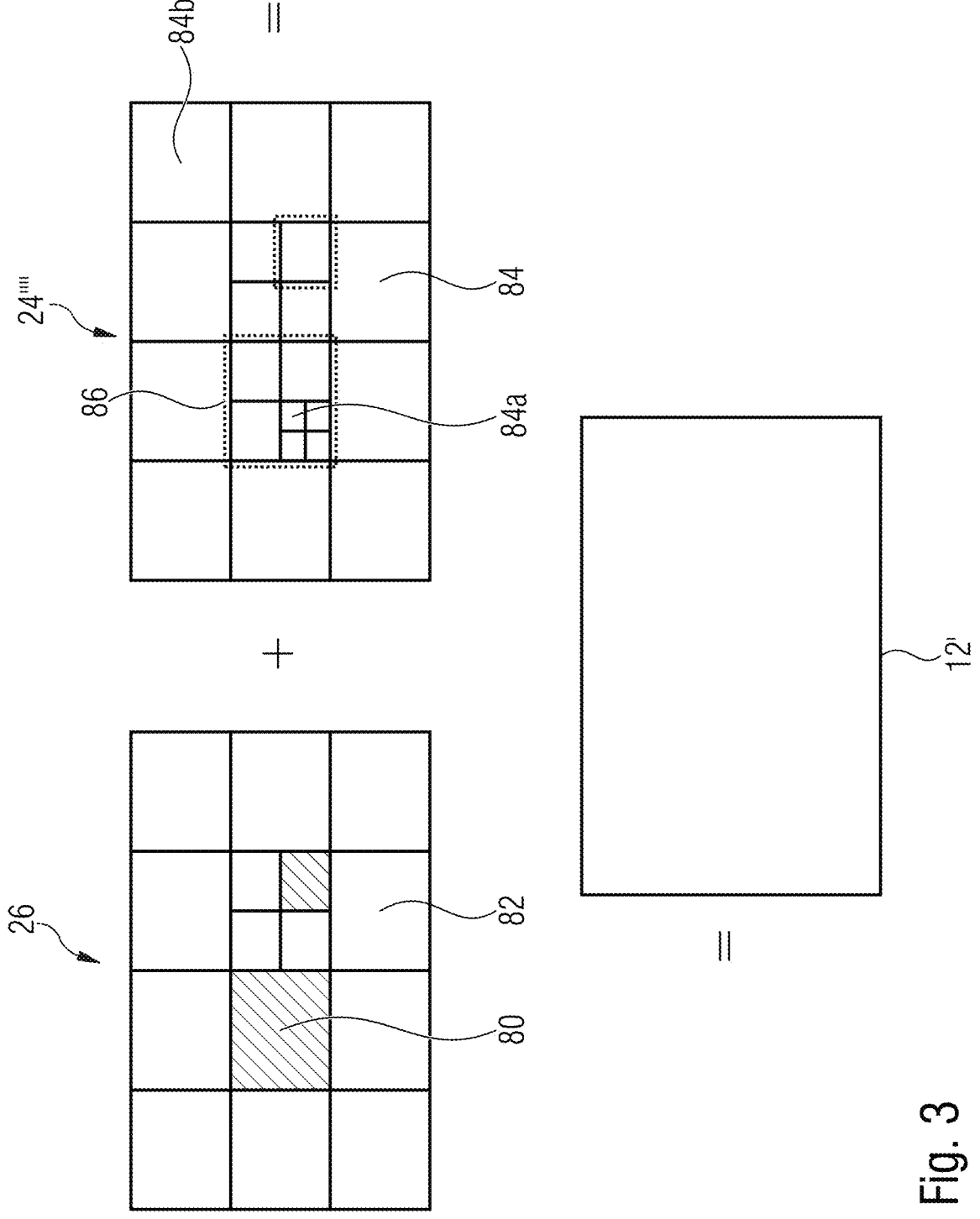
FIG. 3 shows a schematic representation of a relationship between a reconstructed signal and the combination of the prediction residual and the prediction signal.

FIG. 3 illustrates the relationship between the reconstructed signal, i.e. the reconstructed picture 12', on the one hand, and the combination of the prediction residual signal 24'''' as signaled in the data stream 14, and the prediction signal 26, on the other hand. As already denoted above, the combination may be an addition. The prediction signal 26 is illustrated in FIG. 3 as a subdivision of the picture area into intra-coded blocks which are illustratively indicated using hatching, and inter-coded blocks which are illustratively indicated not-hatched. The subdivision may be any subdivision, such as a regular subdivision of the picture area into rows and columns of square blocks or non-square blocks, or a multi-tree subdivision of picture 12 from a tree root block into a plurality of leaf blocks of varying size, such as a quadtree subdivision or the like, wherein a mixture thereof is illustrated in FIG. 3 in which the picture area is first subdivided into rows and columns of tree root blocks which are then further subdivided in accordance with a recursive multi-tree subdivisioning into one or more leaf blocks.

Again, data stream 14 may have an intra-coding mode coded thereinto for intra-coded blocks 80, which assigns one of several supported intra-coding modes to the respective intra-coded block 80. For inter-coded blocks 82, the data stream 14 may have one or more motion parameters coded thereinto. Generally speaking, inter-coded blocks 82 are not restricted to being temporally coded. Alternatively, inter-coded blocks 82 may be any block predicted from previously coded portions beyond the current picture 12 itself, such as previously coded pictures of a video to which picture 12 belongs, or picture of another view or an hierarchically lower layer in the case of encoder and decoder being scalable encoders and decoders, respectively.

The prediction residual signal 24"" in FIG. 3 is also illustrated as a subdivision of the picture area into blocks 84. These blocks might be called transform blocks in order to distinguish same from the coding blocks 80 and 82. In effect, FIG. 3 illustrates that encoder 10 and decoder 20 may use two different subdivisions of picture 12 and picture 12', respectively, into blocks, namely one subdivisioning into coding blocks 80 and 82, respectively, and another subdivision into transform blocks 84. Both subdivisions might be the same, i.e. each coding block 80 and 82, may concurrently form a transform block 84, but FIG. 3 illustrates the case where, for instance, a subdivision into transform blocks 84 forms an extension of the subdivision into coding blocks 80, 82 so that any border between two blocks of blocks 80 and 82 overlays a border between two blocks 84, or alternatively speaking each block 80, 82 either coincides with one of the transform blocks 84 or coincides with a cluster of transform blocks 84. However, the subdivisions may also be determined or selected independent from each other so that transform blocks 84 could alternatively cross block borders between blocks 80, 82. As far as the subdivision into transform blocks 84 is concerned, similar statements are thus true as those brought forward with respect to the subdivision into blocks 80, 82, i.e. the blocks 84 may be the result of a regular subdivision of picture area into blocks (with or without arrangement into rows and columns), the result of a recursive multi-tree subdivisioning of the picture area, or a combination thereof or any other sort of blockation. Just as an aside, it is noted that blocks 80, 82 and 84 are not restricted to being of quadratic, rectangular or any other shape.

FIG. 3 further illustrates that the combination of the prediction signal 26 and the prediction residual signal 24"" directly results in the reconstructed signal 12'. However, it should be noted that more than one prediction signal 26 may be combined with the prediction residual signal 24"" to result into picture 12' in accordance with alternative embodiments.

In FIG. 3, the transform blocks 84 shall have the following significance. Transformer 28 and inverse transformer 54 perform their transformations in units of these transform blocks 84. For instance, many codecs use some sort of DST or DCT for all transform blocks 84. Some codecs allow for skipping the transformation so that, for some of the transform blocks 84, the prediction residual signal is coded in the spatial domain directly. However, in accordance with embodiments described below, encoder 10 and decoder 20 are configured in such a manner that they support several transforms. For example, the transforms supported by encoder 10 and decoder 20 could comprise:

DCT-II (or DCT-III), where DCT stands for Discrete Cosine Transform

DST-IV, where DST stands for Discrete Sine Transform

DCT-IV

DST-VII

Identity Transformation (IT)

Naturally, while transformer 28 would support all of the forward transform versions of these transforms, the decoder

20 or inverse transformer 54 would support the corresponding backward or inverse versions thereof:

Inverse DCT-II (or inverse DCT-III)

Inverse DST-IV

Inverse DCT-IV

Inverse DST-VII

Identity Transformation (IT)

The subsequent description provides more details on which transforms could be supported by encoder 10 and decoder 20. In any case, it should be noted that the set of supported transforms may comprise merely one transform such as one spectral-to-spatial or spatial-to-spectral transform.

As already outlined above, FIGS. 1 to 3 have been presented as an example where the inventive concept described further below may be implemented in order to form specific examples for encoders and decoders according to the present application. Insofar, the encoder and decoder of FIGS. 1 and 2, respectively, may represent possible implementations of the encoders and decoders described herein below. FIGS. 1 and 2 are, however, only examples. An encoder according to embodiments of the present application may, however, perform block-based encoding of a picture 12 using the concept outlined in more detail below and being different from the encoder of FIG. 1 such as, for instance, in that same is no video encoder, but a still picture encoder, in that same does not support inter-prediction, or in that the sub-division into blocks 80 is performed in a manner different than exemplified in FIG. 3. Likewise, decoders according to embodiments of the present application may perform block-based decoding of picture 12' from data stream 14 using the coding concept further outlined below, but may differ, for instance, from the decoder 20 of FIG. 2 in that same is no video decoder, but a still picture decoder, in that same does not support intra-prediction, or in that same sub-divides picture 12' into blocks in a manner different than described with respect to FIG. 3 and/or in that same does not derive the prediction residual from the data stream 14 in transform domain, but in spatial domain, for instance.

4. Arithmetic Encoder According to FIG. 4

Figure 4:
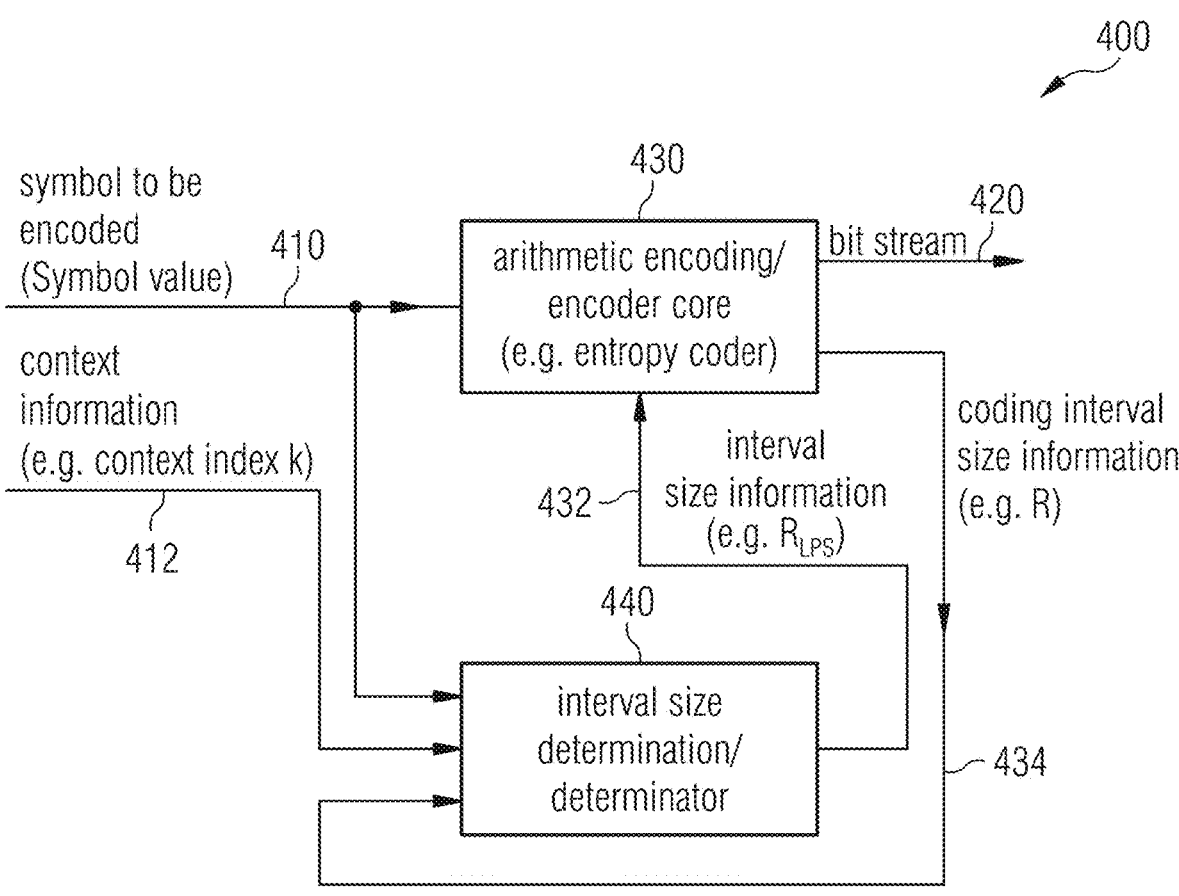
FIG. 4 shows a block schematic diagram of an arithmetic encoder, according to an embodiment of the present invention.

FIG. 4 shows a block schematic diagram of an arithmetic encoder, according to an embodiment of the invention.

The arithmetic encoder 400 according to FIG. 4 may, for example, be used in a video encoder. However, optionally, the arithmetic encoder 400 can also be used in an audio encoder, an image encoder, an encoder for encoding coefficients of a neural network, and so on.

The arithmetic encoder 400 is configured to receive a symbol 410 to be encoded, wherein the symbol 410 to be encoded may be represented by a symbol value. Moreover, the encoder 400 typically also receives a context information 412, which may, for example, describe which type of information is represented by the symbol 410 to be encoded. For example, the context information 412 may be represented by a context index k which describes, for example, which type of side information the symbol 410 to be encoded describes or which type of transform coefficient the symbol 410 encodes.

Moreover, the arithmetic encoder 400 is configured to provide a bit stream 420, which represents the symbol 410 to be encoded, or which represents a sequence of symbols 410 to be encoded.

The arithmetic encoder 400 comprises a arithmetic encoding core or an arithmetic encoder core 430, which receives the symbol 410 to be encoded and which provides, on the basis thereof, the bit stream 420. The arithmetic encoding core or the arithmetic encoder core 430 typically receives an interval size information, which may, for example, represent a size of a subinterval (out of a total coding interval) into which a symbol (for example, a least-probable symbol) is mapped. Moreover, the arithmetic encoding core or the arithmetic encoder core also provides a coding interval size information 434, which describes a current coding interval size (e.g. a total size of a coding interval). It should be noted that the coding interval size 434 may vary over time, depending on the symbols 410 which are encoded (or, to be more precise, depending on the sequence of symbols 410 which are encoded).

The coding interval size may, for example, change due to a re-scaling operation which is performed in the course of the arithmetic encoding. For example, the arithmetic encoding core may, for example, perform the functionality as described in the High Efficiency Video Coding (HEVC) standard (H.265).

The arithmetic encoder 400 also comprises a coding interval size determination or a coding interval size determinator 440. The coding interval size determination 440 receives a symbol 410 to be encoded or, at least, one or more previously encoded symbols, and advantageously (but not necessarily) also receives the context information 412. Furthermore, the interval size determination 440 receives the coding interval size information 434. The interval size determination 440 provides, on the basis of the coding interval size information, the symbol 410 to be encoded (or at least one or more previously encoded symbols) and optionally the context information 412 the interval size information 432, which is used by the arithmetic encoding core 430.

Regarding the functionality of the concept according to FIG. 4, it should be noted that the interval size determination 440 serves to (continuously, for example for each new symbol to be encoded) update the interval size information 432. In this update, statistics of the previously encoded symbols are considered. Furthermore, the coding interval size information 434 provided by the arithmetic encoding 430 is also considered, since the interval size information 432 should advantageously be provided to be in an appropriate relationship to the coding interval size information 434. In this context, the coding interval size information 434 may, for example, represent a current size of a (total) coding interval (which may be caused by a re-normalization of the coding interval, which occurs from time to time), while the interval size information 432 may, for example, describe the size of a portion within the overall (total) coding interval which is associated to a certain symbol (for example, to a least probable symbol). Thus, the interval size information is typically smaller than the coding interval size information 434, since the coding interval size information 434 represents a total size of a coding interval while the interval size information 434 represents a size of a part of the coding interval which is associated with a certain symbol. Consequently, the interval size information 432 typically scales with the coding interval size information 434 (wherein the scaling may optionally comprise a somewhat nonlinear behavior, to avoid situations in which a coding would be very inefficient).

To further conclude, by determining an appropriate interval size information 432, considering a total size of the coding interval (represented by the coding interval size information 434) and statistics of previously encoded symbols (as well as the context), the arithmetic encoding can be performed in an efficient manner, wherein the consideration of the statistics of the previously encoded symbols helps to improve the coding efficiency.

However, it should be noted that the arithmetic encoder 400 according to FIG. 4 can be used in any of the signal encoders as disclosed herein (for example, in a video encoder). Moreover, it should be noted that the arithmetic encoder 400 according to FIG. 4 can optionally be supplemented by any of the features, functionalities and details described herein. In particular, the interval size determination 440 may use any of the concepts disclosed herein, both individually and taken in combination.

To conclude the arithmetic encoder 400 according to FIG. 4 may optionally be supplemented by any of the features, functionalities and details disclosed herein, both individually and taken in combination.

5. Arithmetic Decoder According to FIG. 5

Figure 5:
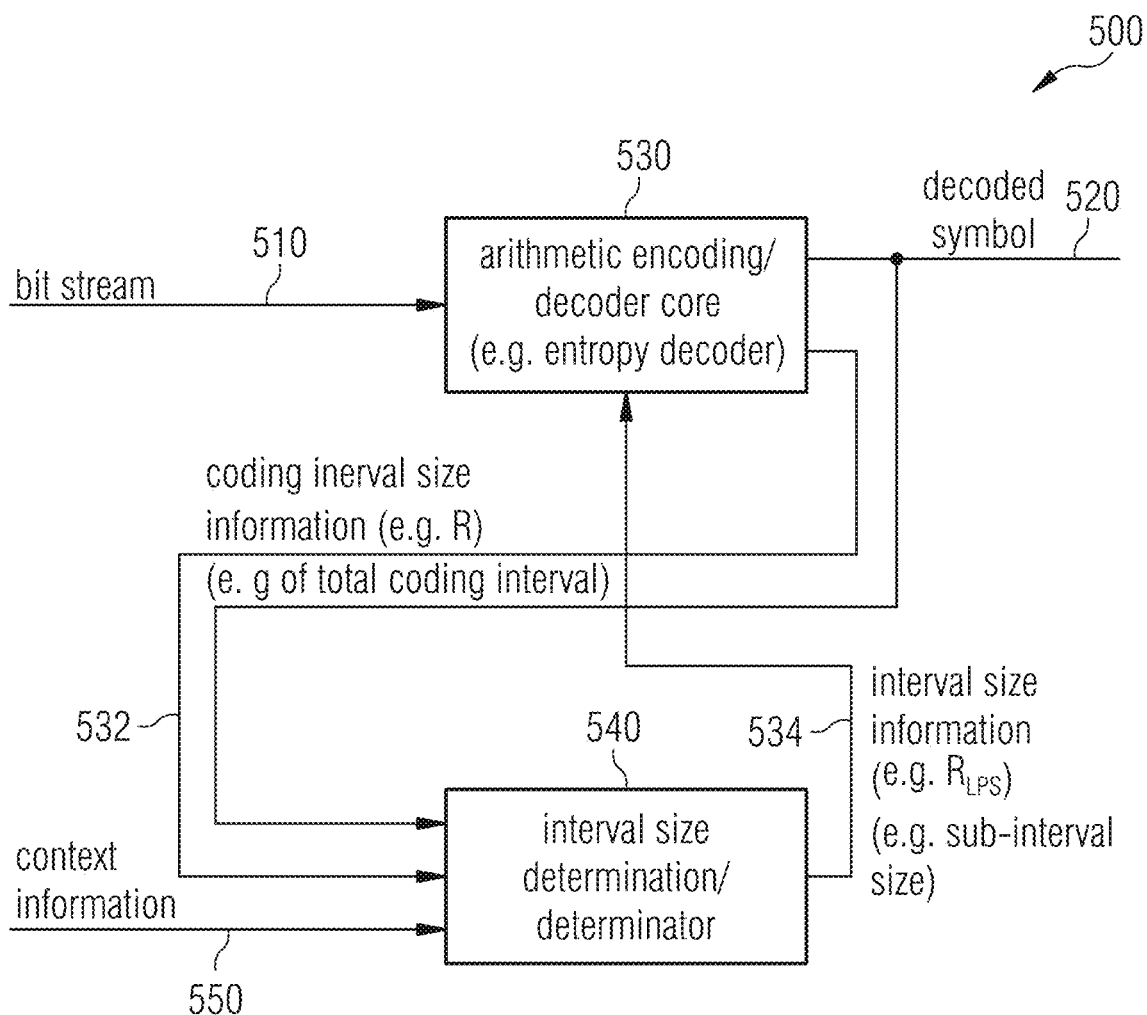
FIG. 5 shows a block schematic diagram of an arithmetic decoder, according to an embodiment of the present invention.

FIG. 5 shows a block schematic diagram of an arithmetic decoder 500, according to an embodiment of the invention. The arithmetic decoder 500 is configured to receive a bit stream 510 (which may correspond to the bit stream 420) and to provide, on the basis thereof, a decoded symbol 520 (or in a sequence of decoded symbols 520). Typically, the decoded symbol 520 may correspond to the symbols 410 to be encoded. Typically, the arithmetic encoder 400 and the arithmetic decoder 500 may, when taken together, perform a lossless encoding and decoding, such that the symbols 410 encoded by the arithmetic encoder 400 provide a bit stream 420, which, when decoded by the arithmetic decoder 500, allows for a "perfect" reconstruction, such that the decoded symbols 520 correspond to the encoded symbols 410.

The arithmetic decoder 500 comprises an arithmetic decoding core or an arithmetic decoder core 530, which receives the bit stream and which provides, on the basis thereof, the decoded symbols 520. The arithmetic decoding core 530 typically provides a coding interval size information 532, which may substantially correspond to the coding interval size information 434, and receives an interval size information 534, which may correspond to the interval size information 432. The arithmetic decoder 500 also comprises a coding interval size determination or coding interval size determinator 540, which is configured to provide the interval size information 534, which is used by the arithmetic decoding core 530, on the basis of the coding interval size information 532 and also on the basis of one or more decoded symbols 520. Furthermore, the coding interval size determination 540 may optionally use a context information 550, which may describe which type of information is represented by a currently considered decoded symbol 520. Accordingly, the coding interval size determination 540 may determine the interval size information 534 for a plurality of different "context"s, i.e., for a plurality of different types of decoded information (or different types of information to be decoded).

The arithmetic decoding core 530 may, for example, determine in which sub-interval, out of a total coding interval (a size of which is described by the coding interval size information) a value represented by the bit stream 510 lies, and consequently decide which symbol is represented by the bit stream. The size of a sub-interval of the total coding interval is described, for example, by the interval size information 534. For example, the interval size information 534 may describe a size of a sub-interval of the total coding interval which is associated with a certain symbol (for example, a least probable symbol). Moreover, it should be noted that the coding interval size (e.g., the size of the total coding interval) may change from time to time (or even for every decoded symbol) due to a re-normalization.

To conclude, the arithmetic decoding 500 is used to provide decoded symbols 520 on the basis of a bit stream 510, wherein a history of previously decoded symbols (or, more precisely, statistics of previously decoded symbols) are used to (dynamically) adjust the interval size associated with a symbol to be decoded (wherein the adjusted interval size is described by the interval size information 534). Moreover, it should be noted that the interval size determination 540 may, for example, be substantially identical to the interval size determination 440. Also, it should be noted that the interval size determination 540 may comprise any of the functionalities disclosed herein. Thus, any of the concepts for the determination of the interval size may be used in the interval size determination 540.

It should be noted that the arithmetic decoder 500 described herein may be used in any of the decoders (for example, audio decoders or video decoders) described herein. However, the arithmetic decoder 500 may also be used for the decoding of images or of coefficients of a neural network.

Generally speaking, the arithmetic decoder 500 described herein may optionally be supplemented by any of the features, functionalities and the details disclosed herein, both individually and taken in combination.

6. Concept for Determination of an Interval Size Information According to FIG. 6

Figure 6:
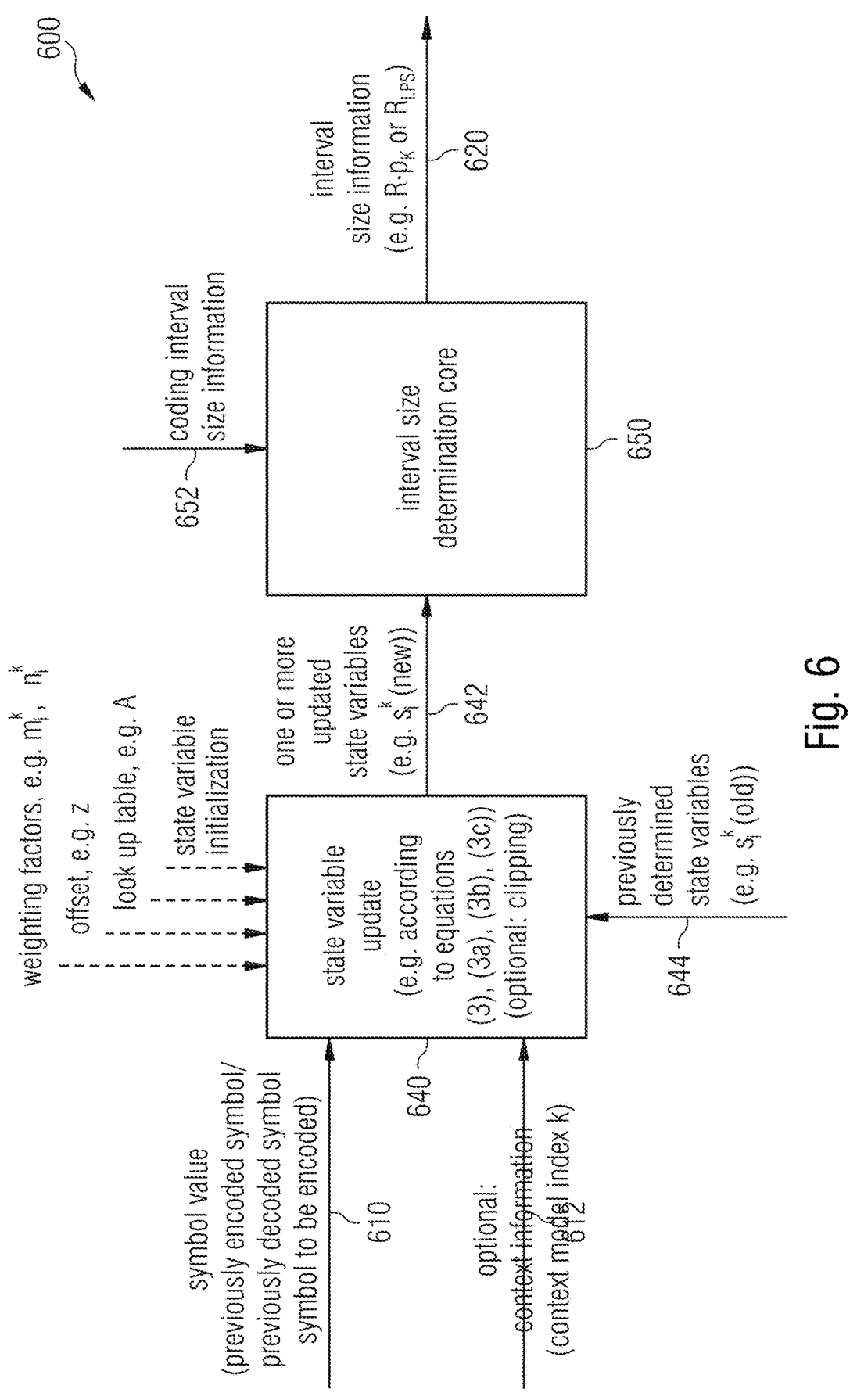
FIG. 6 shows a schematic representation of a concept for determining an interval size information, according to an embodiment of the present invention.

FIG. 6 shows a schematic representation of a concept for a determination of an interval size information, which may, for example, be used in the arithmetic encoder 400 according to FIG. 4 or in the arithmetic decoder 500 according to FIG. 5. The concept 600, which may be implemented in the form of an interval size determination or in the form of an interval size determinator, may, for example, be used to realize the interval size determination or interval size determinator 440, and/or may be used to realize the interval size determination or interval size determinator 540.

The interval size determination 600 may, for example, receive one or more symbol values 610, which may correspond to symbols 410 to be encoded or may correspond to previously encoded symbols, or may correspond to one or more previously decoded symbols 520. Moreover, the interval size determination 600 may, optionally, receive a context information 612, which may, for example, take the form of a context model index k. Moreover, the interval size determination 600 may provide an interval size information 620, which may, for example, correspond to the interval size information 432 or which may correspond to the interval size information 534.

The interval size determination comprises a state variable update 640, which provides one or more updated state variables 642 on the basis of one or more previously determined state variables 644, taking into consideration the symbol value 610 and optionally taking into consideration the context information 612. The state variable update 640 may also consider one or more other parameters, which may, for example, be static or which may, for example, be adapted to the respective context in dependence on the context information. For example, the state variable update 640 may consider one or more weighting factors, i.e., $$m_i^k$$

and/or $$n_i^k.$$

The state variable update 640 may optionally also consider an "offset", e.g., z, and a lookup table e.g., A. Moreover, the state variable update 640 may, optionally, be initialized to starting values in response to an information signaling that a state variable initialization should be performed. In the case of a state variable initialization, the previously determined state variable value 644 may be neglected, and the "updated" state variables 642 may be set to an initial value, which may, for example, be predetermined.

Moreover, the interval size determination 600 comprises an interval size determination core, which determines the interval size information 620 on the basis of the updated state variables (or state variable values) 620. Moreover, the interval size determination core 650 may, for example, consider the coding interval size information 652, which may, for example, correspond to the coding interval size information 432 or to the coding interval size information 532.

Accordingly, the interval size determination core 650 may provide the interval size information, which describes a size of a subinterval associated with a certain symbol, on the basis of the coding interval size information 652 describing the total size of a coding interval, and on the basis of information about statistics of previously encoded or previously decoded symbols, which is represented by the one or more updated state variables 642.

However, it should be noted that the interval size determination 600 may be used in the arithmetic encoders and arithmetic decoders described herein. Furthermore, the interval size determination 600 may be supplemented by any of the features, functionalities and details disclosed herein. In particular, the state variable update may use any of the concepts disclosed herein. Furthermore, the interval size determination core may also use any of the concepts disclosed herein.

It should be noted that any of the concepts described herein for the state variable update may optionally be combined with any of the concepts for the interval size determination core disclosed herein. Any of the features, functionalities and details disclosed herein may optionally be introduced into the concept 600, both individually and taken in combination. It should be noted that any of the features, functionalities and details disclosed with respect to the determination of the interval size information 620 on the basis of the one or more updated state variables 642 may be used independently from any of the features, functionalities and details described with respect to the state variable update.

7. Interval Size Determination Concept According to FIG. 7

Figure 7:
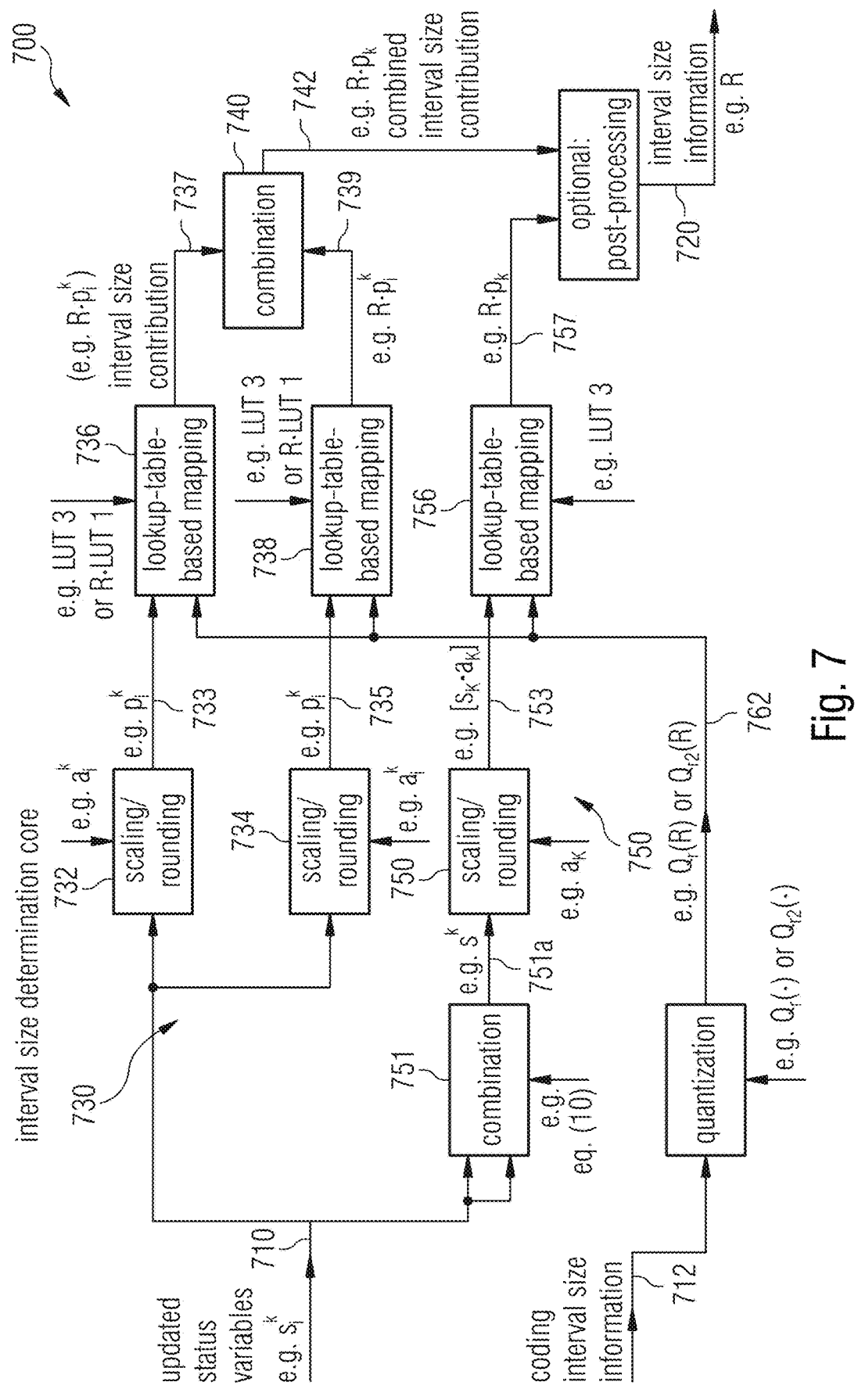
FIG. 7 shows a schematic representation of a concept for determining an interval size information, according to an embodiment of the invention.

FIG. 7 shows a schematic representation of an interval size determination concept 700. In particular, FIG. 7 shows a concept which may take the functionality of the "interval size determination core". In other words, the concept 700 according to FIG. 7 is suited for the provision of the interval size information on the basis of updated state variables and also on the basis of a coding interval size information. However, the concept 700 according to FIG. 7 may be implemented in an interval size determination or in an interval size determinator.

The interval size determination 700, which can be considered as an "interval size determination core", receives updated state variables 710, which may, for example, correspond to the updated state variables 642. Moreover, the interval size determination 700 receives a coding interval size information 712, which may, for example, correspond to a coding interval size information 652. Optionally, the interval size determination 700 also uses a context information, since the functionality of the interval size determination 700 may be adjusted in dependence on the context. For example, the context information may take the form of a context model index k. Thus, the specific functionalities or the parameters used in the interval size determination 700 may be adapted in dependence on the actual context, as represented by the context model index k.

The interval size determination 700 provides an interval size information 720, which may correspond to the interval size information 620.

Thus, the interval size determination 700 may, for example, take the place of the interval size determination core 650 described in FIG. 6.

In the following, some details of the interval size determination core 700 will be described.

It should be noted that the interval size determination core 700 comprises a first processing path 730 and a second processing path 750, which may be considered as alternatives. The first processing path 730 comprises an (optional) scaling/rounding 732, in which a first updated state variable (e.g., $$s_1^k)$$

is scaled and/or rounded. For example, a scaling factor $$a_1^k$$

may be used for the scaling of the first updated state variable (value). For example, the scaling may be a multiplication with the scaling factor. For example, the rounding may be a rounding down to the next integer value, which is smaller than or equal to the result of the scaling. Similarly, the first processing path 730 may comprise a second (optional) scaling/rounding 734, which may, for example, comprise a scaling of a second updated state variable (e.g., $$s_2^k)$$

with a respective scaling factor (e.g., $$a_2^k),$$

and which may also comprise a rounding down to a next integer value, which is smaller than or equal to the result of the scaling. Accordingly, a first scaled and rounded state variable 733 and a second scaled and rounded state variable 735 may be obtained. Moreover, the first processing path 730 may comprise a first lookup table based mapping 736, which receives the first scaled and/or rounded updated state variable 733 and which further receives a quantized coding interval size information 762. For example, the first lookup-table-based mapping 736 may use a two dimensional lookup table to obtain a first interval size contribution 737. Similarly, the first signal processing path 730 may comprise a second lookup-table-based mapping 738, which may receive the second scaled and/or rounded updated state variable 735 and the quantized coding interval size information 762 and provide, on the basis thereof, a second interval size contribution 739.

For example, the first lookup-table-based mapping 736 may use a two dimensional lookup table, wherein a first lookup table index may be determined by the scaled and/or rounded first updated state variable 733, and wherein a second lookup table index may be determined by the quantized coding interval size information 762. For example, the first scaled and/or rounded updated state variable 733 may take integer values in a certain range (e.g., from 0 to a maximum value, or from 1 to a maximum value, or within a range acceptable as a first table index). Similarly, the quantized interval size information 762 may take the form of integer values, which can serve as a second table index. For example, the quantized coding interval size information 762 may take the form of integer values in a range between 0 and a maximum value or between 1 and a maximum value (or within any range of values which can serve as a second table index). In other words, both the first scaled and/or rounded updated state variable 733 and the quantized coding interval size information 762 are used as table indices to select an element of the lookup table used in the lookup-table-based mapping 736. Accordingly, an entry of the used lookup table is provided as the first interval size contribution 737.

However, the second lookup-table-based mapping 738 may be performed in the same manner, wherein the scaled and/or rounded second updated state variable 735 and the quantized coding interval size information 762 are used as two indices (e.g., i and j) for the selection of an entry of the lookup table used in the second lookup-table-based mapping 738. Thus, a second interval size contribution 739 is obtained.

The first interval size contribution 737 and the second interval size contribution 739 may be combined in a combination 740, to thereby obtain a combined interval size contribution 742. The combined interval size contribution 742 may directly serve as the interval size information 720, or the interval size information 720 may be derived from the combined interval size contribution 742 using a post-processing (for example, a fixed scaling, or rounding, or the like.

To conclude, when using the first processing path 730, the interval size information 720 may be obtained by combining results of two or more lookup-table-based mappings 736, 738, wherein a respective entry of the lookup table to be used is determined both on the basis of the respective updated state variable and on the basis of the coding interval size information. Thus, the interval size information 720 can be obtained in a very efficient manner.

However, alternatively, the processing as shown in the second signal processing path 750 may be performed. The processing performed by the second signal processing path is even more computationally efficient, at the price of a slightly reduced accuracy. For example, the second signal processing path 750 comprises a combination 751, in which a first updated state variable and a second updated state variable (and optionally additional updated state variables) are combined, to thereby obtain a combined updated state variable 751a. The second processing path 750 also comprises an optional scaling/rounding 752, which may, for example, correspond to the scaling/rounding 732,734. Accordingly, the scaling/rounding 750 provides a scaled and/or rounded combined updated state variable 733, which is used to select an element in a lookup-table-based mapping 756. The lookup-table-based mapping 756 is advantageously a two dimensional mapping, wherein a first index of the lookup table is determined by the combined updated state variable 751a or the scaled and/or rounded version 753 thereof, and wherein a second index of the two dimensional lookup table is determined by the quantized coding interval size information 762. Accordingly, the lookup-table-based mapping 756 provides an interval size contribution 757, which may be used as the interval size information 752, or from which the interval size information 720 may be derived by an optional post-processing (for example, a scaling).

To conclude, the interval size determination core 700 is configured to obtain the interval size information 720 on the basis of the updated state variables 710 and under consideration of the coding interval size information 712. A lookup-table-based mapping is used in a first signal processing path 720 to determine two or more interval size contributions 737, 739, which are used to derive the interval size information 720. A lookup-table-based mapping 756 is used in an alternative second signal processing path 750 to determine the interval size contribution 757 or the interval size information 720. By using a lookup-table-based mapping, which considers both the updated state variables and the coding interval size information 712 to determine indices of the lookup table, a particularly efficient computation can be achieved, wherein it is possible to save multiplication operations.

It should be noted that the interval size determination core 700 according to FIG. 7 can be used in any of the arithmetic encoders and arithmetic decoders described herein. Moreover, the interval size determination core 700 can optionally be supplemented by any of the features, functionalities and the details disclosed herein, both individually and taken in combination.

8. Interval Size Determination Core According to FIG. 8

Figure 8:
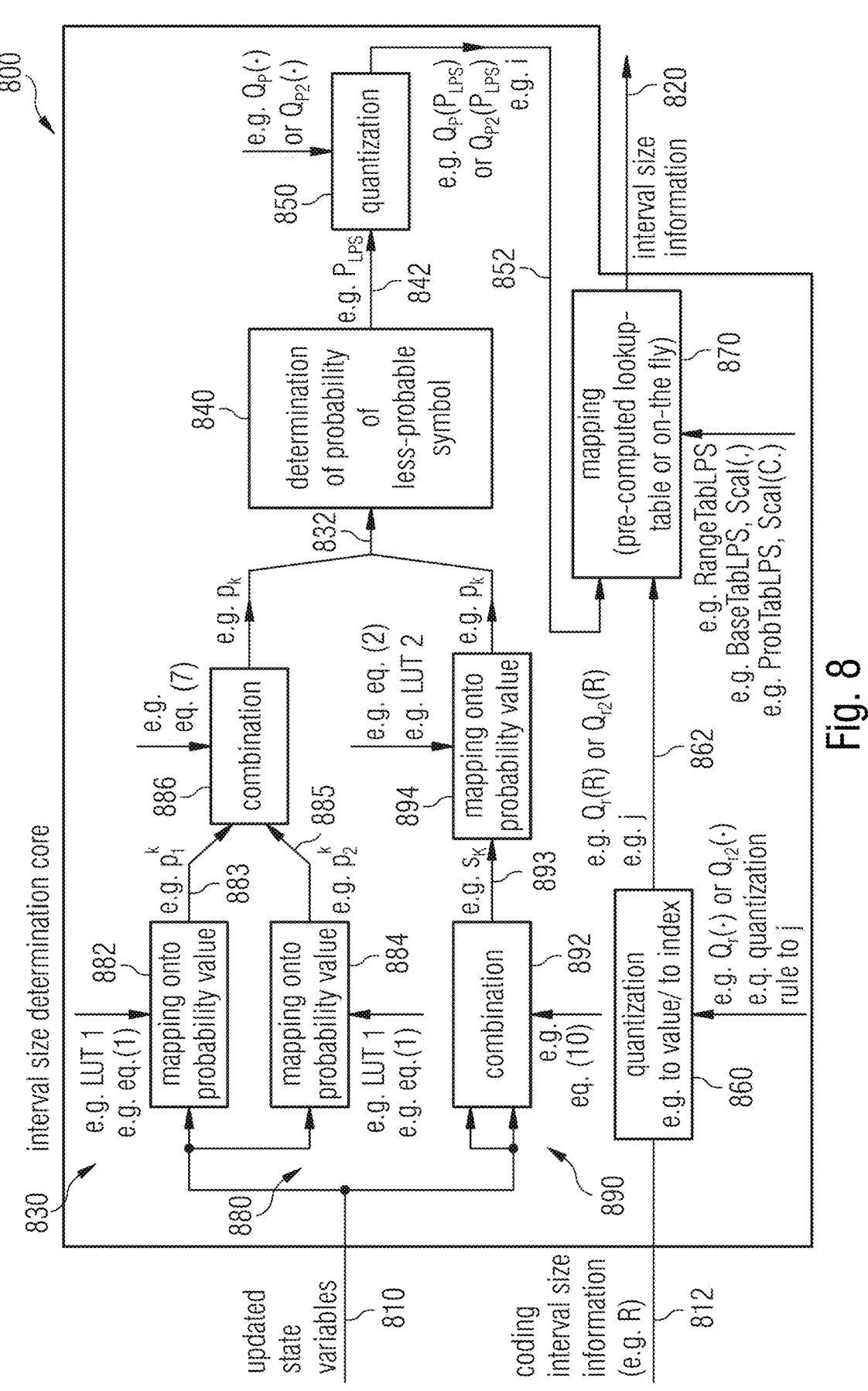
FIG. 8 shows a schematic representation of a concept for determining an interval size information, according to an embodiment of the invention.

FIG. 8 shows a block schematic diagram of an interval size determination core 800, according to an embodiment of the present invention. The interval size determination core 800 according to FIG. 8 may be used in any of the audio encoders and audio decoders disclosed herein.

The interval size determination core 800 receives updated state variables 810 and also a coding interval size information 812. The updated state variables 810 may, for example, correspond to the updated state variables 710 or to the updated state variables 642. The coding interval size information 812 may, for example, correspond to the coding interval size information 712 or to the coding interval size information 652 or to the coding interval size information 532 or to the coding interval size information 434. Moreover, the interval size determination core 800 provides an interval size information 820, which may correspond to the interval size information 720 or to the interval size information 620 or to the interval size information 534 or to the interval size information 432.

The interval size determination core 800 may, for example, comprise a determination 830 of a probability value 832. The probability value 832 may, for example, be obtained on the basis of one or more updated state variables 810 and may, for example, describe the probability of a symbol (e.g., "0" or "1") to be encoded. The interval size determination core 830 further comprises a determination 840 of a probability of a less-probable symbol (or of a least-probable symbol), which may provide a probability value 842 describing a probability of a less-probable symbol or of a least probable symbol. The interval size determination core 800 also comprises a quantization 850, which quantizes the probability value 842 to obtain a quantized probability value 852. Moreover, the interval size determination core 800 also comprises a quantization 860, which quantizes the coding interval size information, to obtain a quantized coding interval size information 862. The interval size determination core 800 also comprises a mapping 870, which receives the quantized probability value 852 and the quantized coding interval size information 862 and maps both the quantized probability value 852 and the quantized coding interval size information 862 onto the interval size information 820.

During the following, some details regarding the functionality of the interval size determination core 800 will be described.

The determination 830 of the probability value 832 may, for example, comprise a first signal processing path 880 or a second signal processing path 890. It should be noted that the signal processing paths 880, 890 may be considered as alternatives. The first signal processing path 880 comprises a first mapping 882, which maps a first updated state variable 810 onto a first probability value 883, for example, using a lookup table. The first signal processing path 880 also comprises a second mapping 884, which maps a second updated state variable 810 onto a second probability value 885, for example, using a lookup table. The first signal processing path 880 also comprises a combination 886, which may, for example, be configured to combine the first probability value 883 and the second probability value 885, for example, using a linear combination wherein different scaling may be applied to the first probability value 883 and the second probability value 885 (and wherein, optionally, a quantization may be used). Accordingly, the combination 886 provides the probability value 832.

Alternatively, the second signal processing path 890 may be used. The second signal processing path 890 comprises a combination 892, which receives two or more updated state variables 810 and which provides, on the basis thereof, a combined updated state variable 893 (for example, using a linear combination). Moreover, the second signal processing path 890 comprises a mapping 894, which maps the combined updated state variable 893 onto the probability values 832, for example, using a lookup table.

Thus, it is possible to obtain the probability value 832 either using the first signal processing path 880 or using the second signal processing path 890, which can be considered as two different alternatives. The first signal processing path brings along a slightly increased complexity, since there are two mappings 882, 884 and also a slightly increased accuracy. In contrast, the second signal processing path 890 only comprises a single mapping and is therefore slightly less complex, at the cost of a slightly reduced accuracy.

In the determination 850 of a probability of a less-probable symbol, the probability of a less-probable symbol may be determined, for example, by choosing a smaller value out of the probability value 832 and a compliment (1 minus probability value) of the probability value. Accordingly, a probability value 842 describing a probability of a less-probable symbol is obtained. This probability value 842 is quantized in the quantization 850, for example, using a quantization function $Q_p(\bullet)$ or $Qp_2(\bullet)$. Accordingly, a quantized probability value or a probability index i 852 is obtained and used in the mapping 870.

The quantization 860 of the coding interval size information 812 may, for example, provide a quantized coding interval size value 862 or a quantized coding interval size index j. However, in some cases, both are quantized coding interval size value $Q_r(R)$ and the coding interval size index j may be obtained, which may, for example, both be used in the mapping 860. The mapping 860 may, for example, use a mapping mechanism, which is based on the lookup table RangeTabLPS described herein, and/or which may be based on the lookup table BaseTabLPS described herein and/or which may use the lookup table ProbTabLPS described herein. Optionally, a scaling function $Scal(\bullet)$, which is described herein, may also be used in the mapping 870.

In other words, there may be a number of different mappings which can be used to derive the interval size information 820 on the basis of the quantized probability value or probability index 852 and on the basis of the quantized coding interval size 862 and/or the coding interval size index j.

As an additional remark, it should be noted that the quantization 850 may, for example, map the probability value 842 (or, alternatively, if the determination 840 is omitted, the probability value 832) onto an integer value. Alternatively, the quantization 850 may map the value 842 (or, alternatively, the value 832, if the determination 840 is optionally omitted) onto a value having a lower numeric resolution than the probability value 832 or the probability value 842. However, it is advantageous that the quantized probability value 852 takes the form of a probability index (e.g. i), i.e., the form of an integer number representation, which can be used as a table index to designate entries of a lookup table (e.g. RangeTabLPS).

The quantization 860 may bring along different results. The coding interval size information 812 may, for example, be quantized into a quantized coding interval size information 862 which comprises a lower resolution than the coding interval size information 812. In other words, intervals of values of the coding interval size information 812 may be mapped onto individual quantized values of the quantized coding interval size information 862, wherein the quantization may, for example, be linear or non-linear. Alternatively or in addition, the coding interval size information may be mapped onto coding interval size indices j, i.e., onto a continuous range of integer values, which can be used directly as table indexes for selecting an entry of a lookup table. However, it should be noted that, in some cases, both a quantized coding interval size information, quantized to different values, and a quantized coding interval size information quantized to different indices j (i.e., to subsequent integer values) may be used.

As mentioned above, the mapping 870 may be made using different concepts, which are described herein.

To conclude, the interval size determination core 800 may be used in any of the arithmetic encoders and arithmetic decoders described herein. Moreover, the interval size determination core 800 can optionally be supplement by any of the features, functionalities and details disclosed herein, both individually and taken in combination.

9. Interval Size Determination Core According to FIG. 9

Figure 9:
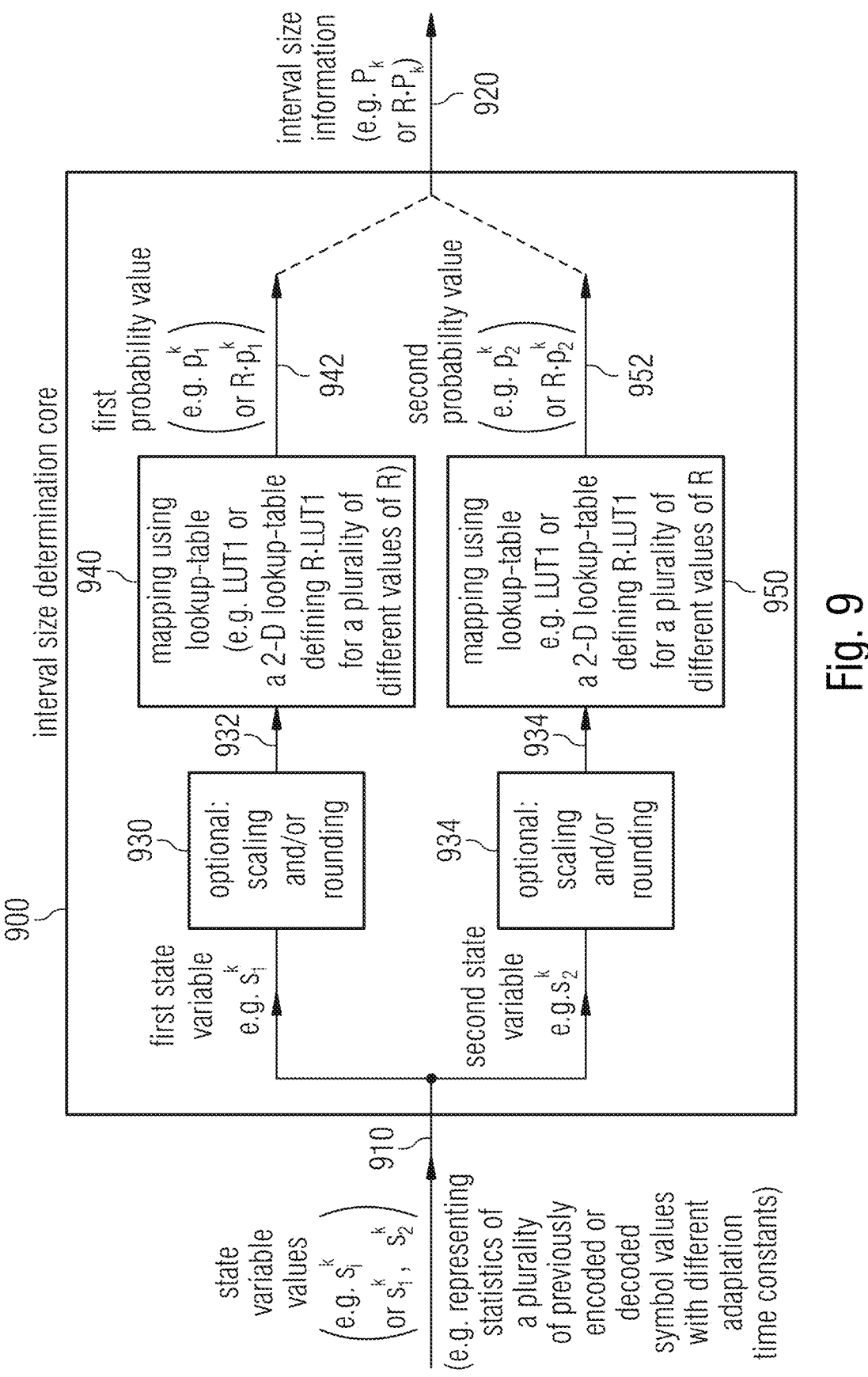
FIG. 9 shows a schematic representation of a concept for determining an interval size information, according to an embodiment of the invention.

FIG. 9 shows a block schematic diagram of an interval size determination core 900, which is usable in any of the arithmetic encoders and arithmetic decoders disclosed herein.

The interval size determination core 900 is configured to receive state variable values 910 and to provide an interval size information 920. Generally speaking, the interval size determination core 900 is configured to derive the interval size information 920 for an arithmetic encoding of one or more symbol values to be encoded (or for an arithmetic decoding of one or more symbol values to be decoded) on the basis of a plurality of state variable values 910, which represents statistics of a plurality of previously encoded symbol values with different adaptation time constants. The interval size determination core 900 comprises an optional first scaling and/or rounding 930 in which a first state variable (which may be an updated state variable) is scaled and/or rounded. The interval size determination core 900 also comprises an optional second scaling and/or rounding 934, in which a second state variable is scaled and/or rounded. Accordingly, the optional first scaling and/or rounding provides a first scaled and/or rounded state variable 932, and the optional second scaling and/or rounding 934 provides a second scaled and/or rounded state variable 934.

The interval size determination core 900 also comprises a first mapping 940 which uses a look-up table. The first mapping 940 maps the first state variable, or a scaled and/or rounded version 932 of the first state variable, using a look-up table (for example, look-up table LUT1 or a two-dimensional look-up table defining R·LUT1 for a plurality of different values of R). Accordingly, a first probability value 942 is obtained by the first mapping 940. The interval size determination core 900 also comprises a second mapping 950, which maps a second state variable, or a scaled and/or rounded version 934 thereof, using a look-up table (for example, using the look-up table LUT1 or a two-dimensional look-up table defining R·LUT1 for a plurality of different values of R). Accordingly, a second probability value 952 is obtained by the second mapping 950 on the basis of the second state variable value, or on the basis of the scaled and/or rounded version 934 thereof.

Finally, the interval size information 920 is obtained on the basis of the first probability value 942 and on the basis of the second probability value 952.

However, it should be noted that the determination of the first probability value 942 and of the second probability value 952 should only be considered as an example of which quantities can be obtained using the first mapping 940 and the second mapping 950. In contrast, it would be possible to also derive other quantities using the first mapping 940 and the second mapping 950, like, for example, contributions to the interval size information 920.

However, it should be noted that the interval size determination core 900 described in FIG. 9 can be used in any of the arithmetic encoders or arithmetic decoders disclosed herein. Moreover, it should be noted that the interval size determination core 900 can optionally be supplemented by any of the features, functionalities and details described herein, both individually and taken in combination.

10. Interval Size Determination According to FIGS. 10a and 10b

Figures 10A, 10B:
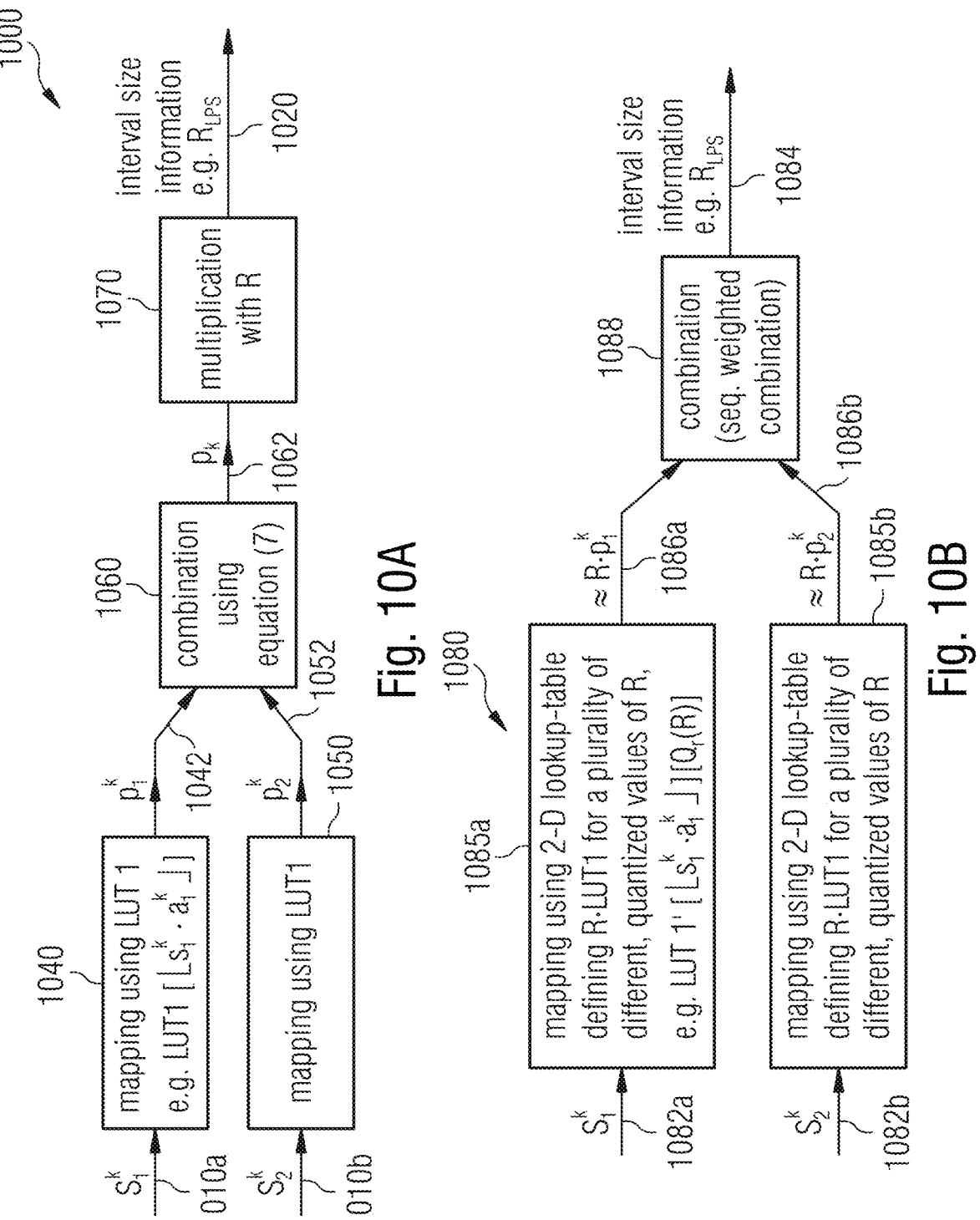
FIGS. 10a and 10b shows schematic representations of concepts for determining an interval size information, according to embodiments of the present invention.

FIG. 10a shows a schematic representation of a concept for a determination of an interval size information, which can be used, for example, in the interval size determination core.

As can be seen, the concept of FIG. 10*a* receives a plurality of state variable values 1010*a*, 1010*b*, which may correspond to the state variable values 910 and which may be updated state variable values. Moreover, the concept 1000 provides an interval size information 1020, which may correspond to the interval size information 920. The concept 1000 comprises a first mapping 1040, which maps the first state variable value 1010*a* (or a scaled and/or rounded version thereof) onto a first probability value 1042, which may correspond to the first probability value 942. Furthermore, the concept 1000 comprises a second mapping 1050, which maps the second state variable value 1010*b* (or a scaled and/or rounded version thereof) onto the second probability value 1052. Furthermore, the concept 1000 comprises a combination of the first probability value 1042 and of the second probability value 1052, wherein this combination may, for example, be performed using equation (7). Accordingly, the combination 1060 provides a combined probability value 1062. Moreover, the concept 1000 comprises a multiplication 1070 of the combined probability value 1062, wherein the multiplication may be made with a coding interval size value R. Accordingly, an interval size information 1020 is obtained on the basis of the multiplication 1070 between the combined probability value 1062*a* and the coding interval size value R. The interval size information 1020 may, for example, describe a size of a coding interval associated with a less probable symbol or with a least probable symbol (or, alternatively, a size of a coding interval associated with a more probable symbol or with a most probable symbol). Optionally, the concept 1000 may comprise a mechanism for deriving the probability of the less probable symbol or of the least probable symbol (for example, between the combination 1060 and the multiplication 1070), or may comprise a mechanism for deriving the interval size information associated with the less probable symbol or with the least probable symbol on the basis of the result of the multiplication 1070.

Thus, the concept 1000 according to FIG. 10*a* may implement the functionality as described with respect to FIG. 9.

It should be noted that the concept 1000 may be used in any of the arithmetic encoders or arithmetic decoders disclosed herein.

Also the concept 1000 may optionally be supplemented by any of the features, functionalities and details disclosed herein, both individually and taken in combination.

FIG. 10*b* shows a block schematic diagram of a concept 1080 for providing an interval size information 1084 on the basis of a first state variable value 1082*a* and a second state variable value 1082*b*. The concept 1080 comprises mapping 1085*a* the first state variable value 1082*a*, or a scaled and/or quantized version thereof, onto a first interval size contribution 1086*a*. Moreover, the concept 1080 comprises a second mapping 1085*b*, which maps the second state variable value 1082*b*, or a scaled and/or quantized version thereof, onto a second interval size contribution 1086*b*.

The first mapping 1085*a* and the second mapping 1085*b* may, for example, use a two-dimensional look-up table to perform said mapping. The two-dimensional look-up table may, for example, define a product between a quantized value of the coding interval size information R and a one-dimensional look-up table (e.g. LUT1) for a plurality of different values of R. In other words, each row or each column of the two-dimensional look-up table, which is used in the mapping 1085*a*, may define a product between the look-up table LUT1, as described herein, and a respective coding interval size value associated with said row or column. The same may also hold for the two-dimensional look-up table used in the second mapping 1085*b*, wherein said look-up table may be identical to the look-up table used in the first mapping 1085*a* or may differ from said look-up table. Moreover, it should be noted that the coding interval size information may be used in the first mapping 1085*a* and in the second mapping 1085*b*, to select an appropriate element of the two-dimensional look-up table (wherein, for example, a first look-up table index may be based on the respective state variable value, and wherein a second look-up table index may be based on the coding interval size value (or a quantized version $Qr(R)$) thereof).

Accordingly, the interval size information 1084 can be obtained with very low computational complexity. Moreover, it should be noted that an appropriate processing may be inserted between the mappings 1085*a*, 1085*b* and the combination 1088, in which the interval size contributions 1086*a*, 1086*b* are combined, to determine a contribution to an interval size of an interval associated with a less probable symbol or a least probable symbol. Alternatively, however, a post-processing may optionally be inserted after the combination 1088, to determine an interval size for a least probable symbol or for a less probable symbol on the basis of the result of the combination 1088 of the interval size contributions 1086*a*, 1086*b*.

To conclude, the concept 1080 according to FIG. 10*b* can be used to derive the interval size information 1086 on the basis of the state variable values 1082*a*, 1082*b* and also in dependence on the coding interval size information or coding interval size value.

Moreover, it should be noted that the concept 1080 can be used in any of the arithmetic encoders or arithmetic decoders disclosed herein.

Moreover, it should be noted that the concept 1080 of FIG. 10*b* can optionally be supplemented by any of the features, functionalities and details disclosed herein, both individually and taken in combination.

11. Interval Size Determination Core According to FIG. 11

Figure 11:
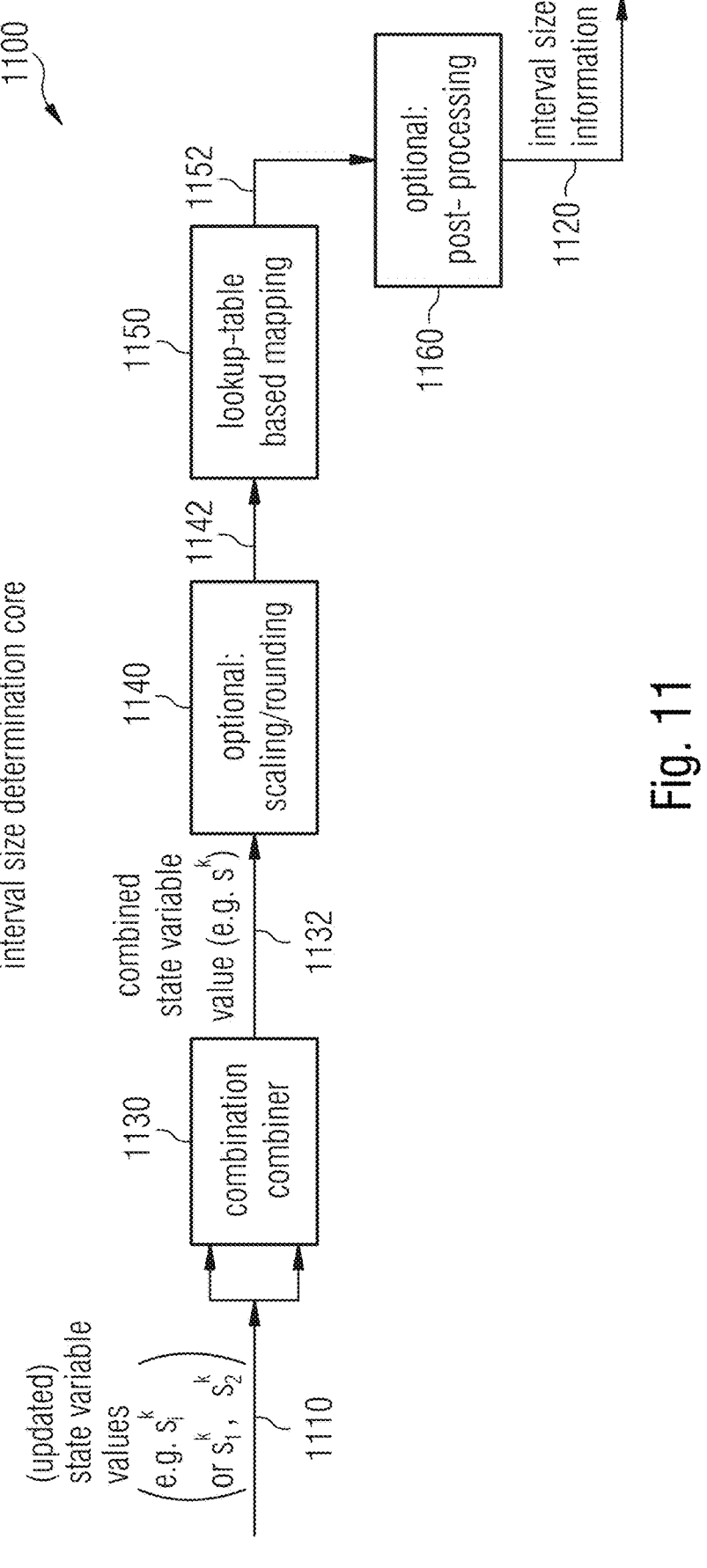
FIG. 11 shows a schematic representation of a concept for determining an interval size information, according to an embodiment of the invention.

FIG. 11 shows a block schematic diagram of an interval size determination core 1100, according to an embodiment of the present invention.

The interval size determination core receives a plurality of (typically updated) state variable values 1110 and provides, on the basis thereof, an interval size information 1120. Generally speaking, the interval size determination core 1100 is configured to derive an interval size information for an arithmetic encoding of one or more symbols to be encoded (or for an arithmetic decoding of one or more symbol values to be decoded) on the basis of a plurality of state variable values 1110, which represent statistics of a plurality of previously encoded (or previously decoded) symbol values with different adaptation time constants. The interval size determination core 1100 comprises a combination/combiner 1130, which is configured to derive a combined state variable value 1132 on the basis of the plurality of state variable values 1110. Optionally, the interval size determination core 1100 comprises a scaling and/or rounding 1140, which scales and/or rounds the combines state variable value 1132, to obtain a scaled and/or rounded combined state variable value 1142. Moreover, the interval size determination core 1100 comprises a look-up table based mapping 1150, which is configured to map the combined state variable value 1132, or the scaled and/or rounded version 1142 thereof, using a look-up table, in order to obtain the interval size information describing an interval size (e.g., a size of an interval associated with a specific symbol, like, for example, a less-significant symbol or a more-significant symbol) for the arithmetic encoding/decoding. However, optionally, a post-processing 1160 may be used to derive the interval size information 1120 on the basis of a result 1152 of the look-up-table-based mapping 1150.

It should be noted that the interval size determination core 1100 can be used in any of the arithmetic encoders and arithmetic decoders disclosed herein. Moreover, it should be noted that the interval size determination core 11 can optionally be supplemented by any of the features, functionalities and details disclosed herein.

12. State Variable Update According to FIG. 12

Figure 12:
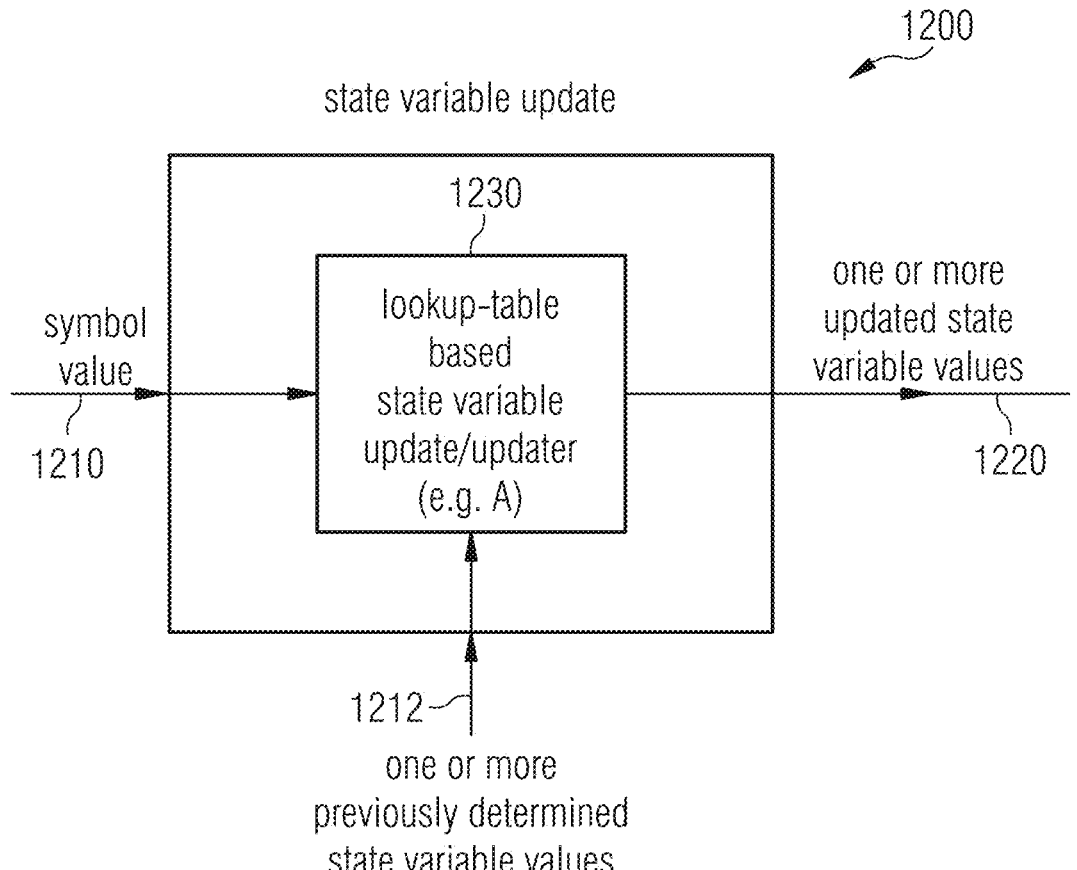
FIG. 12 shows a schematic representation of a concept for determining one or more updated state variables, according to an embodiment of the invention.

FIG. 12 shows a block schematic diagram of a state variable update, according to an embodiment of the present invention. The state variable update 1200 (which may also be considered as a state variable updater) is configured to receive a symbol value 1210, which may be a symbol value of a symbol to be encoded or a symbol value of a previously decoded symbol (or a symbol value of a previously encoded symbol). Moreover, the state variable update 1200 may be configured to receive one or more previously determined state variable values 1212 and to provide one or more updated state variable values 1220. In particular, the state variable update 1200 may be configured to update a first state variable value in dependence on a symbol value (for example, representing a symbol to be encoded or a previously encoded symbol or a previously decoded symbol) and using a look-up table. In other words, the state variable update 1210 may comprise a look-up-table-based state variable update or look-up-table-based state variable updater 1230. Thus, an updated state variable value may be provided on the basis of a corresponding previously determined state variable value and taking into consideration a symbol value, which is based on a symbol to be encoded or on a previously encoded symbol or on a previously decoded symbol.

Accordingly, the state variable update 1200 may provide one or more updated state variable values. If a plurality of updated state variable values are to be determined, the look-up-table-based state variable update may be performed individually for each state variable value (wherein, however, the same mechanism and/or the same look-up table may be used, possibly with different scaling parameters and/or quantization functionality).

However, the state variable update 1200 described here may be used in any of the arithmetic encoders and arithmetic decoders disclosed herein. However, it should be noted that the state variable update 1200 may optionally be supplemented by any of the features, functionalities and details disclosed herein, both individually and taken in combination.

13. Interval Size Determination Core According to FIG. 13

Figure 13:
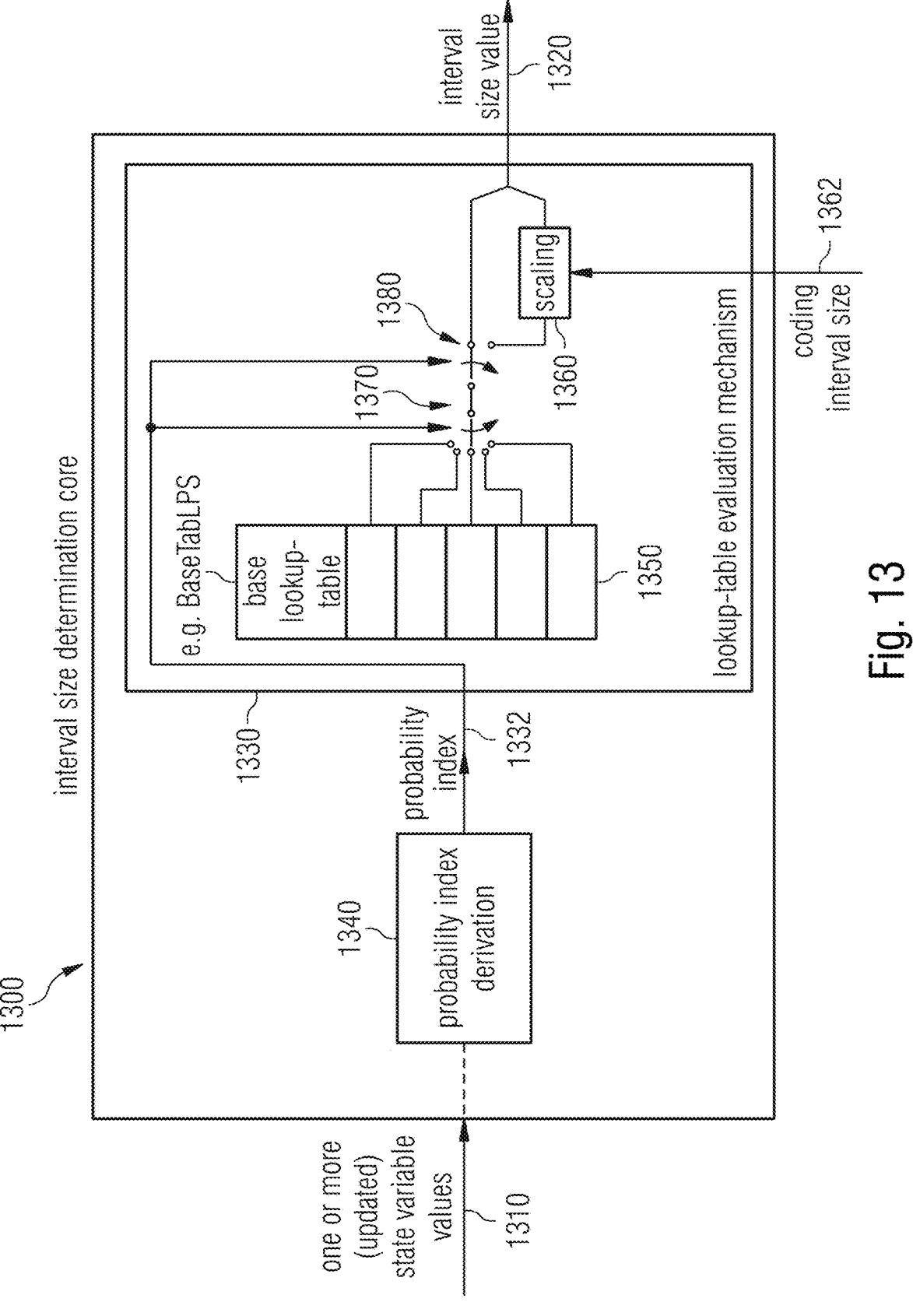
FIG. 13 shows a schematic representation of a concept for a determination of an interval size value, according to an embodiment of the invention.

FIG. 13 shows a block schematic diagram of an interval size determination core 1300, according to an embodiment of the invention.

The interval size determination core receives one or more state variable values 1310, which may, for example, be updated state variable values. Furthermore, the interval size determination core provides, on the basis of the one or more state variable values 1310, an interval size value 1320.

The interval size determination core comprises a look-up table evaluation mechanism 1330, which receives a probability index 1332, which may be based on the one or more state variable values 1310, and which provides the interval size value 1320.

For example, the probability index 1332 may be derived from the one or more (updated) state variable values using a probability index derivation 1340 (which may comprise a scaling and/or a rounding and/or a quantization).

For example, the one or more updated state variable values 1310 may be determined in an arithmetic encoder or in an arithmetic decoder, as disclosed herein, and may represent statistics of a plurality of previously encoded symbol values.

Generally speaking, the interval size determination core 1300 is configured to determine the interval size value 1320 using a base look-up table 1350. The look-up table evaluation mechanism may be configured to determine the interval size value 1320, such that a determined interval size value is identical to an element of the base look-up table 1350 or to a rounded version of an element of the base look-up table 1350, if a probability index 1332, which is obtained on the basis of one or more state variable values, is within a first range, and such that a determined interval size value is obtained using a scaling 1360 (and optionally a rounding) of an element of the base look-up table 1350 if the probability index 1332 is in a second range. Accordingly, the interval size value 1320 may be used to perform an arithmetic encoding or an arithmetic decoding of one or more symbols.

In other words, the probability index 1332, which may be derived from the one or more (updated) state variable values, for example, as shown in FIG. 8 (first signal processing path 880 or second signal processing path 890, in combination with optional determination 840 and quantization 850), may be used to decide whether an entry of the base look-up table is used "as is" or with a scaling 1360 (which may be determined by the probability index 1332).

In other words, the probability index 1332 may both decide which element of the base look-up table 1350 is selected, as indicated at reference numeral 1370 in a schematic manner, and whether a scaling of this selected entry of the base look-up table 1350 is performed or not, as shown symbolically at reference numeral 1380. For example, the selection of an entry of the base look-up table 1370 may be determined by one or more least significant bits of the probability index 1332, and the decision whether the scaling 1360 is performed may be made on the basis of one or more most significant bits of the probability index 1332. However, rather than evaluating groups of bits, the selection of an entry of the base look-up table 1350 may be determined by a division residual of a division of the probability index 1332 with a predetermined value, and the decision whether a scaling 1360 is performed or not may be made in dependence on a determination in which range out of a plurality of ranges a currently considered probability index value lies.

Moreover, it should be noted that, optionally, a coding interval size information (e.g., R) may be considered in the selection of an entry of the base look-up table 1350, for example, if the base look-up table is a two-dimensional table. In another optional alternative, the coding interval size information (for example, R) may be used to determine whether an additional scaling, which is dependent on the coding interval size information, should be performed (e.g. applied to a selected entry of the base lookup table) or not, in order to obtain the interval size value 1320.

However, it should be noted that the interval size determination core 1300 described here can be used in any of the arithmetic encoders and arithmetic decoders disclosed herein to derive the interval size value.

Moreover, it should be noted that the interval size determination core 1300 can optionally be supplemented by any of the features, functionalities and details disclosed herein.

14. Interval Size Determination Core

Figure 14:
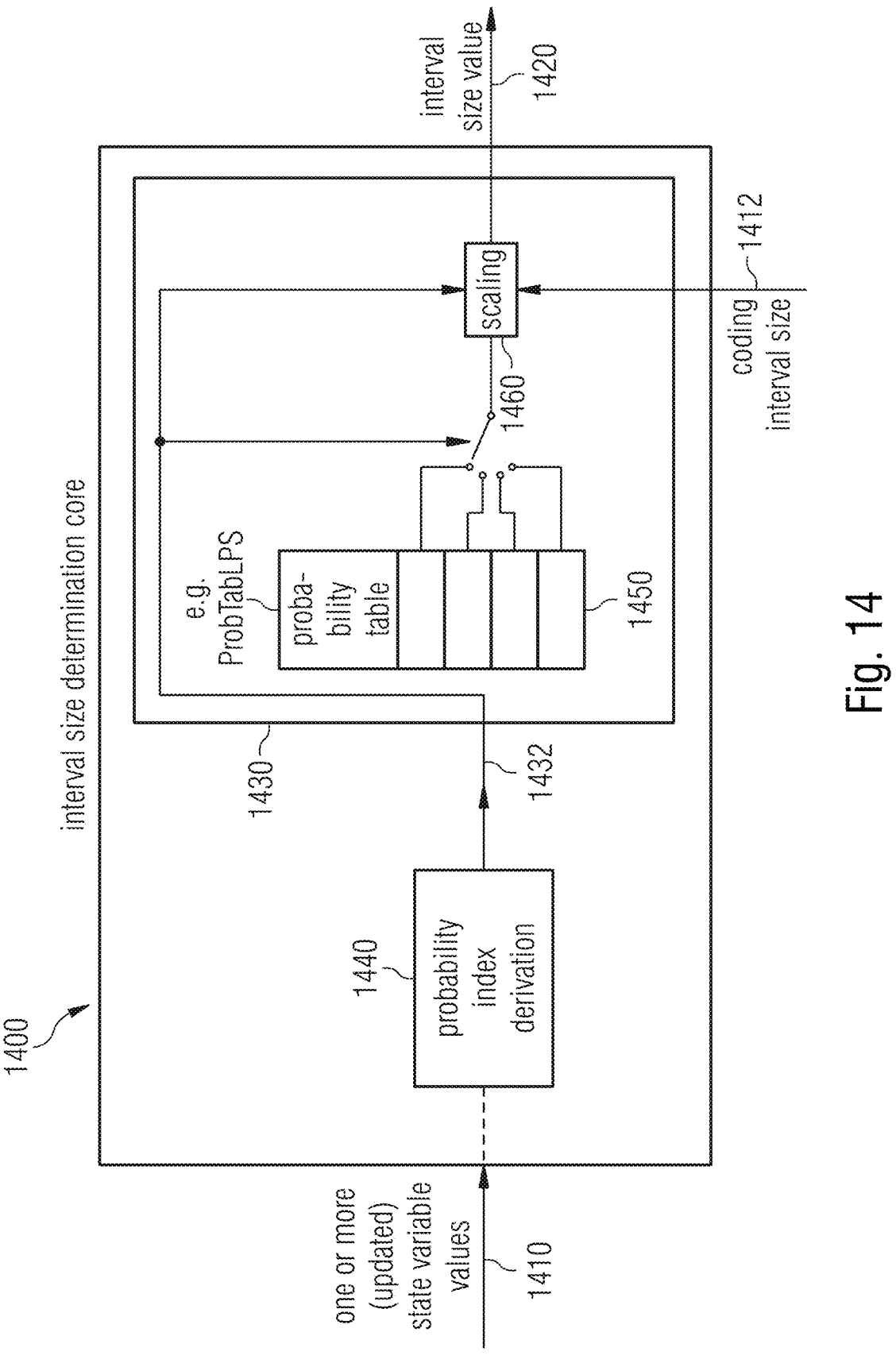
FIG. 14 shows a schematic representation of a concept for a determination of an interval size value, according to an embodiment of the invention.

FIG. 14 shows a block schematic diagram of an interval size determination core 1400, according to an embodiment of the present invention.

The interval size determination core 1400 receives one or more state variable values 1410, which may, for example, be updated state variable values. Furthermore, the interval size determination core 1400 provides, on the basis of the one or more state variable values 1410, an interval size value 1420.

The interval size determination core 1400 comprises a lookup table evaluation mechanism 1430, which receives a probability index 1432, which may be based on the one or more state variable values 1410, and which provides the interval size information or interval size value 1420.

For example, the probability index 1432 may be derived from the one or more (updated state variable values using a probability index derivation 1440.

For example, the one or more updated state variable values 1410 may be determined in an arithmetic encoder or in an arithmetic decoder, as disclosed herein, and may represent statistics of a plurality of previously encoded symbol values and/or a plurality of previously decoded symbol values.

Generally speaking, the interval size determination core 1400 is configured to determine the interval size value 1420 using a probability table (e.g., ProbTabLPS) on the basis of a probability value (e.g., the probability index 1432) derived from the one or more state variable values 1410 and on the basis of a coding interval size (for example, described by the coding interval size information 1412). For example, the probability table 1450 describes interval sizes for a set of a plurality of different probability values (or probability indices 1432) and for a given coding interval size (for example, for a single given reference coding interval size). As can be seen in FIG. 14, the probability index 1432 may, for example, be used to select which element of the probability table should be used as the basis for the provision of the interval size value 1420. Worded differently, the probability index 1432 determines the selection of an element of the probability table for the further processing. Moreover, the probability index 1432 is determined, by which value the selected entry of the probability table is scaled in a scaling 1460. Generally speaking, the interval size determination core may be configured to scale an element or entry of the probability table (for example, an element selected in dependence on the current probability value or probability index 1432) if a current probability value is not a set of a plurality of probability values and/or if a current coding interval size is different from the given (reference) coding interval size. In other words, the interval size value 1420 may be derived from the selected entry of the probability table 1450 using the scaling 1460, wherein the scaling may be dependent both on the probability value or probability index 1432 and on the coding interval size information 1412.

For example, the entries of the probability table 1450 may be associated with a single coding interval size and with a given range of probability values or probability indices (wherein this range may typically cover three or even more different probability values or probability indexes, wherein a number of entries of the probability table may advantageously be a potency of two, to facilitate the computation operation). The scaling 1460 may, for example, scale the selected entry of the probability table 1460 if the coding interval size 1412 differs from the reference coding interval size to which the entries of the probability table 1450 are associated. In other words, if the actual coding interval size 1412 differs from the reference coding interval size (for example, the coding interval size to which the entries of the probability table 1450 are associated), the scaling 1460 may consider this deviation (at least if the deviation between the reference coding interval size and the actual coding interval size 1410 exceeds a size of a quantization interval which is used for quantizing the coding interval size). Moreover, the scaling 1460 may also consider whether the probability value or probability index 1432 lies outside a range of probability values or probability indices to which the entries of the probability table 1450 are associated. For example, if the entries of the probability table 1450 are associated with a first range of probability indices but the actual probability index 1432 lies within a second range of indices which does not overlap with the first range of probability indices, the scaling 1460 may consider this finding and apply an additional scaling (in addition to the scaling which is based on a deviation of the actual coding interval size from the reference coding interval size).

To conclude, the interval size determination core 1400 may provide a selected entry of the probability table 1450 as the interval size value 1420 if the probability value or probability index 1432 lies within the set of a plurality of probability values, for which the probability table entries are provided, and if the actual coding interval size 1412 is equal to the reference coding interval size (or quantized to a value which is equal to the reference coding interval size). On the other hand, if the probability value or probability index 1432 lies outside of the "set of a plurality of probability values" for which the probability table entries are provided and/or if the actual coding interval size 1412 deviates from the reference coding interval size (for example, by that much that the actual coding interval size is quantized to a different value), the scaling 1460 scales the selected entry of the probability table 1450, in order to obtain the interval size value 1420.

Accordingly, the interval size value 1420 can be obtained using a comparatively small lookup table 1450, which may, for example, be a one-dimensional probability table, a number of entries of which is smaller (for example, at least by a factor of 2) then a number of different possible probability values or probability index values.

However, it should be noted that the interval size determination core 1400 may optionally be supplemented by any of the features, functionalities and the details described herein. Moreover, it should be noted that the interval size determination core 1400 may optionally be used in any of the arithmetic encoders or arithmetic decoders disclosed herein, and also in any of the video encoders or video decoders disclosed herein.

15. Interval Size Determination Core According to FIG. 15

Figure 15:
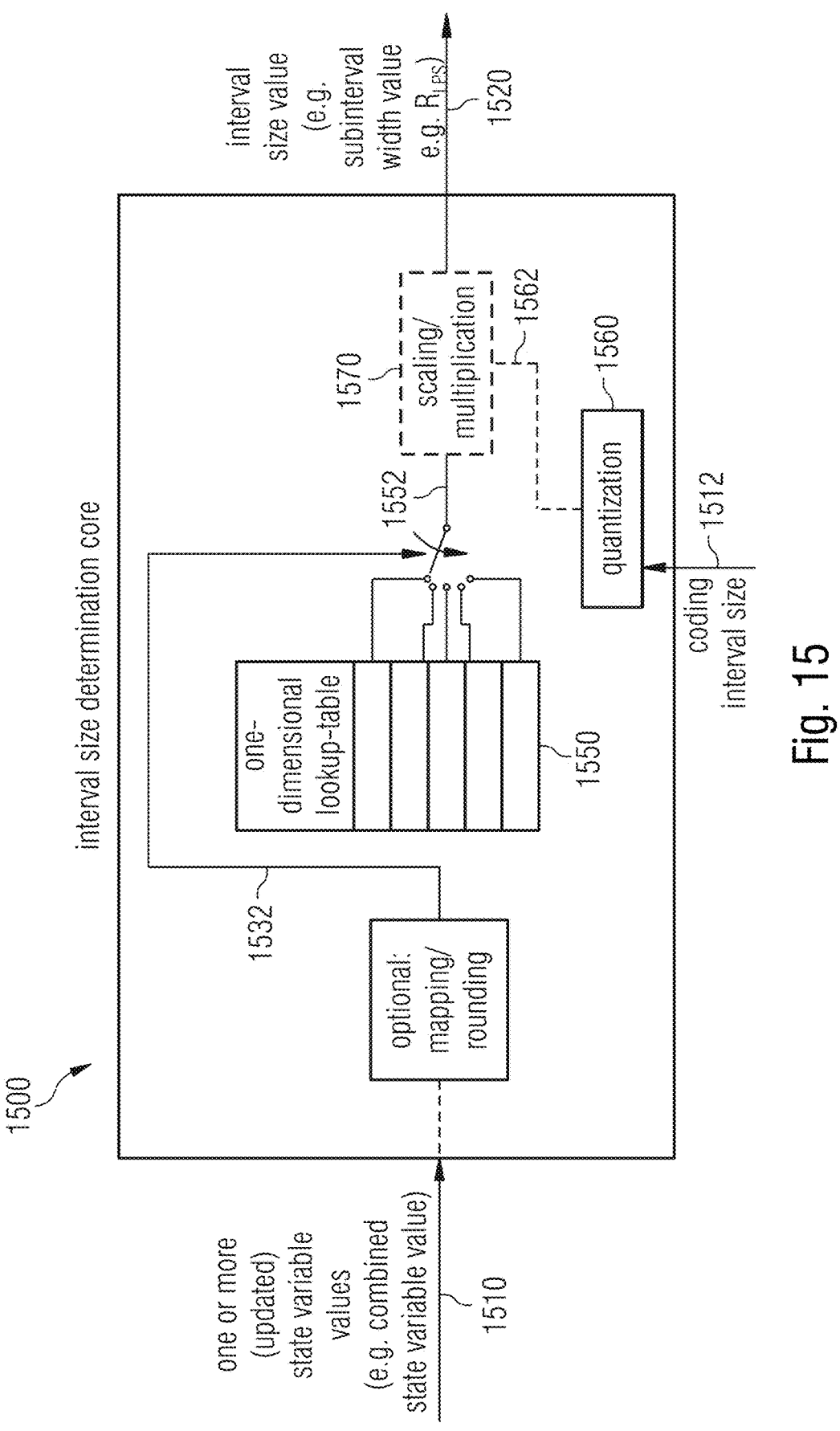
FIG. 15 shows a schematic representation of a concept for a determination of an interval size value, according to an embodiment of the invention.

FIG. 15 shows a block schematic diagram of an interval size determination core 1500, according to an embodiment of the invention.

The interval size determination core 1500 is configured to receive one or more state variable values, which may, for example, be updated state variables values. For example, the one or more state variable values 1510 may comprise a combined state variable value. Moreover, the interval size determination core 1500 is configured to provide an interval size value 1520, which may, for example, be a subinterval width value, e.g. R$_{LPS}$.

The interval size determination core 1500 comprises an optional mapping and/or rounding, which is used to determine one state variable value, which represents a statistic of a plurality of previously handled (for example, previously encoded or previously decoded) symbol values. Generally speaking, the arithmetic encoder is configured to compute from the combined state variable value (for example, from one updated combined state variable value 1510), or from a scaled and/or rounded version thereof, a subinterval width value (for example, an interval size value 1520) for an arithmetic encoding or for an arithmetic decoding of a symbol value to be encoded or to be decoded. The interval size determination core 1500 comprises, for example, a one-dimensional lookup table 1550 which is used for mapping the one state variable value (for example, the combined state variable value), or a scaled and/or rounded version thereof, onto a probability value. For example, entries of the one dimensional lookup table 1550 comprise probability values for different value intervals of a value domain for the combined state variable value. Moreover, the interval size determination core comprises a quantization 1560, which is configured to quantize a coding interval size information 1512 describing a size of a coding interval of an arithmetic encoding or of an arithmetic decoding (for example, before the arithmetic encoding of the symbol value to be encoded, or before the arithmetic decoding of the symbol value to be decoded) onto a quantization level. Accordingly, a quantized coding interval size information 1562 is provided. Furthermore, there is a scaling/multiplication 1570, which determines a product (for example, using a lookup of precomputed products, or using multiplication) between the probability value and the quantization level (or, more precisely, the quantized coding interval size information 1562). For example, a probability value is provided by selecting an entry of the one dimensional lookup table 1550 in dependence on the state variable value or the scaled and/or rounded version thereof. This probability value 1552 may then be scaled in dependence on the (quantized) coding interval size information 1562 (i.e., in dependence on the "quantization level"), wherein the scaling may correspond to a determination of a product between the probability value and the quantization level. Accordingly, the interval size value 1520 is provided in an efficient manner, wherein it is sufficient to use a one dimensional lookup table.

However, it should be noted that the interval size determination core 1500 described here can optionally be supplemented by any of the features, functionalities and details disclosed herein, both individually and taken in combination. Moreover, it should be noted that the interval size determination core 1500 now can be used in any of the arithmetic encoders and arithmetic decoders described herein, also in any of the video encoders and video decoders described herein.

16. Video Decoder According to FIG. 16

Figure 16:
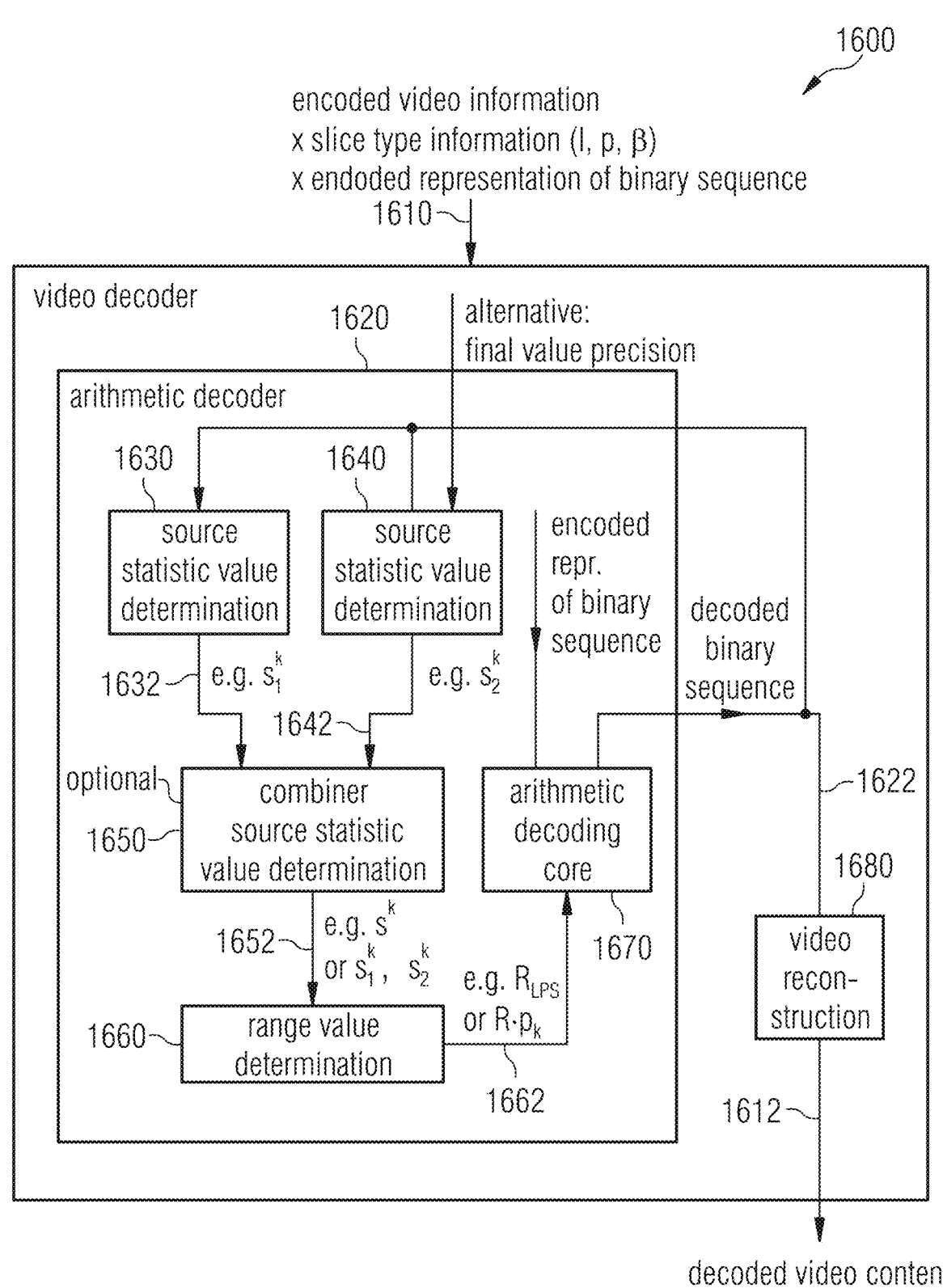
FIG. 16 shows a schematic representation of a video decoder, according to an embodiment of the invention.

FIG. 16 shows a block schematic diagram of a video decoder 1600, according to an embodiment of the invention.

The video decoder 1600 is configured to receive an encoded video information and to provide, on the basis thereof, a decoded video information (or decoded video content).

The encoded video information 1610 (which may be considered as a video bitstream) may, for example, comprise a slice-type information and may also comprise an encoded representation of a binary sequence. Optionally, the encoded video information 1610 may comprise additional information which, however, is not essential for the present invention.

Generally speaking, the video decoder is configured to decode a plurality of video frames (for example, a sequence of video frames), and the video decoder may, for example, be configured to decode a video frame which is subdivided into a set of one or more slices (advantageously, into a plurality of slices). The video decoder may, for example, be configured to evaluate the slice type information, which is included in the encoded video information 1610, and which indicates whether a slice is encoded using an independent coding mode, in which there is no prediction of video content of a current frame on the basis of a video content of a previous frame, or using a single-predictive mode, in which there is a prediction of a block of pixels on the basis of one block of pixels of a previous frame, or using a bi-predictive mode in which there is a prediction of a block of pixels on the basis of two or more blocks of pixels of one or more previous frames, to select a mode of operation for a decoding of a slice (which may, for example, be performed by a "video reconstruction" block 1680).

The video decoder 1600 comprises an arithmetic decoder 1620 which is, for example, configured to provide a decoded binary sequence 1622 (for use by the "video reconstruction" block) on the basis of the encoded representation of the binary sequence, which is included in the encoded video information 1610. The arithmetic decoder advantageously comprises a first source static value determination 1630 and a second source statistic value determination 1640. Accordingly, the arithmetic decoder 1620 is configured to determine a first source statistic value 1632 (e.g. a first state variable value) using a first window size (or using a first time constant) (wherein, for example, a state variable update as described herein may be used) and to determine a second source statistic value 1642 (e.g. a second state variable value) using a second window size (or using a second time constant) (wherein, for example, a state variable update as described herein may be used). The arithmetic decoder also optionally comprises a combiner 1650. Accordingly, the arithmetic decoder may be configured to determine a combined sourced statistic value 1652 (e.g. a combined state variable value) on the basis of the first source static value and on the basis of the second source statistic value.

Moreover, the arithmetic decoder 1620 advantageously comprises a range value determination 1660 (which may, for example, comprise any of the interval size determination cores described herein, or an interval size determination as described herein). Accordingly, the arithmetic decoder may be configured to determine one or more range values (or an interval size information, as described herein) for an interval subdivision, which is used for a mapping of the encoded representation of the binary sequence (which is included in the encoded video information 1610) onto the decoded binary sequence 1622 (which is used by the video reconstruction block 1680), on the basis of the combined source statistic value 1652 (or on the basis of the first and second source statistic values).

Advantageously, the arithmetic decoder 1620 also comprises an arithmetic decoding core 1670 (which may, for example, be a block or a unit), which receives the one or more range values 1662 from the range value determination 1660, and which uses the range values to derive the decoded binary sequence 1622 from the encoded binary sequence included in the encoded video information 1610.

Moreover, the video decoder may, for example, comprise a video reconstruction block (or unit) 1680, which receives the decoded binary sequence 1622 and which provides the decoded video content 1612 on the basis of the decoded binary sequence 1622 (possibly considering additional control information, like the slice-type information).

To conclude, the arithmetic decoder 1600 receives the encoded video information 1610 and performs an arithmetic decoding of an encoded representation of a binary sequence, to derive the decoded binary sequence 1622. The arithmetic decoding exploits knowledge about probabilities of binary values in the decoded binary sequence 1622. This knowledge about the probability (or estimated probability) of binary values within the decoded binary sequence 1622 is considered by the arithmetic decoding core 1670 by relying on range values 1662 which define an interval subdivision. Briefly speaking, the arithmetic decoding core can use the range values 1662 to define different intervals (for example, between zero and one, or over a range of integer values). The arithmetic decoding core can, for example, interpret the encoded representation of the binary sequence as a representation of a number, which lies in one of the intervals defined using the range values. By recognizing in which of the intervals the number represented by the encoded representation of the binary sequence lies, the arithmetic decoding core 1670 can conclude which bit or which bit sequence has been encoded using the encoded representation of the binary sequence.

However, it should be noted that this explanation of the arithmetic decoding core 1670 should only be considered a very brief and generic explanation. Details regarding the arithmetic decoding core can, for example, be seen in the standards H.264 and H.265. However, different concepts (for the operation of an arithmetic decoding core) can also be seen in the literature, and the details of the arithmetic decoding core are not of particular relevance for the present invention.

However, in order to obtain well-suited range values (which allow for a high bitrate efficiency), the arithmetic decoder 1620 (or, generally speaking, the video decoder) determines two source statistic values 1632, 1642 using different window size (wherein the "window size" defines a degree of smoothing over a plurality of decoded binary values of the decoded binary sequence 1622). Moreover, to increase the reliability of the range values provided to the arithmetic decoding core 1670, the first source statistic value 1632 and the second source statistic value 1642 are, in some embodiments, combined into the combined source statistic value 1652.

Accordingly, it can be said that the video decoder 1600 provides a high efficiency, because the range values used by the arithmetic decoding core 1670 are well-adapted to the actual probability of bit values (for example, of bit values "0" and "1" within the decoded binary sequence 1622).

As an additional remark, it should be noted that the video decoder 1600 can also be modified. In an alternative implementation, the second source statistic value determination 1640 can be replaced by the provision of a fixed value (which may be independent from the decoded binary sequence, but which may depend on one or more parameters). In this case, the arithmetic decoder is optionally configured to combine the first source statistic value 1632 with the fixed non-zero value in order to obtain the combined source statistic value 1652. It has been found that such a simplification brings good results in some cases and may, for example, avoid inappropriately strong variations of the combined source statistic value. In other words, by introducing a fixed contribution into the determination of the combined source statistic value, it can be achieved that the combined source statistic value can no longer deviate too strongly from this fixed value. Accordingly, some "hindsight" into the statistics of the decoded binary sequence can be used to avoid a strong degradation of the coding efficiency if, by chance, there is a longer sequence of identical bit values within the decoded binary sequence 1622.

As an additional remark, it should be noted that the functionality of the arithmetic decoder (and of the individual blocks of the arithmetic decoder) can, generally, also be considered as a functionality of the video decoder in its entirety. In other words, the functionalities described herein as functionalities of the arithmetic decoder can also be performed by other blocks of the video decoder.

Moreover, it should be noted that the video decoder 1600 according to FIG. 1 can be supplemented by any of the features, functionalities and details described herein, both individually and taken in combination.

17. Video Decoder According to FIG. 17

Figure 17:
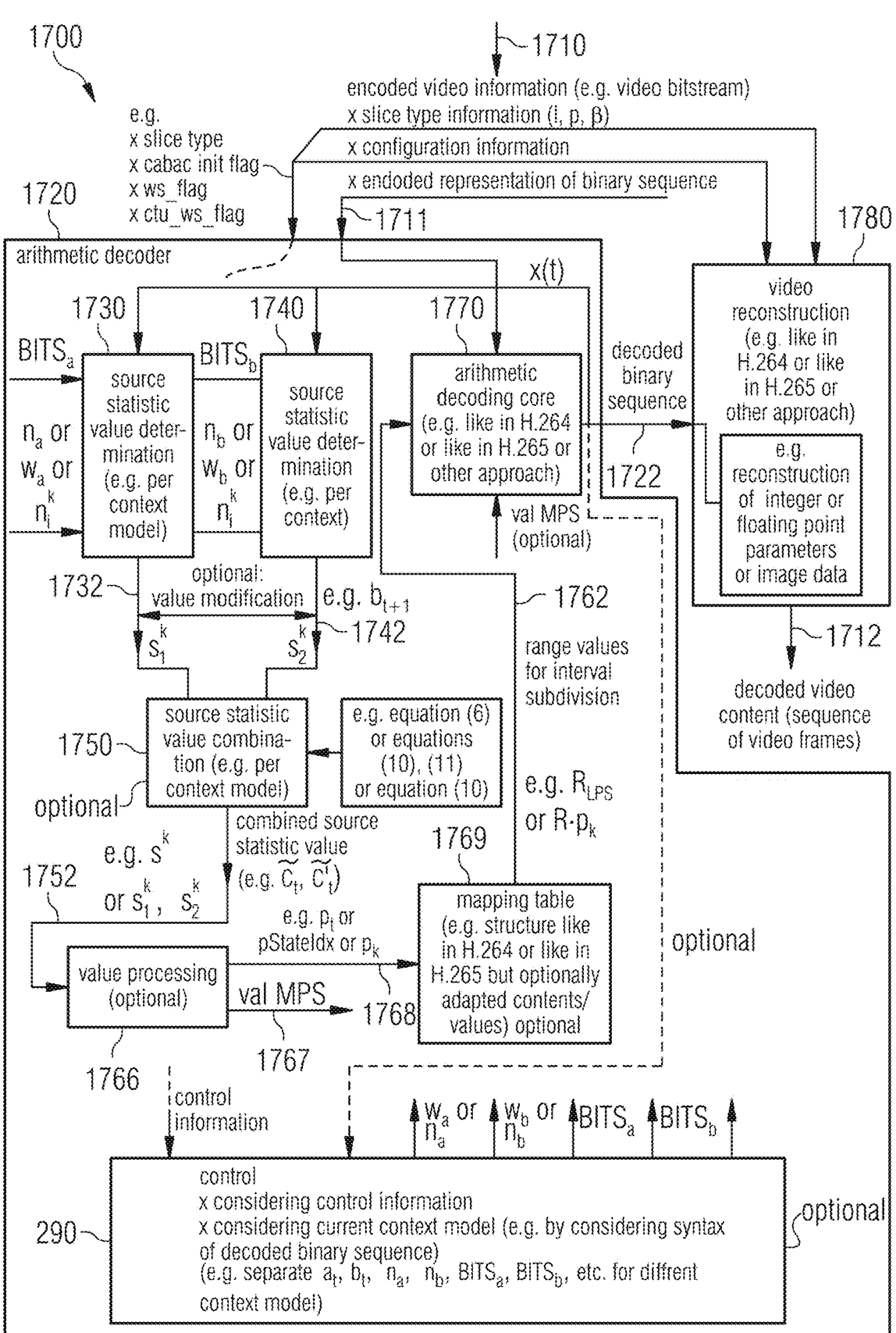
FIG. 17 shows a schematic representation of a video decoder, according to an embodiment of the invention.

FIG. 17 shows a block schematic diagram of a video decoder 1700, according to an embodiment of the invention.

The video decoder 1700 is configured to receive an encoded video information 1710 (for example, a video bitstream) and to provide, on the basis thereof, a decoded video content 1712 (for example, a sequence of video frames). The encoded video information 1710 may, for example, comprise a slice type information, as described herein. The encoded video information 1710 may further comprise configuration information, which can also be considered as control information. Moreover, the encoded video information 1710 may comprise an encoded representation of a binary sequence.

In FIG. 17, two main blocks of the video decoder 1700 are shown, namely an arithmetic decoder 1720 and video reconstruction 1780. However, it should be noted that the distribution of functionalities of the video decoder is not bound to a fixed block structure, but could also be modified over a wide range. Also, it should be noted that actual implementations of the video decoder could have additional blocks and/or functionalities, which are well-known to the men skilled in the art.

The arithmetic decoder 1720 receives the encoded representation 1711 of the binary sequence. However, the arithmetic decoder (or a control block which may be outside of the arithmetic decoder) may optionally receive the slice type information and the configuration information (or control information). In particular, the arithmetic decoder 1720 provides a decoded binary sequence 1722 to the video reconstruction 1780 on the basis of the encoded representation 1711 of the binary sequence, optionally taking into consideration some or all of the slice type information and the configuration information or control information.

In the following, the functionality of the arithmetic decoder 1720 will be described in more detail. The arithmetic decoder comprises an arithmetic decoding core 1770, which receives the encoded representation 1711 of the binary sequence and which provides the decoded binary sequence 1722. The arithmetic decoding core determines which bit values of the decoded binary sequence 1722 are represented by the encoded representation 1711 of the binary sequence. For this purpose, the arithmetic decoding core 1770 checks in which interval of a range of numbers a number represented by the encoded representation 1711 of the binary sequence lies. Depending on the decision in which interval, out of a plurality of (at least two) intervals, a number represented by the encoded representation 1711 of the binary sequence lies, a certain bit value, or a group of bit values, or a symbol, of the decoded binary sequence 1722 is recognized.

For the purpose of deriving the decoded binary sequence 1722, the arithmetic decoding core receives an information about the intervals, which typically corresponds to some degree with probabilities of bit values. In the present case, the arithmetic decoding core 1770 receives "range values" or "interval size information" 1762 which are used for the interval subdivision (i.e., range values 1762 which serve to define intervals of the number range to be used by the arithmetic decoding core 1770). In particular, it should be noted that the arithmetic decoding core 1770 may, for example, be similar or identical to an arithmetic decoding core used in a video encoder/decoder according to standard H.264 or in a video encoder/decoder according to standard H.265. However, it should be noted that different approaches to realize the arithmetic decoding core 1770 could also be used.

In view of the above discussion, it becomes apparent that it is an important functionality of the arithmetic decoder 1720 to provide the range values or interval size information 1762 which define the interval subdivision for the arithmetic decoding core 1770. Generally speaking, the arithmetic decoder 1720 derives these range values 1762 from previously decoded binary values of the decoded binary sequence 1722, optionally taking into consideration some control-information which defines parameters like, for example, initialization values, "window sizes", "window size adaptation", and the like.

In the arithmetic decoder 1700, two source statistic value determination blocks (or units) 1730, 1740 are used (which may, for example, correspond to the state variable update described herein). For example, the first source statistic value determination block 1730 receives one or more previously decoded binary values (or symbol values) of the decoded binary sequence 1722 (also designated with $x_i$), and provides, on the basis thereof, a first sources statistic value 1732 (which may correspond to the first state variable value described herein). The first source statistic value determination block may, for example, receive some configuration information, like a constant or variable $BITS_a$, defining a number of bits used to represent the source statistic value 1732, and a constant or variable $n_a$ which defines a "window size" to be used by the source statistic value determination block 1730, and/or any other parameters described herein. For example, the first source statistic value determination block 1730 may recursively determine the first source statistic value 1732, wherein the window size $n_a$, or a parameter $n_i^k$, determines a weighting of a most recently decoded binary value of the decoded binary sequence 1722 in the determination of the first source statistic value or first state variable value 1732.

The functionality of the first source statistic value determination block 1730 is, for example, similar to the formation of a sliding average having a certain window size, except for the fact that a recursive algorithm is used which introduces some "infinite impulse response" characteristic.

Thus, the first source statistic value 1732 does not exactly represent a result of a sliding window summation operation or of a sliding window averaging operation, but rather should be considered as a "virtual sliding window" operation, since the result is very similar.

Moreover, the second source static value determination block 1740 performs a similar operation when compared to the first source statistic value determination block 1730. However, the second source statistic value determination block 1740 typically uses different parameters (for example, different window length $n_b$ and/or a different bit number parameter $BITS_b$ or a different parameter $n_i^k$), and consequently provides a second source statistic value or a second state variable value 1742, which is typically different from the first source statistic value or the first state variable value 1732. For example, one of the source statistic values 1732, 1742 may be a short term (or shorter term) average source statistic value and one of the source statistic values 1732, 1742 may be a long term (or longer-term) average source statistic value.

It should be noted that the source statistic value determination blocks 1730, 1740 may, for example, perform a functionality as explained for the state variable update herein. Moreover, it should be noted that different computation rules could also be used in the source statistic value determination blocks 1730, 1740 in some embodiments.

The arithmetic decoder 1720 optionally further comprises a combined source statistic value determination block (or unit) 250, which is configured to receive the first source statistic value 1732 and the second source statistic value 1742. The source statistic value combination block 1750 provides a combined source statistic value 1752 on the basis thereof. For example, the source statistic value combination block 1750 may form a sum or an average of the first source statistic value 1732 and of the second source statistic value 1742, to thereby obtain the combined source statistic value 1752.

However, the source statistic value combination block 1750 could also apply different weightings to the first source statistic value 1732 and to the second source statistic value 1742 when deriving the combined source statistic value 1752, wherein the different weightings may even vary within a slice or between different slices.

For example, the source statistic value combination block 1750 may perform the functionality of the combination 751 or of the combination 892. However, a variation of this functionality is also possible.

For example, in one (alternative) embodiment, the source statistic value combination block 1750 combines only one of the first statistic values with a fixed value, to thereby obtain the combined source statistic value or combined state variable value 1752. Such a concept may be advantageous to avoid that the combined source statistic value 1752 deviates by too much from an expected probability of binary values within the decoded binary sequence 1722.

The arithmetic decoder 1720 is configured to derive the range values 1762 for the interval subdivision (which are to be provided to the arithmetic decoding core 1770) on the basis of the combined source statistic value or combined state variable value 1752 or, alternatively, on the basis of two or more state variable values.

This processing step may, for example, be considered as "range value determination". For example, the range value determination may comprise an optional value processing 1766, which receives the combined source statistic value 1752 and provides, on the basis thereof, a probability value or a state index value. The value processing 1766 may, for example, map the range of values of the combined source statistic value 1752 onto a range between 0 and 1, or onto a range between 0 and 0.5, or onto an integer index value.

Optionally, the value processing 1766 may provide information 1767, which may be a binary information that indicates whether it is more likely that the next decoded value (for example, of the decoded binary sequence 1722) takes a value of "1" or takes a value "0". Optionally, the arithmetic decoder (or the range value determination) may comprise a mapping table 1769. The mapping table 1769 may, for example, receive an index value (for example, pStateIdx) which designates a table entry. Accordingly, the mapping table 1769 may provide one or more range values 1762 corresponding to said table entry designated by the index value (for example pStateIdx). Accordingly, by deriving a "state index value" (e.g., pStateIdx) and by evaluating the mapping table on the basis of the state index value, one or more range values for the interval subdivision may be provided on the basis of the combined source static value 1752.

The mapping table 1769 may, for example, have the same structure like a mapping table described in the standard H.264 or in the standard H.265. However, optionally, the contents of the mapping table may be adapted to the specific details of the video decoder. In particular, entries of the mapping table can be adapted to the statistic properties expected in the specific video decoder.

However, it should be noted that the derivation of the interval size information on the basis of the one or more state variable values, or on the basis of the combined state variable value, may be performed according to any of the concepts disclosed herein, for example, using the interval size determination or using the interval size determination core or using the state variable update described taking reference to any of FIGS. 4 to 15.

Also, it should be noted that the arithmetic decoding core mentioned here may correspond to any of the arithmetic decoding cores disclosed herein.

The arithmetic decoder (or, generally speaking, the video decoder) optionally also comprises a control block 1790 which may receive a control information or configuration information and which may adjust the parameters used for the provision of the range values (and possibly also other parameters, for example additional parameters used by the arithmetic decoding core 1770) on the basis thereof. For example, the control block 1790 may receive one or more of the slice type information, a "cabac init flag", a "ws_flag" and a "ctu_ws_flag", which may be included in the encoded video information 1710.

Moreover, the control 1790 may, for example, adjust the window size parameters $n_a$, $n_b$ or $n_i^k$ and/or the bit size parameters BITSa, BITSb in dependence on the control information. In particular, the control block 1790 may also a consider a current context model. Regarding this issue, it should be noted that, for each bit (or group of bits) of the decoded binary sequence 1722 to be decoded, it may be decided which context model is to be used. For example, the decision which context model is to be used may be based on the fact which type of information (decoding parameter, transform coefficient, etc.) is represented by the respective bit (or group of bits). For example, the control block 1790 may be configured to recognize the syntax of the decoded binary sequence 1722, to thereby recognize which syntax element (or which part of a syntax element, for example, a most significant bit or a least significant bit, or the like) is to be decoded next. Accordingly, a selection between different context models may be made. Also, it should be noted that the window size parameters and/or the bit size parameters and/or any other parameters may be chosen dependent on the context model. Furthermore, it should also be noted that the source statistic values 1732,1742 or the combined source statistic value 1752 may be associated with a specific context model, such that different source statistic values or combined source statistic (or state variable values, or combined state variable values) values may be available for different context models. For example, a source statistic value associated with a certain context model may be selectively provided on the basis of decoded binary values of the decoded binary sequence 1722 which have been decoded using the respective context model. In other words, a separate, independent processing, and a separate (possibly independent) decision regarding the parameters $n_a$, $n_b$, $n_i^k$, $BITS_a$, $BITS_b$, etc., may be made for different context models.

Regarding the functionality of the control unit 1790, it should be noted that the control unit may determine the parameters $n_a$, $n_b$, $n_i^k$, $BITS_a$, $BITS_b$, for example, in accordance with the mechanisms described below. For example, the window size parameters $n_a$, $n_b$, $n_i^k$ may be chosen in dependence on the slice type information, and/or in dependence on the cabac init flag, and/or in dependence on the ws_flag and/or in dependence on the ctu_ws_flag. Also, the bit size parameters BITSa, BITSb may be chosen in dependence on some configuration information in some embodiments. However, in other embodiments, the bit size parameters may be fixed. Regarding the mechanisms for the adjustment of the parameters, reference is made, for example, to the discussion below.

Taking reference now to the video reconstruction block 1780, it should be noted that the video reconstruction block 1780 typically receives the decoded binary sequence 1722 and also at least some elements of the configuration information. For example, the video reconstruction 1780 may reconstruct integer parameters and/or floating point parameters and/or image data on the basis of the decoded binary sequence 1722. For example, there may be a mapping rule which defines how a certain bit or portion of the decoded binary sequence should be mapped onto an integer parameter or onto a floating point parameter or onto image data (for example, transform coefficients or the like). Accordingly, the video reconstruction block 1780 reconstructs information used for the reconstruction of a video frame from the decoded binary sequence 1722. Then, the video reconstruction block may generate image information on the basis of the reconstructed information (derived from the decoded binary sequence 1722).

For example, the video reconstruction 1780 may comprise the same functionality as describe in the standard H.264 or in the standard H.265. However, other approaches may also be used for the video reconstruction which are adapted to provide a decoded video content on the basis of a decoded binary sequence (and, possibly, additional configuration information or control information). Accordingly, the video reconstruction 1780 provides a decoded video content 1712, which may take the form of as sequence of video frames.

To conclude, an overview of a video decoder according to an embodiment of the invention has been provided. However, it should be noted that there are different implementations for the functional blocks (for example, for the source statistic value determination blocks 1730, 1740, for the source statistic value combination block 1750, for the value processing block 1766, for the mapping table 1769 and for the arithmetic decoding core 1770. Also, different implementations are possible for the video reconstruction block 1780 and for the control block 1790.

However, it should also be noted that the functional blocks described herein may be supplemented by any of the features, functionalities and details disclosed within the present application in its entirety. Also, it should be noted that the features, functionalities and details disclosed within the present application can be introduced individually or taken in combination, to thereby extend the functionality of the video decoder 1700.

18. Further Embodiments

In the following, further embodiments according to the invention will be described.

Among other features, functionalities and details, a context model update method using a finite state machine will be described, which can be used individually or in combination with all the features, functionalities and details disclosed herein.

INTRODUCTORY REMARKS

In the following, different inventive embodiments and aspects will be described, for example, in the chapters "Derivation of a probability estimate from state variables" and "Update of state variables" and "Advantageous embodiments".

However, the features, functionalities and details described in any other chapters can also, optionally, be introduced into the embodiments according to the present invention.

Also, the embodiments described in the above mentioned chapters can be used individually, and can also be supplemented by any of the features, functionalities and details in another chapter.

Also, it should be noted that individual aspects described herein can be used individually or in combination. Thus, details can be added to each of said individual aspects without adding details to another one of said aspects.

In particular, embodiments are also described in the claims. The embodiments described in the claims can optionally be supplemented by any of the features, functionalities and details as described herein, both individually and in combination.

It should also be noted that the present disclosure describes, explicitly or implicitly, features usable in a video encoder (apparatus for providing an encoded representation of an input video signal) and in a video decoder (apparatus for providing a decoded representation of a video signal on the basis of an encoded representation of a video signal). Thus, any of the features described herein can be used in the context of a video encoder and in the context of a video decoder.

Moreover, features and functionalities disclosed herein relating to a method can also be used in an apparatus (configured to perform such functionality). Furthermore, any features and functionalities disclosed herein with respect to an apparatus can also be used in a corresponding method. In other words, the methods disclosed herein can be supplemented by any of the features and functionalities described with respect to the apparatuses.

Also, any of the features and functionalities described herein can be implemented in hardware or in software, or using a combination of hardware and software, as will be described in the section "implementation alternatives".

INTRODUCTION

Context model update is a key feature of efficient binary arithmetic entropy coders by offering the possibility to adapt the coding engine to the underlying source statistics.

In this invention, each context model is equipped, for example, with an independent probability estimation stage which provides for each symbol of a sequence of symbols a probability estimate for entropy encoding or decoding. The basic concept of this context model update method is to maintain one or more state variables per context model that jointly represent the current probability estimate. In order to adapt to the statistics of the symbol sequence, the state variables of a context model are frequently updated (e.g. in a state variable upsate). For example, after the encoding of each symbol.

The invention comprises, among other aspects, two key aspects. The first aspect addresses the way of deriving a probability estimate (or the interval size information) from the state variables. The second aspect addresses the way of updating the state variables after the occurrence of a symbol. The aspects can optionally be used in combination.

The invention can optionally be combined with a binary arithmetic coding engine, but also with any other entropy coding engine that may use individual probability estimates for binary symbols to be encoded or decoded. For example, the invention could also be combined with the PIPE coding concept.

Implementation Details

Consider an entropy encoding or decoding application like e.g. a video compression algorithm that employs one or more context models $c_1, \ldots, c_M$ with $M \geq 1$. Most of the binary symbols to be encoded or decoded is unambiguously associated with one of the context models. In order to encode or decode such a binary symbol, the associated context model $c_k$ provides the entropy coding stage with a probability estimate $p_k$ of the binary symbol being a "1". In order to yield a good compression efficiency, the portion of the bit stream that is produced by entropy encoding the binary symbol should be close to $-\log_2 p_k$ for a "1" and $-\log_2(1-p_k)$ for a "0".

For each context model $c_k$, one or more state variables (or state variable values)

$$s_1^k, \ldots, s_N^k$$

are maintained with $N \geq 1$. Each state variable $$s_i^k$$

is implemented, for example, as signed integer value and represents a probability value $$P(s_i^k, i, k) = p_i^k.$$

The probability estimate $p_k$ of a context model $c_k$ shall be defined, for example, as weighted sum of the probability values $$p_i^k$$

of all state variables of the context model.

State variables shall advantageously but not necessarily have the following properties:

1. If $s_i^k = 0$, then $p_i^k = 0.5$.

2. Larger values for $$s_i^k$$

correspond to larger $$p_i^k.$$

3. $P\left(-s_i^k, i, k\right) = 1 - P\left(s_i^k, i, k\right).$

Consequently, negative state variables may correspond to $$p_i^k < 0.5.$$

In general, it is possible to specify different functions P(•) for each state variable of each context model.

General Remark 1

The present invention allows the very efficient use of bit-shift operations in many situations. The expression $\lfloor x \cdot y \rfloor$ can be implemented by a simple bit-shift operation when x is an integer and y is a power of 2. This also works when x is negative, when the two's complement representation is employed for x.

General Remark 2

Any variable storing non-integral numbers like e.g., probability values, weighting factors, lookup table elements, etc. may without further notice be implemented in fixed or floating point arithmetic. This introduces rounding operations that may be different for each particular implementation of the invention.

Exemplary Configuration for Associating State Variables with Probability Values

There exist many useful ways of associating state variables with probability values, i.e., of implementing P(•). For example, a state representation that is comparable to the probability estimator of HEVC can be achieved with the following equation:

$$P(x, i, k) = \begin{cases} 0.5 \cdot \alpha^{\lfloor x \cdot \beta_i^k \rfloor}, & \text{if } x \geq 0, \\ 1 - 0.5 \cdot \alpha^{\lfloor -x \cdot \beta_i^k \rfloor}, & \text{else.} \end{cases}$$

$$\beta_i^k$$

is a weighting factor.

$\alpha$ is a parameter with $0 < \alpha < 1$.

To achieve a configuration that is comparable to HEVC, set $\alpha \approx 0.949217$ and $$\beta_i^k = 1$$

for all i and all k.

This exemplary configuration shall give some insight about how state variables could be defined. In general, it is not necessary to define P(•) because it is not directly used, as will be seen in the following. Instead, it often results from the actual implementation of the individual parts of this invention.

Initialization of State Variables

Before encoding or decoding the first symbol with a context model, all state variables are optionally initialized with sane values that may be optimized to the compression application.

Derivation of a Probability Estimate from State Variables

For encoding or decoding of a symbol, a probability estimate is derived from the state variables of a context model. Two alternative approaches are presented in the following. Approach 1 yields more accurate results than approach 2, but also has a higher computational complexity.

Approach 1

This approach consists of two steps. Firstly, each state variable $$s_i^k$$

of a context model is converted into a probability value $$p_i^k.$$

Secondly, the probability estimate $p_i^k$ is derived as weighted sum of the probability values $$p_i^k.$$

Step 1:

A lookup table LUT1 is employed for converting a state variable $$s_i^k$$

into the corresponding probability value $$p_i^k,$$

for example according to Eq. (1).

$$p_i^k = \begin{cases} LUT1[\lfloor s_i^k \cdot a_i^k \rfloor], & \text{if } s_i^k \geq 0. \\ 1 - LUT1[\lfloor -s_i^k \cdot a_i^k \rfloor], & \text{else.} \end{cases} \quad (1)$$

LUT1 is a lookup table containing probability values.

$$d_i^k$$

is a weighting factor that adapts $$s_i^k$$

to the size of LUT1.

The step may, for example, be performed by blocks 882 and 884.

Step 2:

The probability estimate $p_k$ is derived from the probability values $$p_i^k,$$

for example according to:

$$p_k = \sum_{i=1}^{N} p_i^k \cdot b_i^k \quad (7)$$

$$b_i^k$$

is a weighting factor that controls the influence of the individual state variables.

The step may, for example, be performed by block 886.

Approach 2

An alternative approach for deriving the probability estimate from the state variables is presented in the following. It yields less accurate results and has a lower computational complexity. Firstly, a weighted sum $s_k$ of the state variables is derived, for example, according to:

$$s_k = \sum_{i=1}^{N} \lfloor s_i^k \cdot d_i^k \rfloor \quad (10)$$

$$d_i^k$$

is a weighting factor that controls the influence of each state variable.

This step may, for example, be performed by block 892.

Secondly, the probability estimate $p_k$ is derived from the weighted sum of state variables $s_k$, for example according to:

$$p_k = \begin{cases} LUT2[\lfloor s_k \cdot a_k \rfloor], & \text{if } s_k \geq 0. \\ 1 - LUT2[\lfloor -s_k \cdot a_k \rfloor], & \text{else.} \end{cases} \quad (2)$$

LUT2 is a lookup table containing probability estimates.

$a_k$ is a weighting factor that adapts $s_k$ to the size of LUT2.

This step may, for example, be performed by block 894

Optional Modification to Approaches 1 and 2

For a software implementation, it may increase the throughput if as many of the operations as possible can be shifted into a lookup table. This becomes simpler for approach 1 if Eq. (1) is replaced with:

$$p_i^k = \begin{cases} LUT1[\lfloor s_i^k \cdot a_i^k \rfloor], & \text{if } \lfloor s_i^k \cdot d_i^k \rfloor \geq 0. \\ 1 - LUT1[-\lfloor s_i^k \cdot a_i^k \rfloor], & \text{else} \end{cases}$$

For approach 2, Eq. (2) is replaced with:

$$p_k = \begin{cases} LUT2[\lfloor s_i^k \cdot a_i^k \rfloor], & \text{if } \lfloor s_k \cdot d_k \rfloor \geq 0. \\ 1 - LUT2[-\lfloor s_i^k \cdot a_i^k \rfloor], & \text{else} \end{cases}$$

For both equations, this modification makes it possible to integrate the case differentiation into the lookup table, which may use only two times the number of elements as before. However, to achieve a high throughput, it may help to reduce the number of operations while an increased lookup table size may be less relevant.

Without further notice the optional modifications for approaches 1 and 2 can optionally be applied to all applications of approaches 1 and 2 in this invention. Combination with the binary arithmetic coding engine of CABAC (M coder) (optional)

The M coder of CABAC employs a 2D lookup table to replace the multiplication that may be used for the interval subdivision of the coding interval. Let R be the coding interval before arithmetic encoding of a binary symbol. R shall, for example, be in the interval [256, 510]. The symbol to be encoded is associated with a context model $c_k$ which is used to derive a probability estimate $p_k$ for binary arithmetic encoding or decoding. The widths of two subintervals $R \cdot p_k$ and $R \cdot (1-p_k)$ need to be derived, respectively. For example, the M coder of CABAC (which serves as an example) avoids these multiplications by employing a 2D lookup table. Recall that the probability estimate $p_k$ is the estimated probability of the symbol being a 1. However, the M coder uses the probability of the less probable of both symbols 0 or 1 to derive its subinterval width $R_{LPS}$. The subinterval width of the more probable symbol $R_{MPS}$ can then be easily derived by subtracting $R_{LPS}$ from R.

Note that $R_{LPS}$ may not fall below a predefined smallest allowable value which depends on the M coder implementation. For example, this smallest allowable value could be 2, 3 or 4. For the rest of the text, it shall be assumed that, before passing $R_{LPS}$ to the M coder, it is repeatedly increased by 1 (if at all) until it is at least as large as the predefined smallest allowable value. This corresponds to a clipping operation and it can be implemented as a separate calculation step. It may be possible to directly incorporate it into some of the approaches that are presented in the following (like adjusting lookup table values).

The probability of the less probable symbol $p_{LPS}$ is given as $$p_{LPS} = \min(p_k, 1 - p_k).$$

For example, a lookup table RangeTabLPS could have 8×32 or 8×16 elements, the allowed values for R are quantized to 8 cells and $p_{LPS}$ is quantized to 32 or 16 cells. Then, $$P_{LPS} = RangeTabLPS[Qp(p_{LPS})][Qr(R)].$$

Qp(•) and Qr(•) are quantization functions for $p_{LPS}$ and R, respectively.

Alternative 1:

Alternatively, a lookup table probTabLPS could have 32 or 16 elements, the allowed values for R are quantized to 8 or 16 cells and $p_{LPS}$ is quantized to 32 or 16 cells. Then, $$R_{LPS} = \lfloor probTabLPS[Qp_2(p_{PLS})] * Qr_2(R) \rfloor \qquad (11)$$

$Qp_2(•)$ and $Qr_2(•)$ are quantization functions for $p_{LPS}$ and R, respectively.

Usually it is desirable that both quantization functions can easily be implemented. Arbitrary quantization functions can be used as long as the elements of RangeTabLPS are chosen appropriately.

This can be exploited for the present invention.

Recall, that it was necessary to employ lookup tables LUT1 or LUT2 to derive probability estimates for context models. These lookup tables can be incorporated in the RangeTabLPS (or, generally speaking, into a 2-dimensional lookup-table which is different from the lookup-table of the M coder).

Instead of calculating probability estimates in approaches 1 and 2, subinterval widths are directly calculated for given values of $$s_i^k,$$

for example, as follows:

For approach 1, R is multiplied on both sides of Eq. (1) and Eq. (7), yielding $$R \cdot p_k = \sum_{i=1}^{N} R \cdot p_i^k \cdot b_i^k$$

$$R \cdot p_i^k = \begin{cases} R \cdot LUT1[\lfloor s_i^k \cdot a_i^k \rfloor], & \text{if } s_i^k \geq 0. \\ R - R \cdot LUT1[\lfloor -s_i^k \cdot a_i^k \rfloor], & \text{else.} \end{cases}$$

Next, R·LUT1 is replaced with a 2D lookup table containing precalculated products R·LUT1 for the desired number of different quantized values Qr(R). (Example of an actual implementation of an embodiment)

The resulting 2D lookup-table could, for example, be used in blocks 736 and 738.

For approach 2, R is multiplied on both sides of Eq. (2), yielding $$R \cdot p_k = \begin{cases} R \cdot LUT2[\lfloor s_i^k \cdot a_i^k \rfloor], & \text{if } s_k \geq 0. \\ R - R \cdot LUT2[\lfloor -s_i^k \cdot a_i^k \rfloor], & \text{else.} \end{cases} \qquad (8)$$

Next, R·LUT2 is replaced with a 2D lookup table containing precalculated products R·LUT2 for the desired number of different quantized values Qr(R) (Example of an actual implementation of an embodiment). With LUT3 being such a 2D lookup table Eq. (8) becomes $$R \cdot p_k = \begin{cases} R \cdot LUT3[\lfloor s_k \cdot a_k \rfloor][Qr(R)], & \text{if } s_k \geq 0. \\ R - LUT3[\lfloor -s_k \cdot a_k \rfloor][Qr(R)], & \text{else.} \end{cases} \qquad (9)$$

As can be seen from Eq. (9), LUT3 incorporates, for example, RangeTabLPS and LUT2 in one single lookup table.

LUT3, or equation (9), could, for example, be used in block 756.

Alternatively, LUT3 can be replaced by LUT4 (1D) and a multiplication operation according to the scheme presented as alternative 1

$$R \cdot p_k = \begin{cases} \lfloor LUT4[\lfloor s_k \cdot a_k \rfloor] \cdot Qr_2(R) \rfloor, & \text{if } s_k \geq 0. \\ R - \lfloor LUT4[\lfloor -s_k \cdot a_k \rfloor] \cdot Qr_2(R) \rfloor, & \text{else.} \end{cases}$$

Function $Qr_2(R)$ can for example be defined as $$Qr_2(R) = (\lfloor R \cdot 2^{-u} \rfloor + v) \cdot 2^{-w}$$

Where u, v and w depend on the compression application. For example, u=5, v=1, and w=3.

Arithmetic encoding of a binary symbol that is associated with a context model $c_k$ then only may be used to derive the weighted sum of state variables $s_k$ according to Eq. (10) and to execute Eq. (9) in order to derive the subinterval width $R \cdot p_k$.

The same argumentation holds for approach 1.

In the following, a further (optional, alternative) way of efficiently implementing RangeTabLPS (or for deriving the interval size information) is presented. Instead of storing the whole lookup table, elements are calculated on the fly as needed. For this purpose, a new lookup table BaseTabLPS shall be defined. It contains values which can be used to derive each element of RangeTabLPS by employing simple operations.

Generally speaking, for example, RangeTabLPS[i][j] may be evaluated in block 870, wherein the entries of RangeTabLPS may, for example, be obtained (beforehand or on-the-fly) using BaseTabLPS and a corresponding scaling function Scal(x,y) (embodiment using BaseTabLPS), or using ProbTabLPS and a corresponding scaling function Scal (x,y) (embodiment using ProbTabLPS).

In an embodiment (e.g. an embodiment using BaseTabLPS), BaseTabLPS shall be of size μ·λ and a RangeTabLPS of size μ'·λ shall be generated from BaseTabLPS as follows:

$$RangeTabLPS[i][j] = Scal(BaseTabLPS[i \% \mu][j], \lfloor i/\mu \rfloor)$$

Scal(x, y) is a scaling function. For example, μ=16, λ=8, μ'=32, Scal(x, y)=$\lfloor x \cdot 2^{-3y} \rfloor$, and BaseTabLPS[16][8]={
{125, 140, 156, 171, 187, 203, 218, 234,},
{108, 121, 135, 148, 162, 175, 189, 202,}, {94, 105, 117, 129, 141, 152, 164, 176,},
{81, 91, 101, 111, 121, 131, 141, 151,},
{71, 79, 88, 97, 106, 115, 124, 133,},
{61, 68, 76, 83, 91, 99, 106, 114,},
{53, 59, 66, 72, 79, 86, 92, 99,},
{46, 51, 57, 63, 69, 74, 80, 86,},
{40, 45, 50, 55, 60, 65, 70, 75,},
{35, 39, 43, 48, 52, 56, 61, 65,},
{31, 34, 38, 42, 46, 50, 54, 58,},
{27, 30, 33, 37, 40, 43, 47, 50,},
{24, 27, 30, 33, 36, 39, 42, 45,},
{21, 23, 26, 28, 31, 34, 36, 39,},
{18, 20, 22, 24, 27, 29, 31, 33,},
{16, 18, 20, 22, 24, 26, 28, 30,},
}. (Example)

In other words, for example, the upper half of RangeTabLPS consists of (or comprises) the values of BaseTabLPS where a floor operation was applied to each element. For example, the lower half of RangeTabLPS consists of (or comprises) the values of BaseTabLPS where each element is divided by 8 (or by another number), (optionally) followed by a floor operation, which corresponds, for example, to a right-shift by 3.

This approach only may be used to store BaseTabLPS which is smaller than RangeTabLPS and it exploits the fact that the values in the rows of RangeTabLPS are, for example, exponentially decaying with increasing rows. The exponential decay depends on the parameter $\alpha$.

In another example (e.g. another embodiment using BaseTabLPS), $\mu=4$, $\lambda=8$, $\mu'=32$, Scal(x, y)=$\lfloor x \cdot 2^{-y} \rfloor$, and
BaseTabLPS[4][8]={
{121, 136, 151, 166, 181, 196, 211, 226,},
{100, 112, 125, 137, 150, 162, 175, 187,},
{83, 93, 103, 114, 124, 134, 145, 155,},
{70, 78, 87, 96, 105, 113, 122, 131,}
}. (Example)

This configuration can be used if a is selected so that the values of a row of RangeTabLPS halve each four rows. Note that the values in BaseTabLPS can, for example, simply be extracted from the associated RangeTabLPS.

The approaches involving BaseTabLPS can (optionally) be combined with alternative 1 as defined in Eq. (11) and the associated embodiments. Alternative 1 can be seen as an approach for deriving a row of RangeTabLPS from one constant and a calculation operation (for each row). As BaseTabLPS contains, for example, scaled rows of RangeTabLPS (neglecting rounding), alternative 1 can be applied to derive BaseTabLPS.

In an embodiment (for example, in another embodiment, e.g. in an embodiment using ProbTabLPS), a probTabLPS of size u is defined. A BaseTabLPS of size $\mu \cdot \lambda$ shall, for example, be generated from probTabLPS as follows:

$$j = \lfloor R \cdot 2^{-5} \rfloor - 8$$

$$BaseTabLPS[\vartheta][j] = \lfloor probTabLPS[\vartheta] \cdot Qr_2(R) \rfloor$$

For example, $\mu=16$, $\lambda=8$, $\mu'=32$, $Qr_2(R)=\lfloor R \cdot 2^{-5} \rfloor \cdot 2^{-3}$, $R \in [256 \ldots 510]$, Scal(x, y)=$\lfloor x \cdot 2^{-3y} \rfloor$, and
probTabLPS[16]={
125,
108,
94,
81,
71, 61,
53,
46,
40,
35,
31,
27,
24,
21,
18,
16,
}. (Example)

Then RangeTabLPS can be computed from BaseTabLPS following the preceding approaches. Note that, each value of RangeTabLPS can, for example, be computed on the fly by calculating the associated value of BaseTabLPS and then applying the scaling function Scal(x, y):

$$RangeTabLPS[i][\lfloor R \cdot 2^{-5} \rfloor - 8] = Scal(\lfloor probTabLPS[i \% \mu] \cdot Qr_2(R) \rfloor, \lfloor i/\mu \rfloor)$$

This approach only may be used to store probTabLPS which is smaller than BaseTabLPS and thus RangeTabLPS.

Following the same argumentation, one column of BaseTabLPS can, for example, be used to only derive one column of RangeTabLPS by simply neglecting all other columns of BaseTabLPS and RangeTabLPS. The derived column of RangeTabLPS can then, for example, be used to derive the remaining columns of RangeTabLPS by employing alternative 1 according to Eq. (11).

In an embodiment, a probTabLPS of size u is defined. A RangeTabLPS of size $\mu' \cdot \lambda$ shall be generated from probTabLPS as follows:

$$RangeTabLPS[i][\lfloor R \cdot 2^{-5} \rfloor - 8] = \lfloor Scal(probTabLPS[i \% \mu], \lfloor i/\mu \rfloor) \cdot Qr_2(R) \rfloor$$

Note that Scal(x, y)=$\lfloor x \cdot 2^{-3y} \rfloor$. (Example)

Update of State Variables (Invention Aspect)

After the encoding or decoding of a symbol, one or more state variables of a context model may be updated in order to track the statistical behaviour of the symbol sequence. This may, for example, be done in block 640.

The update is, for example, carried out as follows:

$$s_i^k = \begin{cases} s_i^k + \lfloor A[z + \lfloor s_i^k \cdot m_i^k \rfloor] \cdot n_i^k \rfloor, & \text{If symbol to be encoded is 1.} \\ s_i^k - \lfloor A[z + \lfloor -s_i^k \cdot m_i^k \rfloor] \cdot n_i^k \rfloor, & \text{If symbol to be encoded is 0.} \end{cases} \quad (3)$$

A is a lookup table storing integer values.

$$m_i^k$$

and $$n_i^k$$

are weighting factors that control the update 'agility'.
z is an offset that ensures that lookup table A is accessed only with non-negative values.

As will be discussed below, the values in lookup table A can be chosen so that $$s_i^k$$

stays in a particular given interval.

Alternatively, it is possible to introduce a clipping operation that is carried out after each execution of Eq. (3), for example, as follows:

$$s_i^k = \min(\max(s_i^k, h_i^k), g_i^k) \qquad (6)$$

$$g_i^k$$

is the maximum allowed value for $$s_i^k$$

$$h_i^k$$

is the minimum allowed value for $$s_i^k$$

In order to optimize lookup table A with respect to a compression application, the assumed function that is approximated by the values of lookup table A can also be replaced with a computation operation. For example, $$A[z + \hat{s}] = \text{offset} + \sum_{i=1}^{\hat{N}} \max(0, \hat{b}_i - \hat{s}) \ll \hat{a}_i \qquad (7)$$

Where $\hat{N}$, $\hat{b}_i$, and $\hat{a}_i$ are parameters that control the probability update behaviour.

Note that this way of creating lookup table A does not contain the clipping operation as described above. Now, lookup table A may be optimized by evaluating the compression efficiency for different combinations of $\hat{a}_i, \hat{b}_i$, offset in Eq. 7 and subsequently sampling A[z+ŝ] at desired values z+ŝ.

A particular encoder or decoder application has the choice whether to use the computation operation or to use an equivalent table (that contains values derived through the computation operation).

In an effort to optimize lookup table A for a video compression context, the following range of possible configurations is used:

$\hat{N}=3$ offset=$\{2^4, 2^5 \ldots 2^{11}\}$ $\hat{a}_1=\{2, 3 \ldots 7\}$ $\hat{a}_2=\{3, 4 \ldots 7\}$ $\hat{a}_3=\{5, 6 \ldots 8\}$ $$\hat{b}_1 = \{-0, -1, -2, -3, -4, -6, -7\}$$

$$\hat{b}_2 = \{-9, -11, -13, -15, -17, -19, -21, -23\}$$

$$\hat{b}_3 = [-24, -26, -28, -30, -32, -34, -36, -38\}$$

Optional Modification to Eq. (3)

Two optional modifications can be applied to Eq. (3) in order to achieve a higher throughput in an optimized software implementation.

For the first optional modification, Eq. (3) is replaced with:

$$\text{Eq. (3a)}$$

$$s_i^k =$$
$$\begin{cases} s_i^k + \lfloor A[z + \lfloor s_i^k \cdot m_i^k \rfloor] \cdot n_i^k \rfloor, & \text{If symbol to be encoded is 1.} \\ s_i^k - \lfloor A[z - 1 - \lfloor s_i^k \cdot m_i^k \rfloor] \cdot n_i^k \rfloor, & \text{If symbol to be encoded is 0.} \end{cases}$$

For the second optional modification, Eq. (3) is replaced with:

$$\text{Eq. (3b)}$$

$$s_i^k =$$
$$\begin{cases} s_i^k + \lfloor A[z + [s_i^k \cdot m_i^k]] \cdot n_i^k \rfloor, & \text{If symbol to be encoded is 1.} \\ s_i^k + \lfloor -A[z + [-s_i^k \cdot m_i^k]] \cdot n_i^k \rfloor, & \text{If symbol to be encoded is 0.} \end{cases}$$

For the combination of the first and the second optional modification, Eq. (3) is replaced with:

$$\text{Eq. (3c)}$$

$$s_i^k =$$
$$\begin{cases} s_i^k + \lfloor A[z + [s_i^k \cdot m_i^k]] \cdot n_i^k \rfloor, & \text{If symbol to be encoded is 1.} \\ s_i^k + \lfloor -A[z - 1 - [-s_i^k \cdot m_i^k]] \cdot n_i^k \rfloor, & \text{If symbol to be encoded is 0.} \end{cases}$$

By employing the combination of the first and the second optional modification, it becomes possible to integrate the case differentiation into lookup table A, which may only use two times the number of elements as before. However, to achieve a high throughput, it may help to reduce the number of operations while an increased lookup table size may be less relevant.

Without further notice the two optional modifications (separately or in combination) can be applied to all applications of Eq. 3 in this invention.

Advantageous Embodiments (Details are Optional)

In an embodiment, the following configuration is used:

The number of context models M depends on the compression application.

Approach 2 is used for deriving a probability estimate from the state variables.

Eq. (3) is used for updating state variables.

The optional clipping according to Eq. (6) is not used.

$$N = 2$$

$$d_1^k = 16$$

-continued $$d_2^k = 1$$

$$LUT2 = \{0.5000, 0.4087, 0.3568, 0.3116, 0.2721, 0.2375, 0.2074, 0.1811,$$

$$0.1581, 0.1381, 0.1206, 0.1053, 0.0919, 0.0803, 0.0701, 0.0612,$$

$$0.0534, 0.0466, 0.0407, 0.0356, 0.0310, 0.0271, 0.0237, 0.0207,$$

$$0.0180, 0.0158, 0.0138, 0.0120, 0.0105, 0.0092, 0.0080, 0.0070\}$$

$$a_k = 2^{-7}$$

$$A = \{165, 146, 128, 110, 94, 79, 66, 54, 43, 34, 26, 20, 15,$$
$$11, 8, 5, 4, 4, 4, 4, 4, 4, 4, 4, 4, 4, 4, 4, 4, 4, 4, 0\}$$

$$m_1^k = 2^{-3}$$

$$m_2^k = 2^{-7}$$

$$n_1^k = 2^{-1}$$

$$n_2^k = 1$$

$$z = 16$$

Before encoding a symbol, $$s_1^k$$

shall be initialized with a value from the interval $[-127, 127]$ and $$s_2^k$$

shall be initialized with a value from the interval $[-2047, 2047]$.

For this configuration, Eq. (3) can be written as:

$$s_1^k = \begin{cases} s_1^k + \left(A\left[16 + \left(s_1^k \gg 3\right)\right] \gg 1\right), & \text{If symbol to be encoded is 1.} \\ s_1^k - \left(A\left[16 + \left(\left(-s_1^k\right) \gg 3\right)\right] \gg 1\right), & \text{If symbol to be encoded is 0.} \end{cases} \quad (4)$$

$$s_2^k = \begin{cases} s_2^k + A\left[16 + \left(s_2^k \gg 7\right)\right], & \text{If symbol to be encoded is 1.} \\ s_2^k - A\left[16 + \left(\left(-s_2^k\right) \gg 7\right)\right], & \text{If symbol to be encoded is 0.} \end{cases} \quad (5)$$

When $$s_1^k$$

is in the interval $[-127, 127]$, Eq. (4) yields an updated value for $$s_1^k$$

that stays in the same interval, regardless of the value of the symbol to be encoded.

When $$s_2^k$$

is in the interval $[-2047, 2047]$, Eq. (5) yields an updated value for $$s_2^k$$

that stays in the same interval, regardless of the value of the symbol to be encoded.

Consequently, $$s_1^k$$

can, for example, be implemented with an 8 bit signed integer value and $$s_2^k$$

can be implemented with a 12 bit signed integer.

Both equations increase the state variable (up to some maximum value) after encoding a 1 and decrease the state variable (down to some minimum value) after encoding a 0. However, Eq. (4) tends to increase or decrease $$s_1^k$$

by larger amounts than Eq. (5) does with $$s_2^k.$$

In other words, $$s_1^k$$

adapts faster to previously encoded symbols while $$s_2^k$$

adapts slower.

In another embodiment, the same configuration as for the previous embodiment is used, but the first and the second optional modification is applied to Eq. (3) yielding:

$$s_1^k = \begin{cases} s_1^k + \left(A\left[16 + \left(s_1^k \gg 3\right)\right] \gg 1\right), & \text{If symbol to be encoded is 1.} \\ s_1^k + \left(\left(-A\left[15 - \left(s_1^k \gg 3\right)\right]\right) \gg 1\right), & \text{If symbol to be encoded is 0.} \end{cases}$$

$$s_2^k = \begin{cases} s_2^k + A\left[16 + \left(s_2^k \gg 7\right)\right], & \text{If symbol to be encoded is 1.} \\ s_2^k - A\left[15 - \left(s_2^k \gg 7\right)\right], & \text{If symbol to be encoded is 0.} \end{cases}$$

Note that lookup tables LUT2 and A are usually optimized to the specific compression application.

When lookup table A is optimized, the following configuration is used with Eq. (7):

$\tilde{N}=3$ $\text{offset}=2^{10}$ $\hat{a}_1=8$ $\hat{a}_2=7$ $\hat{a}_3=9$ $\hat{b}_1=-3$ $\hat{b}_2=-15$ $\hat{b}_3=-28$ which results in A={161, 147, 133, 119, 105, 91, 77, 63, 49, 35, 29, 23, 17, 13, 9, 5, 4, 4, 4, 4, 4, 4, 4, 4, 4, 4, 4, 4, 4, 4, 0}.

Note that A has already been clipped, hence the last value is equal to 0 instead of 4.

In another embodiment, the configuration is identical to the previous embodiment, except for the following aspects:

Clipping according to Eq. (6) is used after each execution of Eq. (3) with the following parameters:

$$g_1^k = 127$$

$$g_2^k = 2047$$

$$h_1^k = -127$$

$$h_2^k = -2047$$

Lookup table A contains the following values:

A={165, 146, 128, 110, 94, 79, 66, 54, 43, 34, 26, 20, 15, 11, 8, 5, 4, 4, 4, 4, 4, 4, 4, 4, 4, 4, 4, 4, 4, 4, 4, 4}

Note that only the last element of lookup table A was changed and now, all values in the second half of A have value 4, which can be efficiently implemented.

Imagine, the lookup table was truncated after the first 4 and the access index for the table is clipped to the last table element (optional modification of the embodiment).

This trick can optionally be employed for different versions of lookup table A as long as a number of elements at the end of the table have the same value.

In another embodiment, the configuration is identical to the previous embodiment, except for the following aspects:

Alternative 1 with size 32 is used

LUT4={114, 100, 87, 75, 66, 58, 51, 45, 40, 35, 31, 27, 24, 21, 18, 16, 14, 13, 11, 10, 9, 8, 7, 7, 5, 5, 4, 4, 3, 3, 2, 2}

$$R_{LPS} = ((LUT4[\lfloor |s_k| \cdot a_k \rfloor] \cdot ((R \gg 5) + 1)) \gg 3$$

In another embodiment, the configuration is identical to the previous embodiment LUT4={114, 100, 87, 75, 66, 58, 51, 45, 40, 35, 31, 27, 24, 21, 18, 16, 14, 13, 11, 10, 9, 8, 7, 7, 5, 5, 4, 4, 3, 3, 2, 2}

$$R_{LPS} = ((LUT4[\lfloor |s_k| \cdot a_k \rfloor] \cdot (R \gg 5)) \gg 3$$

In another embodiment, the configuration is identical to the previous embodiment, except for the following aspects:

Alternative 1 with size 16 is used

LUT4={107, 82, 63, 48, 38, 29, 22, 17, 13, 11, 8, 7, 5, 4, 3, 2}

$$R_{LPS} = ((LUT4[\lfloor |s_k| \cdot a_k \rfloor] \cdot ((R \gg 5) + 1)) \gg 3$$

In another embodiment, the configuration is identical to the previous embodiment

LUT4={107, 82, 63, 48, 38, 29, 22, 17, 13, 11, 8, 7, 5, 4, 3, 2}

$$R_{LPS} = ((LUT4[\lfloor |s_k| \cdot a_k \rfloor] \cdot (R \gg 5)) \gg 3$$

In another embodiment, the following configuration is used:

The number of context models M depends on the compression application.

Approach 2 is used for deriving a probability estimate from the state variables.

Eq. (3) is used for updating state variables.

The optional clipping according to Eq. (6) is not used.

$$N = 1$$

$$d_1^k = 1$$

$$LUT2 =$$

$$a_k = 2^{-2}$$

A={26, 23, 20, 18, 15, 13, 11, 9, 7, 6, 5, 4, 3, 2, 2, 1, 1, 1, 1, 1, 1, 1, 1, 1, 1, 1, 1, 1, 1, 1, 1, 0}

$$m_1^k = 2^{-3}$$

$$n_1^k = 1$$

$$z = 16$$

Before encoding a symbol, $$s_1^k$$

shall optionally be initialized with a value from the interval [−127, 127]

In another embodiment, approach 2 is used and the parameters $$m_i^k, n_i^k,$$

and $$m_i^k, n_i^k,$$

are set differently for different context models in order to get different probability update behaviours for the different context models.

In another embodiment, approach 1 is used and the parameters $m_i^k$, $n_i^k$, and $$d_i^k$$

are set differently for different context models in order to get different probability update behaviours for the different context models. In another embodiment, when approach 1 or approach 2 is used, N=1 and the parameters $$m_i^k, n_i^k,$$

and $$d_i^k$$

are set differently for different context models in order to get different probability update behaviours for the different context models, when lookup table A is optimized, the following configuration is used with Eq. (7):

$\hat{N}=3$
offset=$2^{10}$
$\hat{a}_1=8$
$\hat{a}_2=7$
$\hat{a}_3=10$
$\hat{b}_1=-3$
$\hat{b}_2=-15$
$\hat{b}_3=-30$
which results in A={225, 203, 181, 159, 137, 115, 93, 71, 49, 35, 29, 23, 17, 13, 9, 5, 4, 4, 4, 4, 4, 4, 4, 4, 4, 4, 4, 4, 4, 4, 0,}.

Note that A has already been clipped, hence the last value is equal to 0 instead of 4.

In another embodiment, when approach 1 or approach 2 is used, N=2 and the parameters $$m_i^k, n_i^k,$$

and $$d_i^k$$

are set differently for different context models in order to get different probability update behaviours for the different context models, when lookup table A is optimized, the following configuration is used with Eq. (7):

$\hat{N}=3$
offset=$2^{10}$
$\hat{a}_1=8$
$\hat{a}_2=7$
$\hat{a}_3=9$
$\hat{b}_1=-3$
$\hat{b}_2=-15$
$\hat{b}_3=-26$
which results in A={165, 151, 137, 123, 109, 95, 81, 67, 53, 39, 29, 23, 17, 13, 9, 5, 4, 4, 4, 4, 4, 4, 4, 4, 4, 4, 4, 4, 4, 0,}.

Alternatively, $\hat{b}_3=-28$ is also a desired configuration in this embodiment which results in A={157, 143, 129, 115, 101, 87, 73, 59, 45, 35, 29, 23, 17, 13, 9, 5, 4, 4, 4, 4, 4, 4, 4, 4, 4, 4, 4, 4, 4, 0}. Note that A has already been clipped, hence the last value is equal to 0 instead of 4.

19. Implementation Alternatives

Although some aspects are described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An arithmetic encoder for encoding a plurality of symbols having symbol values, wherein the arithmetic encoder is configured to derive an interval size value for an arithmetic encoding of one or more symbol values to be encoded on the basis of one or more state variable values, which represent statistics of a plurality of previously encoded symbol values, wherein the arithmetic encoder is configured to determine the interval size value using a base lookup table, wherein the arithmetic encoder is configured to determine the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the arithmetic encoder is configured to perform the arithmetic encoding of one or more symbols using the interval size value.

2. The arithmetic encoder according to claim 1, wherein the arithmetic encoder is configured to determine the interval size value, such that the determined interval size value is a right-shifted version of an element of the base-lookup table if the probability index is within the second range.

3. The arithmetic encoder according to claim 1, wherein the probability index) determines whether an element of the lookup table is provided as the interval size value, or whether an element of the lookup table is scaled and rounded to obtain the interval size value.

4. The arithmetic encoder according to claim 1, wherein a division residual of a division between the probability index and a first size value and an interval size index determine which element of the base lookup table is used to obtain the interval size value.

5. The arithmetic encoder according to claim 1, wherein the arithmetic encoder is configured to obtain the interval size value RXPS according to $$RXPS = Scal\big(BaseTabLPS[i\,\%\,\mu][j], \lfloor i/\mu\rfloor\big)$$

wherein BaseTabLPS is a base lookup table of dimension $\mu\times\lambda$ wherein i is a table index associated with a probability information;

wherein j is a table index associated with an interval size information;

wherein % is a division residual operation;

wherein / is a division operation;

wherein Scal (x,y) is a scaling function.

6. A video encoder, wherein the video encoder is configured to encode a plurality of video frames, wherein the video encoder comprises an arithmetic encoder for providing an encoded binary sequence on the basis of a sequence of binary values representing a video content, according to claim 1.

7. An arithmetic decoder for decoding a plurality of symbols having symbol values, wherein the arithmetic decoder is configured to derive an interval size value for an arithmetic decoding of one or more symbol values to be decoded on the basis of one or more state variable values, which represent statistics of a plurality of previously decoded symbol values, wherein the arithmetic decoder is configured to determine the interval size value using a base lookup table, wherein the arithmetic decoder is configured to determine the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the arithmetic decoder is configured to perform the arithmetic decoding of one or more symbols using the interval size value.

8. The arithmetic decoder according to claim 7, wherein the arithmetic decoder is configured to determine the interval size value, such that the determined interval size value is a right-shifted version of an element of the base-lookup table if the probability index is within the second range.

9. The arithmetic decoder according to claim 7, wherein the probability index) determines whether an element of the lookup table is provided as the interval size value, or whether an element of the lookup table is scaled and rounded to obtain the interval size value.

10. The arithmetic decoder according to claim 7, wherein a division residual of a division between the probability index and a first size value and an interval size index determine which element of the base lookup table is used to obtain the interval size value.

11. The arithmetic decoder according to claim 7, wherein the arithmetic decoder is configured to obtain the interval size value $R_{XPS}$ according to $$R_{XPS} = Scal(BaseTabLPS[i \% \mu][j], \lfloor i/\mu \rfloor)$$

wherein BaseTabLPS is a base lookup table of dimension $\mu \times \lambda$ wherein i is a table index associated with a probability information;

wherein j is a table index associated with an interval size information;

wherein % is a division residual operation;

wherein / is a division operation;

wherein Scal (x,y) is a scaling function.

12. A video decoder, wherein the video decoder is configured to decode a plurality of video frames, wherein the video decoder comprises an arithmetic decoder for providing a decoded binary sequence on the basis of an encoded representation of the binary sequence, according to claim 7.

13. A method for encoding a plurality of symbols having symbol values, wherein the method comprises deriving an interval size value for an arithmetic encoding of one or more symbol values to be encoded on the basis of one or more state variable values, which represent statistics of a plurality of previously encoded symbol values, wherein the method comprises determining the interval size value using a base lookup table, wherein the method comprises determining the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the method comprises performing the arithmetic encoding of one or more symbols using the interval size value.

14. A method for decoding a plurality of symbols having symbol values, wherein the method comprises deriving an interval size value for an arithmetic decoding of one or more symbol values to be decoded on the basis of one or more state variable values, which represent statistics of a plurality of previously decoded symbol values, wherein the method comprises determining the interval size value using a base lookup table, wherein the method comprises determining the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the method comprises performing the arithmetic decoding of one or more symbols using the interval size value.

15. A non-transitory digital storage medium having a computer program stored thereon to perform the method for encoding a plurality of symbols having symbol values, wherein the method comprises deriving an interval size value for an arithmetic encoding of one or more symbol values to be encoded on the basis of one or more state variable values, which represent statistics of a plurality of previously encoded symbol values, wherein the method comprises determining the interval size value using a base lookup table, wherein the method comprises determining the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the method comprises performing the arithmetic encoding of one or more symbols using the interval size value, when said computer program is run by a computer.

16. A non-transitory digital storage medium having a computer program stored thereon to perform the method for decoding a plurality of symbols having symbol values, wherein the method comprises deriving an interval size value for an arithmetic decoding of one or more symbol values to be decoded on the basis of one or more state variable values, which represent statistics of a plurality of previously decoded symbol values, wherein the method comprises determining the interval size value using a base lookup table, wherein the method comprises determining the interval size value such that a determined interval size value is identical to an element of the base lookup table or is a rounded version of an element of the base lookup table if a probability index, which is obtained on the basis of the one or more state variable values, is within a first range, and such that a determined interval size value is obtained using a scaling and rounding of an element of the base lookup table if the probability index is within a second range; and wherein the method comprises performing the arithmetic decoding of one or more symbols using the interval size value, when said computer program is run by a computer.

* * * * *